US012622223B2

(12) United States Patent
Okada et al.

(10) Patent No.: US 12,622,223 B2
(45) Date of Patent: May 5, 2026

(54) SUBSTRATE PROCESSING DEVICE AND SUBSTRATE PROCESSING METHOD

(71) Applicant: SCREEN HOLDINGS CO., LTD., Kyoto (JP)

(72) Inventors: Yoshifumi Okada, Kyoto (JP); Nobuaki Okita, Kyoto (JP); Kazuki Nakamura, Kyoto (JP)

(73) Assignee: SCREEN HOLDINGS CO., LTD. (JP)

( * ) Notice: Subject to any disclaimer, the term of this patent is extended or adjusted under 35 U.S.C. 154(b) by 8 days.

(21) Appl. No.: 18/391,278

(22) Filed: Dec. 20, 2023

(65) Prior Publication Data

US 2024/0213075 A1      Jun. 27, 2024

(30) Foreign Application Priority Data

Dec. 23, 2022    (JP) ................................. 2022-207537
Dec. 27, 2022    (JP) ................................. 2022-210810
(Continued)

(51) Int. Cl.
  *H01L 21/687*        (2006.01)
  *A46B 13/00*         (2006.01)
  (Continued)

(52) U.S. Cl.
  CPC ...... *H01L 21/68735* (2013.01); *A46B 13/008* (2013.01); *A46B 13/02* (2013.01); (Continued)

(58) Field of Classification Search
  None
  See application file for complete search history.

(56) References Cited

U.S. PATENT DOCUMENTS

| | | | |
|---|---|---|---|
| 5,685,039 A | 11/1997 | Hamada et al. | ............... 15/88.2 |
| 2002/0006876 A1 | 1/2002 | Hongo et al. | ................. 505/191 |

(Continued)

FOREIGN PATENT DOCUMENTS

| | | | |
|---|---|---|---|
| CN | 114203583 A | 3/2022 | |
| CN | 114203587 A  * | 3/2022 | ....... H01L 21/67184 |

(Continued)

OTHER PUBLICATIONS

Office Action dated Sep. 10, 2024 in related Japanese Patent Application No. 2022-210810, 4 pages, not in English.
(Continued)

*Primary Examiner* — Eric W Golightly
(74) *Attorney, Agent, or Firm* — OSTROLENK FABER LLP

(57) ABSTRACT

A substrate is held by an upper holding device, and a lower-surface center region of the substrate is cleaned with use of a lower-surface brush. The substrate is lowered from an upper holding device and transferred to a suction holder of a lower holding device. The substrate held by the suction holder is cleaned with use of a processing liquid. A cup is provided to be liftable and lowerable between an upper cup position and a lower cup position. The cup is in the lower cup position when waiting. A period for the substrate lowering operation and a period for the cup lifting operation at least partially overlap with each other.

1 Claim, 22 Drawing Sheets

(30) Foreign Application Priority Data

| Jan. 19, 2023 | (JP) | ................................. | 2023-006892 |
| Jan. 20, 2023 | (JP) | ................................. | 2023-007649 |

(51) Int. Cl.

| A46B 13/02 | (2006.01) |
| B08B 1/12 | (2024.01) |
| B08B 1/20 | (2024.01) |
| B08B 1/36 | (2024.01) |
| B08B 3/02 | (2006.01) |
| B08B 3/04 | (2006.01) |
| B08B 13/00 | (2006.01) |
| H01L 21/02 | (2006.01) |
| H01L 21/67 | (2006.01) |

(52) U.S. Cl.

CPC .................. *B08B 1/12* (2024.01); *B08B 1/20* (2024.01); *B08B 1/36* (2024.01); *B08B 3/022* (2013.01); *B08B 3/041* (2013.01); *B08B 13/00* (2013.01); *H01L 21/02057* (2013.01); *H01L 21/67046* (2013.01); *H01L 21/67051* (2013.01); *H01L 21/67253* (2013.01); *H01L 21/68707* (2013.01); *H01L 21/68742* (2013.01); *A46B 2200/3073* (2013.01); *B08B 2203/02* (2013.01)

(56) References Cited

U.S. PATENT DOCUMENTS

| 2002/0157692 A1 | 10/2002 | Ishihara et al. | |
| 2005/0087441 A1 | 4/2005 | Hongo et al. | ............ 204/297.06 |
| 2005/0183754 A1 | 8/2005 | Kago et al. | ................. 134/56 R |
| 2007/0078552 A1 | 4/2007 | Rosenberg | ....................... 700/94 |
| 2007/0113977 A1 | 5/2007 | Hongo et al. | ........... 156/345.31 |
| 2009/0026068 A1 | 1/2009 | Hongo et al. | ................. 204/199 |
| 2009/0199869 A1 | 8/2009 | Kago et al. | ........................ 134/6 |
| 2009/0202951 A1 | 8/2009 | Yamamoto et al. | .......... 430/322 |
| 2014/0352608 A1 | 12/2014 | Ishibashi | ........................... 118/52 |
| 2014/0352736 A1 | 12/2014 | Yamamoto et al. | ........... 134/26 |
| 2015/0027492 A1 | 1/2015 | Takiguchi et al. | |
| 2015/0318193 A1 | 11/2015 | Fukuda et al. | |
| 2016/0236239 A1 | 8/2016 | Nishiyama | |
| 2018/0071883 A1 | 3/2018 | Murachi et al. | |
| 2018/0071884 A1 | 3/2018 | Murachi et al. | |
| 2019/0164749 A1 | 5/2019 | Kajita et al. | |
| 2020/0312678 A1 | 10/2020 | Morikawa et al. | |
| 2022/0005736 A1 | 1/2022 | Naohara et al. | |
| 2022/0088793 A1 | 3/2022 | Shinohara et al. | |
| 2022/0093420 A1 | 3/2022 | Shinohara et al. | |
| 2022/0203409 A1 | 6/2022 | Ishii et al. | |
| 2022/0395866 A1 | 12/2022 | Nakamura et al. | |
| 2022/0395867 A1* | 12/2022 | Shinohara | ................. B08B 1/12 |

FOREIGN PATENT DOCUMENTS

| CN | 114695184 A | 7/2022 |
| JP | H07-312335 A | 11/1995 |
| JP | 09-029189 A | 2/1997 |
| JP | 11-238714 A | 8/1999 |
| JP | 11-288916 A | 10/1999 |
| JP | 2003-051434 A | 2/2003 |
| JP | 2004-237257 A | 8/2004 |
| JP | 2004-303836 A | 10/2004 |
| JP | 2005-228961 A | 8/2005 |
| JP | 2008-084911 A | 4/2008 |
| JP | 2008-124515 A | 5/2008 |
| JP | 2019-012863 A | 1/2009 |
| JP | 2009-194034 A | 8/2009 |
| JP | 2010-056327 A | 3/2010 |
| JP | 2010-093125 A | 4/2010 |
| JP | 2013-009007 A | 1/2013 |
| JP | 2015-023248 A | 2/2015 |
| JP | 2015-032756 A | 2/2015 |
| JP | 5904169 B2 | 4/2016 |
| JP | 2018-046109 A | 3/2018 |
| JP | 2019-003977 A | 1/2019 |
| JP | 2020-155617 A | 9/2020 |
| JP | 2020-167184 A | 10/2020 |
| JP | 2021-052163 A | 4/2021 |
| JP | 2021-052165 A | 4/2021 |
| JP | 2021-093427 A | 6/2021 |
| JP | 2022-051026 A | 3/2022 |
| JP | 2022-051029 A | 3/2022 |
| JP | 2022-061415 A | 4/2022 |
| JP | 2002-324828 A | 11/2022 |
| JP | 2022-189627 A | 12/2022 |
| KR | 10-2010-0004043 A | 1/2010 |
| KR | 10-2015-0011764 A | 2/2015 |
| KR | 10-2022-0037989 A | 3/2022 |
| KR | 10-2022-0053013 A | 4/2022 |
| KR | 10-2022-0167230 A | 12/2022 |
| TW | I560743 B | 12/2016 |
| TW | 202036670 A | 10/2020 |
| TW | 202214357 A | 4/2022 |
| WO | WO 2001/084621 A1 | 11/2001 |
| WO | WO 2021/053995 A1 | 3/2021 |

OTHER PUBLICATIONS

Office Action dated Aug. 27, 2024 in related Japanese Patent Application No. 2023-007649, 3 pages, not in English.

Office Action dated Aug. 27, 2024 for corresponding Japanese Patent Application No. 2023-006892, 4 pages, not in English.

Decision to Grant a Patent dated Mar. 10, 2025, issued in related Chinese Patent Application No. 112149948, 6 pages, not in English.

Office Action dated Feb. 20, 2025, issued in related Chinese Patent Application No. 112149954, 4 pages, not in English.

Office Action issued Sep. 3, 2024 in related Japanese Patent Application No. 2022-207537, 4 pages, not in English.

Extended European Search Report dated Jul. 23, 2024 issued in corresponding European Patent Application No. 23217105.8, 7 pages.

U.S. Appl. No. 18/391,186, filed Dec. 20, 2023 by Yoshifumi Okada et al. entitled "Substrate Processing Device and Substrate Processing Method".

U.S. Appl. No. 18/391,330, filed Dec. 20, 2023 by Yoshifumi Okada et al. entitled "Substrate Processing Device and Substrate Processing Method".

U.S. Appl. No. 18/391,366, filed Dec. 20, 2023 by Kazuki Nakamura et al. entitled "Substrate Processing Device and Substrate Processing Method".

* cited by examiner

PLAN VIEW                                    SHUTTER : CLOSE STATE

UPPER HOLDING DEVICE : RETREATED STATE

SIDE VIEW TAKEN ALONG LINE A-A

SUCTION HOLDER : STOP STATE

SIDE VIEW TAKEN ALONG LINE B-B

PLAN VIEW

SHUTTER : CLOSE STATE→OPEN STATE

UPPER HOLDING DEVICE :
RETREATED STATE→PLACEABLE STATE

SIDE VIEW TAKEN ALONG LINE A-A

SUCTION HOLDER : STOP STATE

SIDE VIEW TAKEN ALONG LINE B-B

PLAN VIEW

SHUTTER : OPEN STATE

UPPER HOLDING DEVICE : PLACEABLE STATE

SIDE VIEW TAKEN ALONG LINE A-A

SUCTION HOLDER : STOP STATE

SIDE VIEW TAKEN ALONG LINE B-B

PLAN VIEW

SHUTTER : OPEN STATE→CLOSE STATE

UPPER HOLDING DEVICE :
PLACEABLE STATE→HOLDING STATE

SIDE VIEW TAKEN ALONG LINE A-A

SUCTION HOLDER :
STOP STATE→ROTATION STATE

SIDE VIEW TAKEN ALONG LINE B-B

PLAN VIEW

SHUTTER : CLOSE STATE

UPPER HOLDING DEVICE : HOLDING STATE

SIDE VIEW TAKEN ALONG LINE A-A

SUCTION HOLDER : ROTATION STATE

SIDE VIEW TAKEN ALONG LINE B-B

PLAN VIEW

SHUTTER : CLOSE STATE

UPPER HOLDING DEVICE : HOLDING STATE

SIDE VIEW TAKEN ALONG LINE A-A

SUCTION HOLDER : ROTATION STATE

SIDE VIEW TAKEN ALONG LINE B-B

PLAN VIEW               SHUTTER : CLOSE STATE

UPPER HOLDING DEVICE :
HOLDING STATE→PLACEABLE STATE

SIDE VIEW TAKEN ALONG LINE A-A

SUCTION HOLDER : ROTATION STATE

SIDE VIEW TAKEN ALONG LINE B-B

PLAN VIEW             SHUTTER : CLOSE STATE

UPPER HOLDING DEVICE :
HOLDING STATE→PLACEABLE STATE

SIDE VIEW TAKEN ALONG LINE A-A

SUCTION HOLDER :
ROTATION STATE→STOP STATE

SIDE VIEW TAKEN ALONG LINE B-B

PLAN VIEW

SHUTTER : CLOSE STATE 1

UPPER HOLDING DEVICE : RETREATED STATE

SIDE VIEW TAKEN ALONG LINE A-A

SUCTION HOLDER : STOP STATE

SIDE VIEW TAKEN ALONG LINE B-B

PLAN VIEW SHUTTER : CLOSE STATE 1

UPPER HOLDING DEVICE : RETREATED STATE

SIDE VIEW TAKEN ALONG LINE A-A

SUCTION HOLDER : STOP STATE

SIDE VIEW TAKEN ALONG LINE B-B

PLAN VIEW

SHUTTER : CLOSE STATE  1

UPPER HOLDING DEVICE : RETREATED STATE

SIDE VIEW TAKEN ALONG LINE A-A                                                      1

SUCTION HOLDER : STOP STATE

SIDE VIEW TAKEN ALONG LINE B-B                                                      1

PLAN VIEW

SHUTTER : CLOSE STATE 1

UPPER HOLDING DEVICE : RETREATED STATE

SIDE VIEW TAKEN ALONG LINE A-A

SUCTION HOLDER :
ROTATION STATE→STOP STATE

SIDE VIEW TAKEN ALONG LINE B-B

PLAN VIEW

SHUTTER : CLOSE STATE <u>1</u>

UPPER HOLDING DEVICE : RETREATED STATE

SIDE VIEW TAKEN ALONG LINE A-A                                <u>1</u>

SUCTION HOLDER : STOP STATE

SIDE VIEW TAKEN ALONG LINE B-B                                <u>1</u>

PLAN VIEW

SHUTTER : OPEN STATE 1

UPPER HOLDING DEVICE : RETREATED STATE

SIDE VIEW TAKEN ALONG LINE A-A 1

SUCTION HOLDER : STOP STATE

SIDE VIEW TAKEN ALONG LINE B-B 1

SIDE VIEW TAKEN ALONG LINE C-C

SUCTION HOLDER : STOP STATE

SUBSTRATE PROCESSING DEVICE AND SUBSTRATE PROCESSING METHOD

BACKGROUND

Technical Field

The present disclosure relates to a substrate processing device and a substrate processing method for cleaning of a substrate.

Description of Related Art

A substrate processing device is used to perform various processing on various substrates such as a substrate for an FPD (Flat Panel Display) that is used for a liquid crystal display device, an organic EL (Electro Luminescence) display device or the like, a semiconductor substrate, a substrate for an optical disc, a substrate for a magnetic disc, a substrate for a magneto-optical disc, a substrate for a photomask, a ceramic substrate or a substrate for a solar cell. A substrate cleaning device is used to clean a substrate.

For example, the substrate cleaning device described in JP 5904169 B2 includes two suction pads for holding the back-surface peripheral portion of a wafer, a spin chuck for holding the back-surface center portion of the wafer and a brush for cleaning the back surface of the wafer. The two suction pads hold the wafer and are moved in a transverse direction. In this state, the back-surface center portion of the wafer is cleaned by the brush. Thereafter, the spin chuck receives the wafer from the suction pads. Further, the spin chuck rotates while holding the back-surface center portion of the wafer. In this state, the back-surface peripheral portion of the wafer is cleaned by the brush.

SUMMARY

In the above-mentioned substrate cleaning device, a large number of substrates are sequentially carried in and out, so that cleaning processing is performed on each substrate. Therefore, if the period required for processing for one substrate can be shortened, the processing efficiency for a large number of substrates can be greatly improved. In the substrate cleaning device, further improvement of the throughput of the substrate processing is required.

An object of the present disclosure is to provide a substrate processing device and a substrate processing method that enable improvement of throughput of substrate processing.

A substrate processing device according to one aspect of the present disclosure includes a first substrate holder configured to hold a substrate at a first height position, a second substrate holder configured to hold the substrate at a second height position lower than the first height position, a processor configured to perform first processing on the substrate held by the first substrate holder and performing second processing on the substrate held by the second substrate holder, a substrate mover that performs a substrate lowering operation of lowering the substrate from the first height position to the second height position for transfer of the substrate from the first substrate holder to the second substrate holder, and a controller, wherein the second processing includes processing with use of a processing liquid, the processor includes a processing cup formed to surround the second substrate holder in plan view and provided to be liftable and lowerable between an upper cup position corresponding to the second height position and a lower cup position position lower than the upper cup position, and a cup driver that lifts and lowers the processing cup, and the controller, by controlling the substrate mover and the cup driver, causes the substrate lowering operation performed by the substrate mover and a cup lifting operation of lifting the processing cup from the lower cup position toward the upper cup position to be performed such that a period for the substrate lowering operation and a period for the cup lifting operation at least partially overlap with each other.

A substrate processing device according to another aspect of the present disclosure includes a first substrate holder configured to hold a substrate at a first height position, a second substrate holder configured to hold the substrate at a second height position lower than the first height position, a processor configured to perform first processing on the substrate held by the first substrate holder and performing second processing on the substrate held by the second substrate holder, a substrate mover that performs a substrate lowering operation of lowering the substrate from the first height position to the second height position for transfer of the substrate from the first substrate holder to the second substrate holder, and a controller, wherein the processor includes a lower-surface brush that cleans a lower surface of the substrate by coming into contact with the lower surface, and a lower-surface brush mover configured to move the lower-surface brush between a lower-surface brush processing position at which the lower-surface brush comes into contact with the lower surface of the substrate held by the second substrate holder and a lower-surface brush waiting position spaced apart from the lower-surface brush processing position, the second processing includes cleaning processing for the lower surface of the substrate by the lower-surface brush, and the controller, by controlling the substrate mover and the lower-surface brush mover, causes the substrate lowering operation performed by the substrate mover and a lower-surface brush preparing operation of moving the lower-surface brush from the lower-surface brush waiting position to the lower-surface brush processing position to be performed such that a period for the substrate lowering operation and a period for the lower-surface brush preparing operation at least partially overlap with each other.

A substrate processing device according to yet another aspect of the present disclosure includes a first substrate holder configured to hold a substrate at a first height position, a second substrate holder configured to hold the substrate at a second height position lower than the first height position, a processor configured to perform first processing on the substrate held by the first substrate holder and performing second processing on the substrate held by the second substrate holder, a substrate mover that performs a substrate lowering operation of lowering the substrate from the first height position to the second height position for transfer of the substrate from the first substrate holder to the second substrate holder, and a controller, wherein the processor includes a fluid nozzle that discharges fluid including a processing liquid to an upper surface of the substrate, and a nozzle mover configured to move the fluid nozzle between a nozzle processing position above the substrate held by the second substrate holder and a nozzle waiting position sidewardly spaced apart from the substrate held by the second substrate holder, the second processing includes cleaning processing for the upper surface of the substrate performed by the fluid nozzle, and the controller, by controlling the substrate mover and the nozzle mover, causes the substrate lowering operation performed by the substrate mover and a nozzle preparing operation of moving the fluid nozzle from the nozzle waiting position to the nozzle processing position to be performed such that a period for the substrate lowering operation and a period for the nozzle preparing operation at least partially overlap with each other.

A substrate processing device according to yet another aspect of the present disclosure includes a first substrate holder configured to hold a substrate at a first height position, a second substrate holder configured to hold the substrate at a second height position lower than the first height position, a processor configured to perform first processing on the substrate held by the first substrate holder and performing second processing on the substrate held by the second substrate holder, a substrate mover that performs a substrate lowering operation of lowering the substrate from the first height position to the second height position for transfer of the substrate from the first substrate holder to the second substrate holder, and a controller, wherein the processor includes an end-portion brush that cleans an outer peripheral end of the substrate by coming into contact with the outer peripheral end, and an end-portion brush mover configured to move the end-portion brush between an end-portion brush processing position at which the end-portion brush comes into contact with the outer peripheral end of the substrate held by the second substrate holder and an end-portion brush waiting position sidewardly spaced apart from the substrate held by the second substrate holder, the second processing includes cleaning processing for the outer peripheral end of the substrate performed by the end-portion brush, and the controller, by controlling the substrate mover and the end-portion brush mover, causes the substrate lowering operation performed by the substrate mover and an end-portion brush preparing operation of moving the end-portion brush from the end-portion brush waiting position to the end-portion brush processing position to be performed such that a period for the substrate lowering operation and a period for the brush preparing operation at least partially overlap with each other.

A substrate processing method according to yet another aspect of the present disclosure includes performing first processing on a substrate held by a first substrate holder at a first height position, performing second processing with use of a processing liquid on the substrate held by a second substrate holder at a second height position lower than the first height position, performing a substrate lowering operation of lowering the substrate from the first height position to the second height position for transfer of the substrate from the first substrate holder to the second substrate holder after the first processing and before the second processing, receiving the processing liquid used in the second processing by arranging a processing cup, that is formed to surround the second substrate holder in plan view and provided to be liftable and lowerable, at an upper cup position corresponding to the second height position, and lifting and lowering the processing cup between the upper cup position and a lower cup position lower than the upper cup position, wherein before the first processing and after the second processing, the performing a substrate lowering operation and the lifting and lowering the processing cup are started such that a period for the substrate lowering operation and a period for a cup lifting operation of lifting the processing cup from the lower cup position to the upper cup position at least partially overlap with each other.

A substrate processing method according to yet another aspect of the present disclosure includes performing first processing on a substrate held by a first substrate holder at a first height position, performing second processing including bringing a lower-surface brush into contact with a lower surface of the substrate held by the second substrate holder at a second height position lower than the first height position to clean the lower surface of the substrate, performing a substrate lowering operation of lowering the substrate from the first height position to the second height position for transfer of the substrate from the first substrate holder to the second substrate holder after the first processing and before the second processing, and moving the lower-surface brush between a lower-surface brush processing position at which the lower-surface brush comes into contact with the lower surface of the substrate held by the second substrate holder and a lower-surface brush waiting position spaced apart from the lower-surface brush processing position, wherein after the first processing and before the second processing, the performing a substrate lowering operation and the moving the lower-surface brush are started such that a period for the substrate lowering operation and a period for a lower-surface brush preparing operation of moving the lower-surface brush from the lower-surface brush waiting position to the lower-surface brush processing position at least partially overlap with each other.

A substrate processing method according to yet another aspect of the present disclosure includes performing first processing on a substrate held by a first substrate holder at a first height position, performing second processing that includes discharging fluid including a processing liquid from a fluid nozzle to an upper surface of the substrate held by a second substrate holder at a second height position lower than the first height position and cleaning the upper surface of the substrate, performing a substrate lowering operation of lowering the substrate from the first height position to the second height position for transfer of the substrate from the first substrate holder to the second substrate holder after the first processing and before the second processing, and moving the fluid nozzle between a nozzle processing position above the substrate held by the second substrate holder and a nozzle waiting position sidewardly spaced apart from the substrate held by the second substrate holder, wherein after the first processing and before the second processing, the performing a substrate lowering operation and the moving the fluid nozzle are started such that a period for the substrate lowering operation and a period for a nozzle preparing operation of moving the fluid nozzle from the nozzle waiting position to the nozzle processing position at least partially overlap with each other.

A substrate processing method according to yet another aspect of the present disclosure includes performing first processing on a substrate held by a first substrate holder at a first height position, performing second processing that includes bringing an end-portion brush into contact with an outer peripheral end of the substrate held by a second substrate holder at a second height position lower than the first height position and cleaning the outer peripheral end of the substrate, performing a substrate lowering operation of lowering the substrate from the first height position to the second height position for transfer of the substrate from the first substrate holder to the second substrate holder after the first processing and before the second processing, and moving the end-portion brush between an end-portion brush processing position at which the end-portion brush comes into contact with the outer peripheral end of the substrate held by the second substrate holder and an end-portion brush waiting position sidewardly spaced apart from the substrate held by the second substrate holder, wherein after the first processing and before the second processing, the performing a substrate lowering operation and the moving an end-portion brush are started such that a period for the substrate lowering operation and a period for an end-portion brush preparing operation of moving the end-portion brush from the end-portion brush waiting position to the end-portion brush processing position at least partially overlap with each other.

With the present disclosure, it is possible to improve throughput of substrate processing.

Other features, elements, characteristics, and advantages of the present disclosure will become more apparent from the following description of preferred embodiments of the present disclosure with reference to the attached drawings.

DETAILED DESCRIPTION

A substrate processing device and a substrate processing method according to one embodiment of the present disclosure will be described below with reference to the drawings. The substrate processing device and the substrate processing method according to the present embodiment are a substrate cleaning device and a substrate cleaning method. In the following description, a substrate refers to a semiconductor substrate (wafer), a substrate for an FPD (Flat Panel Display) such as a liquid crystal display device or an organic EL (Electro Luminescence) display device, a substrate for an optical disc, a substrate for a magnetic disc, a substrate for a magneto-optical disc, a substrate for a photomask, a ceramic substrate, a substrate for a solar battery, or the like. Further, in the present embodiment, the upper surface of a substrate is a circuit forming surface (main surface), and the lower surface of the substrate is the surface opposite to the circuit forming surface (back surface). Further, as for a substrate to be used in the present embodiment, at least part of the substrate has a circular outer periphery. For example, the substrate to be used in the present embodiment has a circular outer peripheral end except for a notch.

1. Configuration of Substrate Cleaning Device

Figure 1:
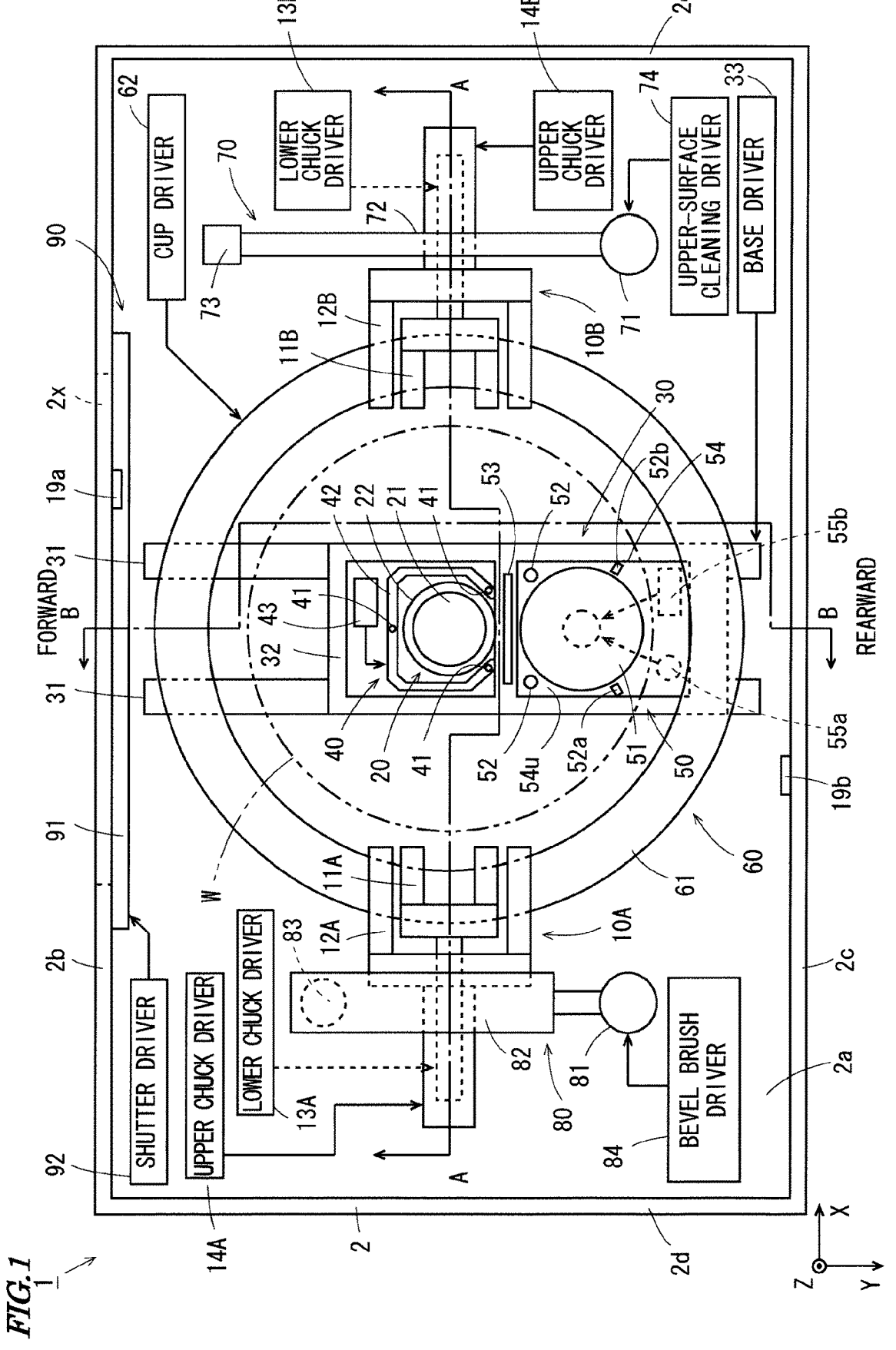
FIG. 1 is a schematic plan view of a substrate cleaning device according to one embodiment of the present disclosure.
Figure 2:
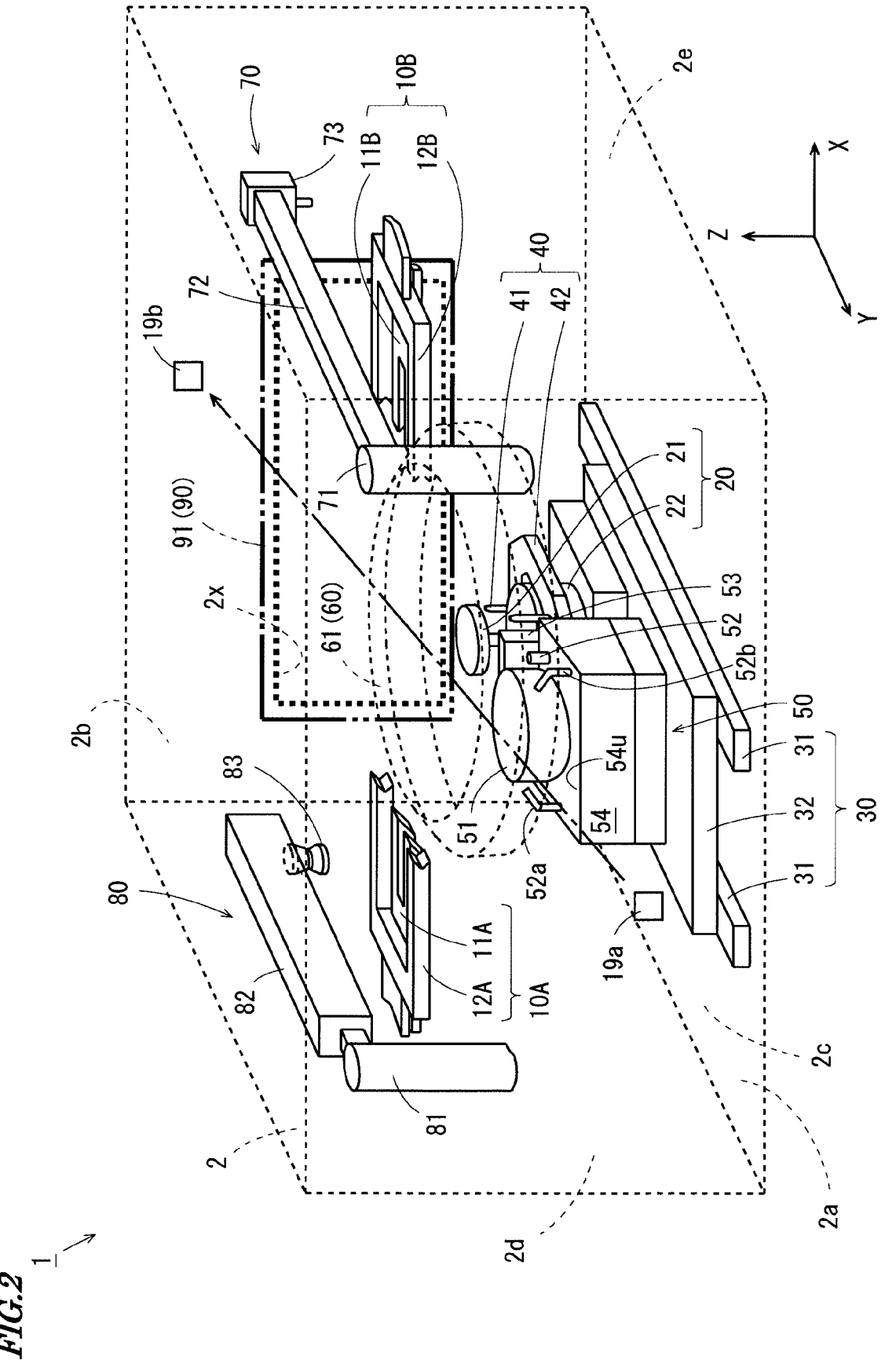
FIG. 2 is an external perspective view showing the inner configuration of the substrate cleaning device of FIG. 1.

FIG. 1 is a schematic plan view of a substrate cleaning device according to one embodiment of the present disclosure. FIG. 2 is an external perspective view showing the inner configuration of the substrate cleaning device 1 of FIG. 1. In the substrate cleaning device 1 according to the present embodiment, X, Y and Z directions orthogonal to one another are defined for the clarity of a positional relationship. In FIG. 1 and the subsequent drawings, the X, Y and Z directions are suitably indicated by arrows. The X and Y directions are orthogonal to each other within a horizontal plane, and the Z direction corresponds to a vertical direction (up-and-down direction).

As shown in FIG. 1, the substrate cleaning device 1 includes upper holding devices 10A, 10B, a lower holding device 20, a base device 30, a receiving-transferring device 40, a lower-surface cleaning device 50, a cup device 60, an upper-surface cleaning device 70, an end-portion cleaning device 80 and an opening-closing device 90. These constituent elements are provided in a unit casing 2. In FIG. 2, the unit casing 2 is indicated by the dotted lines.

The unit casing 2 has a rectangular bottom surface portion 2a, and four sidewall portions 2b, 2c, 2d, 2e extending upwardly from the four sides of the bottom surface portion 2a. The sidewall portions 2b, 2c are opposite to each other, and the sidewall portions 2d, 2e are opposite to each other. A rectangular opening is formed in the center portion of the sidewall portion 2b. This opening is an inlet-outlet port 2x for a substrate W and is used when the substrate W is carried into and carried out from the unit casing 2. In FIG. 2, the inlet-outlet port 2x is indicated by the thick dotted lines. In the following description, a direction directed outwardly of the unit casing 2 in the Y direction from the inside of the unit casing 2 through the inlet-outlet port 2x (the direction directed from the sidewall portion 2c toward the sidewall portion 2b) is referred to as forward, and its opposite direction (the direction directed from the sidewall portion 2b toward the sidewall portion 2c) is referred to as rearward.

The opening-closing device 90 is provided in a portion in which the inlet-outlet port 2x is formed and its vicinal region in the sidewall portion 2b. The opening-closing device 90 includes a shutter 91 that is configured to be capable of opening and closing the inlet-outlet port 2x and a shutter driver 92 that drives the shutter 91. In FIG. 2, the shutter 91 is indicated by the thick two-dots and dash lines. The shutter driver 92 drives the shutter 91 such that the shutter 91 opens the inlet-outlet port 2x when the substrate W is carried into and carried out from the substrate cleaning device 1. Thus, the shutter 91 is in an open state. Further, the shutter driver 92 drives the shutter 91 such that the shutter 91 closes the inlet-outlet port 2x when the substrate W is cleaned in the substrate cleaning device 1. Thus, the shutter 91 is in a close state.

The base device 30 is provided in the center portion of the bottom surface portion 2a. The base device 30 includes linear guides 31, a mobile base 32 and a base driver 33. The linear guides 31 include two rails and are provided to extend in the Y direction from positions in the vicinity of the sidewall portion 2b to positions in the vicinity of the sidewall portion 2c in plan view. The mobile base 32 is provided to be movable in the Y direction on the two rails of the linear guides 31. The base driver 33 includes a pulse motor, for example, and moves the mobile base 32 in the Y direction on the linear guides 31.

The lower holding device 20 and the lower-surface cleaning device 50 are provided on the mobile base 32 to be arranged in the Y direction. The lower holding device 20 includes a suction holder 21 and a suction holding driver 22. The suction holder 21 is a so-called spin chuck, has a circular suction surface that can hold a lower surface of the substrate W by suction and is configured to be rotatable about an axis extending in the up-and-down direction (the axis extending in the Z direction). In the following description, a region that is to be sucked by the suction surface of the suction holder 21 in the lower surface of the substrate W when the substrate W is held by suction by the suction holder 21 is referred to as a lower-surface center region. On the other hand, a region, surrounding the lower-surface center region, in the lower surface of the substrate W is referred to as a lower-surface outer region.

The suction holding driver 22 includes a motor. The motor of the suction holding driver 22 is provided on the mobile base 32 such that its rotation shaft projects upwardly. The suction holder 21 is attached to the upper end portion of the rotation shaft of the suction holding driver 22. Further, in the rotation shaft of the suction holding driver 22, a suction path for holding the substrate W by suction in the suction holder 21 is formed. The suction path is connected to a suction device (not shown). The suction holding driver 22 rotates the suction holder 21 about the above-mentioned rotation shaft.

On the mobile base 32, the receiving-transferring device 40 is further provided in the vicinity of the lower holding device 20. The receiving-transferring device 40 includes a plurality (three in the present example) of support pins 41, a pin coupling member 42 and a pin lifting-lowering driver 43. The pin coupling member 42 is formed to surround the suction holder 21 in plan view and couples the plurality of support pins 41 to one another. The plurality of support pins 41 extend upwardly by a certain length from the pin coupling member 42 while being coupled to one another by the pin coupling member 42. The pin lifting-lowering driver 43 lifts and lowers the pin coupling member 42 on the mobile base 32. Thus, the plurality of support pins 41 are lifted and lowered relative to the suction holder 21.

The lower-surface cleaning device 50 includes a lower-surface brush 51, two substrate nozzles 52, two brush nozzles 52a, 52b, a gas injector 53, a lifting-lowering supporter 54, a lower-surface brush rotation driver 55a and a lower-surface brush lifting-lowering driver 55b. As shown in FIG. 2, the lifting-lowering supporter 54 is provided on the mobile base 32 to be liftable and lowerable. The lifting-lowering supporter 54 has an upper surface 54u that is inclined downwardly in a direction away from the suction holder 21 (rearwardly in the present example).

As shown in FIG. 1, the lower-surface brush 51 has a circular outer shape in plan view and is formed to be relatively large in the present embodiment. Specifically, the diameter of the lower-surface brush 51 is larger than the diameter of the suction surface of the suction holder 21 and is 1.3 times of the diameter of the suction surface of the suction holder 21, for example. Further, the diameter of the lower-surface brush 51 is larger than $\frac{1}{3}$ of the diameter of the substrate W and smaller than $\frac{1}{2}$ of the diameter of the substrate W. The diameter of the substrate W is 300 mm, for example.

The lower-surface brush 51 is a sponge brush and is preferably formed of a material having relatively low wettability such as a fluorine-based resin. In this case, adhesion of contaminants to the lower-surface brush 51 is reduced. Thus, the lower-surface brush 51 is less likely to be contaminated. While the lower-surface brush 51 is formed of PTFE (Polytetrafluoroethylene) in the present example, the embodiment is not limited to this. The lower-surface brush 51 may be formed of a relatively soft resin material such as PVA (polyvinyl alcohol).

The lower-surface brush 51 has a cleaning surface that can come into contact with the lower surface of the substrate W. Further, the lower-surface brush 51 is attached to the upper surface 54u of the lifting-lowering supporter 54 such that the cleaning surface is directed upwardly and the cleaning surface is rotatable about an axis extending in the up-and-down direction through the center of the cleaning surface.

Each of the two substrate nozzles 52 is attached to the upper surface 54u of the lifting-lowering supporter 54 to be located in the vicinity of the lower-surface brush 51. Further, each of the two substrate nozzles 52 is attached to the upper surface 54u such that a liquid discharge port is directed upwardly. A lower-surface cleaning liquid supplier 56 (FIG. 5) is connected to the substrate nozzles 52. The lower-surface cleaning liquid supplier 56 supplies a cleaning liquid for cleaning a substrate to the substrate nozzles 52. When the substrate W is cleaned by the lower-surface brush 51, the substrate nozzles 52 discharge the cleaning liquid supplied from the lower-surface cleaning liquid supplier 56 to the lower surface of the substrate W. In the present embodiment, pure water is used as the cleaning liquid to be supplied to the substrate nozzles 52.

The two brush nozzles 52a, 52b are used to clean the lower-surface brush 51. Each of the two brush nozzles 52a, 52b is attached to the upper surface 54u of the lifting-lowering supporter 54 to be located in the vicinity of the lower-surface brush 51. A brush cleaning liquid supplier 57 (FIG. 5) is connected to the brush nozzles 52a, 52b. The brush cleaning liquid supplier 57 supplies a cleaning liquid for cleaning a brush to the brush nozzles 52a, 52b. Thus, the cleaning liquid supplied from the brush cleaning liquid supplier 57 is discharged from the brush nozzles 52a, 52b toward the lower-surface brush 51. The cleaning liquid to be supplied to the two substrate nozzles 52 is the same as the cleaning liquid to be supplied to the two brush nozzles 52*a*, 52*b*. Therefore, in the present embodiment, pure water is used as the cleaning liquid to be supplied to the brush nozzles 52*a*, 52*b*.

One of the brush nozzles 52*a* is provided at a position near the side of the lower-surface brush 51 such that a tip portion (liquid outlet port) of the brush nozzle 52*a* is directed to a position above the lower-surface brush 51. Therefore, the cleaning liquid discharged from the brush nozzle 52*a* is guided to the center portion of the cleaning surface of the lower-surface brush 51 so as to draw a parabola from the position near the side of the lower-surface brush 51. The other one of the brush nozzles 52*b* is provided at a position near the side of the lower-surface brush 51 such that a tip portion (liquid outlet port) of the brush nozzle 52*b* is directed toward a side portion (outer peripheral end) of the lower-surface brush 51. Therefore, the cleaning liquid discharged from the brush nozzle 52*b* is guided from the position near the side of the lower-surface brush 51 to the side portion (outer peripheral end) of the lower-surface brush 51.

As described below, the lower-surface brush 51 is basically rotated in a period during which the substrate cleaning device 1 is powered on. Therefore, when the cleaning liquid is discharged from the brush nozzles 52*a*, 52*b* to the lower-surface brush 51, the entire lower-surface brush 51 is smoothly cleaned by the cleaning liquid. Further, the cleaning surface of the lower-surface brush 51 is uniformly wetted. Thus, the lower-surface brush 51 is prevented from being partially hardened.

The gas injector 53 is a slit-like gas injection nozzle having a gas injection port extending in one direction. The gas injector 53 is provided on the mobile base 32 so as to be liftable and lowerable independently of the other constituent elements of the lower-surface cleaning device 50. A driver for lifting and lowering the gas injector 3 will not be described. A gas injection port of the gas injector 53 is located between the lower-surface brush 51 and the suction holder 21 in plan view and directed upwardly. An injection gas supplier 58 (FIG. 5) is connected to the gas injector 53.

The injection gas supplier 58 supplies gas to the gas injector 53. In the present embodiment, an inert gas such as a nitrogen gas is used as the gas to be supplied to the gas injector 53. The gas injector 53 injects the gas supplied from the injection gas supplier 58 to the lower surface of the substrate W during cleaning of the substrate W by the lower-surface brush 51 and during drying of the lower surface of the substrate W, as described below. In this case, a strip-shaped gas curtain extending in the X direction is formed between the lower-surface brush 51 and the suction holder 21.

The lower-surface brush rotation driver 55*a* of FIG. 1 includes a motor, and basically rotates the lower-surface brush 51 in a period during which the substrate cleaning device 1 is powered on. The lower-surface brush lifting-lowering driver 55*b* includes a stepping motor or an air cylinder, and lifts and lowers the lifting-lowering supporter 54 on the mobile base 32.

The cup device 60 is further provided in the center portion of the bottom surface portion 2*a*. The cup device 60 includes a cup 61 and a cup driver 62. The cup 61 is provided to surround the lower holding device 20 and the base device 30 in plan view, and be liftable and lowerable. In FIG. 2, the cup 61 is indicated by the dotted lines. The cup driver 62 moves the cup 61 between a lower cup position and an upper cup position in accordance with which portion of the lower surface of the substrate W is to be cleaned by the lower-surface brush 51. The lower cup position is a height position at which the upper end portion of the cup 61 is located farther downwardly than the substrate W held by suction by the suction holder 21. Further, the upper cup position is a height position at which the upper end portion of the cup 61 is located farther upwardly than the suction holder 21. With the cup 61 located at the upper cup position, the cup 61 and the suction holder 21 overlap with each other in side view. Therefore, it can be said that the upper cup position is a height position at which the cup 61 corresponds to the height position of the substrate W held by suction by the suction holder 21.

At height positions higher than the cup 61, the pair of upper holding devices 10A, 10B is provided to be opposite to each other with the base device 30 held therebetween in plan view. The upper holding device 10A includes a lower chuck 11A, an upper chuck 12A, a lower chuck driver 13A and an upper chuck driver 14A. The upper holding device 10B includes a lower chuck 11B, an upper chuck 12B, a lower chuck driver 13B and an upper chuck driver 14B.

Figure 3:
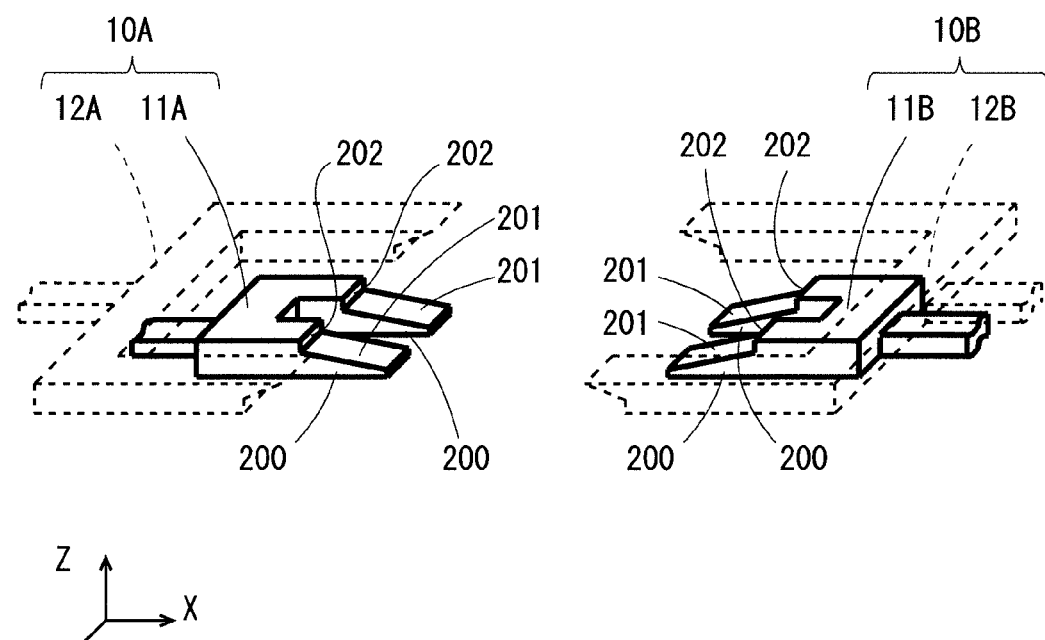
FIG. 3 is an external perspective view of lower chucks of FIGS. 1 and 2.

FIG. 3 is an external perspective view of the lower chucks 11A, 11B of FIGS. 1 and 2. In FIG. 3, the lower chucks 11A, 11B are indicated by the thick solid lines. Further, the upper chucks 12A, 12B are indicated by the dotted lines. In the external perspective view of FIG. 3, the expansion and contraction rates of each component are different from those in FIG. 2 in order to facilitate understanding of the shapes of the lower chucks 11A, 11B.

As shown in FIG. 3, the lower chucks 11A, 11B are arranged symmetrically with respect to a vertical plane extending in the Y direction (a forward-and-rearward direction) through the center of the suction holder 21 in plan view, and are provided to be movable in the X direction in a common horizontal plane. Each of the lower chucks 11A, 11B has two support pieces 200. Each support piece 200 is provided with an inclined support surface 201 and a movement limiting surface 202.

In the lower chuck 11A, the inclined support surface 201 of each support piece 200 is formed so as to be capable of supporting the outer peripheral end of the substrate W from below and extend obliquely downwardly toward the lower chuck 11B. The movement limiting surface 202 extends upwardly by a certain distance from the upper end of the inclined support surface 201 to generate a level difference at the upper end of the lower chuck 11A. On the other hand, in the lower chuck 11B, the inclined support surface 201 of each support piece 200 is formed so as to be capable of supporting the outer peripheral end of the substrate W from below and extend obliquely downwardly toward the lower chuck 11A. The movement limiting surface 202 extends upwardly from the upper end of the inclined support surface 201 to generate a level difference at the upper end of the lower chuck 11B.

The lower chuck drivers 13A, 13B of FIG. 1 include air cylinders or motors as actuators. The lower chuck drivers 13A, 13B move the lower chucks 11A, 11B such that the lower chucks 11A, 11B are moved close to each other or moved farther away from each other. Here, in a case in which target positions of the lower chucks 11A, 11B in the X direction are predetermined, the lower chuck drivers 13A, 13B can individually adjust the positions of the lower chucks 11A, 11B in the X direction based on the information about the target positions. For example, the distance between the lower chucks 11A, 11B can be made smaller than the outer diameter of the substrate W. In this case, the substrate W can be placed on the plurality of inclined support surfaces 201 of the lower chucks 11A, 11B.

Figure 4:
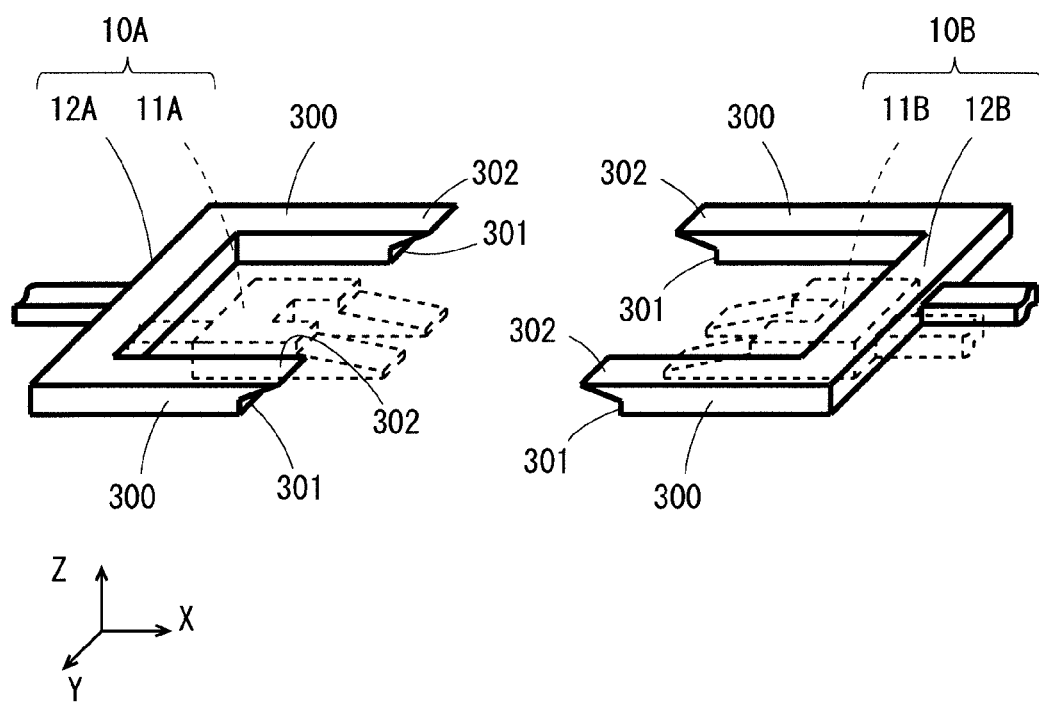
FIG. 4 is an external perspective view of upper chucks of FIGS. 1 and 2.

FIG. 4 is an external perspective view of the upper chucks 12A, 12B of FIGS. 1 and 2. In FIG. 4, the upper chucks 12A, 12B are indicated by the thick solid lines. Further, the lower chucks 11A, 11B are indicated by the dotted lines. In the external perspective view of FIG. 4, the expansion and contraction rates of each component are different from those in the external perspective view of FIG. 2 in order to facilitate understanding of the shapes of the upper chucks 12A, 12B.

As shown in FIG. 4, similarly to the lower chucks 11A, 11B, the upper chucks 12A, 12B are arranged symmetrically with respect to the vertical plane extending in the Y direction (the forward-and-rearward direction) through the center of the suction holder 21 in plan view, and are provided to be movable in the X direction in a common horizontal plane. Each of the upper chucks 12A, 12B has two holding pieces 300. Each holding piece 300 has an abutment surface 301 and a projection 302.

In the upper chuck 12A, the abutment surface 301 of each holding piece 300 is formed so as to face the upper chuck 12B at the lower portion of the tip of the holding piece 300, and is orthogonal to the X direction. The projection 302 is formed so as to project from the upper end of the abutment surface 301 toward the upper chuck 12B by a predetermined distance. On the other hand, in the upper chuck 12B, the abutment surface 301 of each holding piece 300 is formed so as to face the upper chuck 12A at the lower portion of the tip of the holding piece 300, and is orthogonal to the X direction. The projection 302 is formed so as to project from the upper end of the abutment surface 301 toward the upper chuck 12A by a predetermined distance.

The upper chuck drivers 14A, 14B of FIG. 1 include air cylinders or motors as actuators. The upper chuck drivers 14A, 14B move the upper chucks 12A, 12B such that the upper chucks 12A, 12B are moved close to each other or farther away from each other. Here, in a case in which target positions of the upper chucks 12A, 12B in the X direction are predetermined, the upper chuck drivers 14A, 14B can individually adjust the positions of the upper chucks 12A, 12B in the X direction based on the information about the target positions.

In the above-mentioned upper holding devices 10A, 10B, the upper chucks 12A, 12B are moved toward the outer peripheral end of the substrate W placed on the lower chucks 11A, 11B, for example. The two abutment surfaces 301 of the upper chuck 12A and the two abutment surfaces 301 of the upper chuck 12B come into contact with a plurality of portions of the outer peripheral end of the substrate W, whereby the outer peripheral end of the substrate W is held and the substrate W is firmly fixed.

When the distance between the lower chucks 11A, 11B and the distance between the upper chucks 12A, 12B are adjusted according to predetermined combinations, the upper holding devices 10A, 10B change among three states, i.e., a retreated state, a placeable state and a holding state.

The retreated state of the upper holding devices 10A, 10B is a state in which the distance between the lower chucks 11A, 11B is larger than the outer diameter of the substrate W and the distance between the upper chucks 12A, 12B is larger than the outer diameter of the substrate W. In this case, the substrate W in a horizontal attitude can be moved in the up-and-down direction (Z direction) between the lower chucks 11A, 11B and between the upper chucks 12A, 12B.

The placeable state of the upper holding devices 10A, 10B is a state in which the distance between the lower chucks 11A, 11B is smaller than the outer diameter of the substrate W and the distance between the upper chucks 12A, 12B is larger than the outer diameter of the substrate W. In this case, it is possible to place the substrate W in a horizontal attitude on the plurality of inclined support surfaces 201 of the lower chucks 11A, 11B while preventing the interference between the substrate W and the upper chucks 12A, 12B. Further, the substrate W placed on the lower chucks 11A, 11B can be picked up.

The holding state of the upper holding devices 10A, 10B is a state to which the upper holding devices 10A, 10B can be changed only in a case in which the upper holding devices 10A, 10B are in the placeable state and the substrate W is placed on the lower chucks 11A, 11B. Specifically, the holding state of the upper holding devices 10A, 10B is a state in which the distance between the lower chucks 11A, 11B is smaller than the outer diameter of the substrate W and the upper chucks 12A, 12B are in contact with the outer peripheral end of the substrate W on the lower chucks 11A, 11B to fix the substrate W.

Here, in the upper holding devices 10A, 10B, when the upper holding devices 10A, 10B change from the placeable state to the holding state, the upper chucks 12A, 12B are moved in the X direction so as to be close to each other with the substrate W held therebetween. At this time, the upper chucks 12A, 12B are specifically moved as follows.

First, one upper chuck is moved toward the other upper chuck and stops at a predetermined target position. Thereafter, the other upper chuck is moved toward the one upper chuck and comes into contact with one portion of the outer peripheral end of the substrate W. Further, the other upper chuck is moved toward the one upper chuck until another portion of the outer peripheral end of the substrate W comes into contact with the one upper chuck. In a case in which the upper holding devices 10A, 10B change from the placeable state to the holding state in this manner, the substrate W is positioned on the lower chucks 11A, 11B with the above-mentioned target position as a reference. Therefore, in a case in which the dimensions of the substrate W are known, it is possible to easily position the center of the substrate W at a plane reference position rp (FIG. 6), described below, by determining the target position based on the dimensions.

Further, in the upper holding devices 10A, 10B, when the upper holding devices 10A, 10B change from the holding state to the placeable state, the upper chucks 12A, 12B are moved in the X direction so as to be moved away from each other with the substrate W held therebetween. At this time, the upper chucks 12A, 12B are specifically moved as follows.

First, with one upper chuck at a predetermined target position, the other upper chuck is moved away from the one upper chuck. After the other upper chuck is separated from the substrate W, the one upper chuck is moved away from the other upper chuck. In a case in which the upper holding devices 10A, 10B change from the holding state to the placeable state, the substrate W is positioned on the lower chucks 11A, 11B with the above-mentioned target position as a reference. Therefore, in a case in which the dimensions of the substrate W are known, it is possible to easily position the center of the substrate W at the plane reference position rp (FIG. 6), described below, by determining the target position based on the dimensions.

Figure 5:
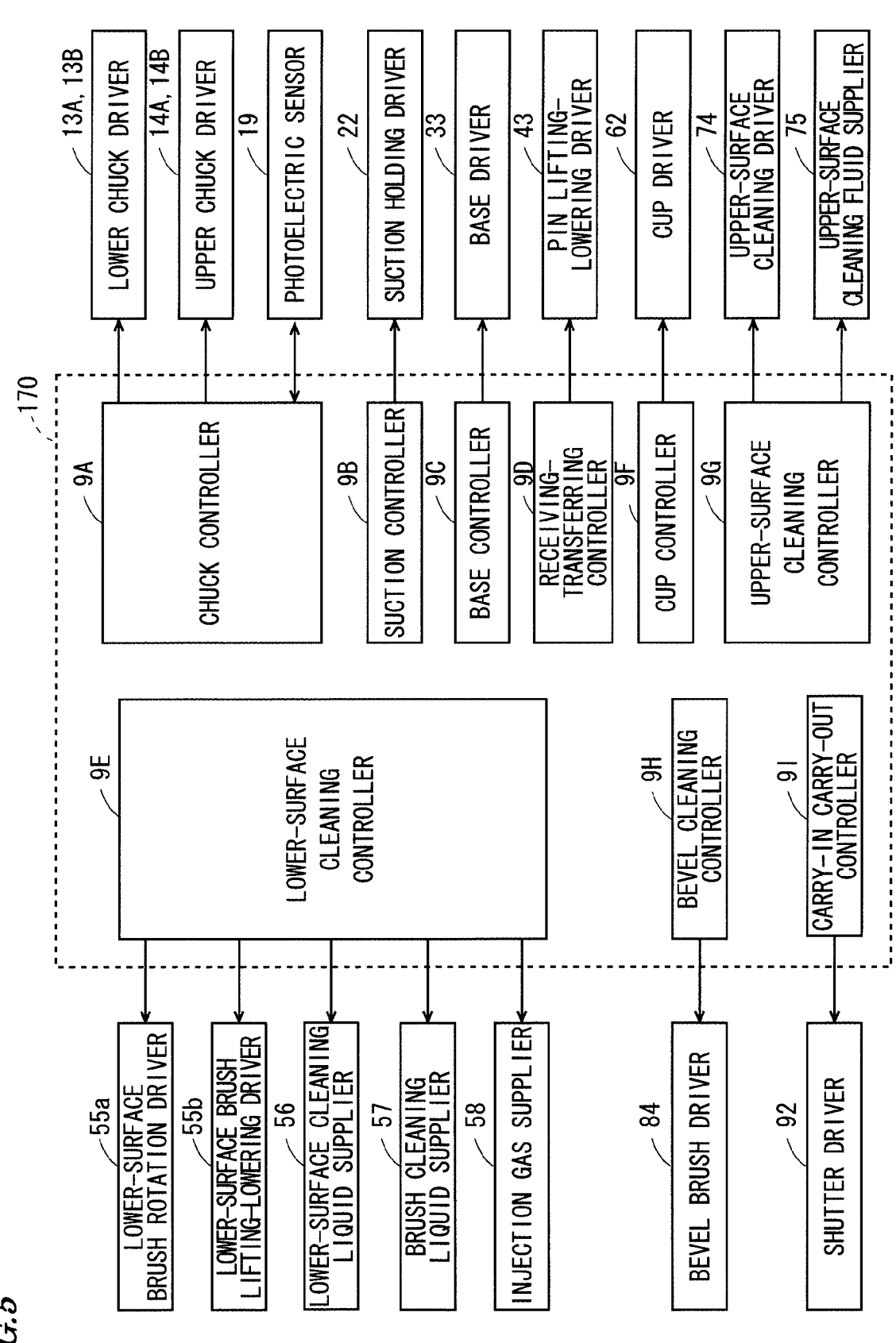
FIG. 5 is a block diagram showing the configuration of a control system of the substrate cleaning device of FIG. 1.

As shown in FIG. 1, a light emitter 19a and a light receiver 19b are respectively provided at the two sidewall portions 2c, 2b facing each other in the Y direction. The light emitter 19a includes a light emitting element. The light receiver 19b includes a light receiving element. The light emitter 19a and the light receiver 19b constitute one transmission-type photoelectric sensor 19 (FIG. 5).

The light emitter 19*a* and the light receiver 19*b* are arranged such that the light emitter 19*a* is located farther downwardly than the light receiver 19*b*. Further, the light emitter 19*a* and the light receiver 19*b* are arranged such that the straight line connecting the light emitter 19*a* and the light receiver 19*b* crosses the substrate W in a case in which the substrate W is held by the upper holding devices 10A, 10B.

In the substrate cleaning device 1, when the substrate W is placed on the upper holding devices 10A, 10B being in the placeable state, light is emitted from the light emitter 19*a* toward the light receiver 19*b* (see the one-dot and dash arrow in FIG. 2). In a case in which the substrate W is normally placed on the upper holding devices 10A, 10B, the light emitted from the light emitter 19*a* is shielded by the substrate W. Thus, the light receiver 19*b* does not receive the light emitted from the light emitter 19*a*. On the other hand, in a case in which the substrate W is not normally placed on the upper holding devices 10A, 10B, the light emitted from the light emitter 19*a* enters the light receiver 19*b* without being shielded by the substrate W. Therefore, it is possible to determine whether the substrate W is normally placed on the upper holding devices 10A, 10B based on a light receiving signal output from the light receiving element of the light receiver 19*b*. In the following description, this determination is referred to as substrate placement state determination.

In the substrate cleaning device 1, also when the upper holding devices 10A, 10B change from the placeable state to the holding state, light is emitted from the light emitter 19*a* toward the light receiver 19*b*. Therefore, with the similar reason described above, it is possible to determine whether the substrate W is normally held by the upper holding devices 10A, 10B based on a light receiving signal output from the light receiving element of the light receiver 19*b*. In the following description, this determination is referred to as substrate holding state determination.

As shown in FIG. 1, at a position near one side of the cup 61, the upper-surface cleaning device 70 is provided to be located in the vicinity of the upper holding device 10B in plan view. The upper-surface cleaning device 70 includes a rotation support shaft 71, an arm 72, a spray nozzle 73 and an upper-surface cleaning driver 74.

The rotation support shaft 71 is supported on the bottom surface portion 2*a* by the upper-surface cleaning driver 74 to extend in the up-and-down direction, and to be liftable, lowerable and rotatable. As shown in FIG. 2, at a position farther upward than the upper holding device 10B, the arm 72 is provided to extend in the horizontal direction from the upper end portion of the rotation support shaft 71. The spray nozzle 73 is attached to the tip portion of the arm 72.

An upper-surface cleaning fluid supplier 75 (FIG. 5) is connected to the spray nozzle 73. The upper-surface cleaning fluid supplier 75 supplies a cleaning liquid and gas to the spray nozzle 73. In the present embodiment, pure water is used as the cleaning liquid to be supplied to the spray nozzle 73, and an inert gas such as a nitrogen gas is used as the gas to be supplied to the spray nozzle 73. When the upper surface of the substrate W is cleaned, the spray nozzle 73 mixes the cleaning liquid and the gas supplied from the upper-surface cleaning fluid supplier 75 to produce a fluid mixture, and injects the produced fluid mixture downwardly.

The upper-surface cleaning driver 74 includes one or a plurality of pulse motors, an air cylinder and the like, lifts and lowers the rotation support shaft 71 and rotates the rotation support shaft 71. With the above-mentioned configuration, on the upper surface of the substrate W held by suction and rotated by the suction holder 21, the spray nozzle 73 is moved in a circular arc shape. Thus, the entire upper surface of the substrate W can be cleaned.

As shown in FIG. 1, at a position near the other side of the cup 61, the end-portion cleaning device 80 is provided to be located in the vicinity of the upper holding device 10A in plan view. The end-portion cleaning device 80 includes a rotation support shaft 81, an arm 82, a bevel brush 83 and a bevel brush driver 84.

The rotation support shaft 81 is supported on the bottom surface portion 2*a* by the bevel brush driver 84 to extend in the up-and-down direction and to be liftable, lowerable and rotatable. As shown in FIG. 2, at a position farther upward than the upper holding device 10A, the arm 82 is provided to extend in the horizontal direction from the upper end portion of the rotation support shaft 81. At the tip portion of the arm 82, the bevel brush 83 is provided to project downwardly and to be rotatable about an axis extending in the up-and-down direction.

In the bevel brush 83, its upper half portion has an inverse trapezoidal shape, and its lower half portion has a trapezoidal shape. With this bevel brush 83, the outer peripheral end of the substrate W can be cleaned by the center portion in the up-and-down direction of the outer peripheral surface.

The bevel brush driver 84 includes one or a plurality of pulse motors, an air cylinder and the like, lifts and lowers the rotation support shaft 81 and rotates the rotation support shaft 81. With the above-mentioned configuration, the center portion of the outer peripheral surface of the bevel brush 83 is brought into contact with the outer peripheral end of the substrate W held by suction and rotated by the suction holder 21. Thus, the entire outer peripheral end of the substrate W can be cleaned.

Here, the bevel brush driver 84 further includes a motor built in the arm 82. The motor rotates the bevel brush 83 provided at the tip portion of the arm 82 about the axis extending in the up-and-down direction. Therefore, when the outer peripheral end of the substrate W is cleaned, a cleaning force of the bevel brush 83 in the outer peripheral end of the substrate W is improved by rotation of the bevel brush 83.

2. Control System of Substrate Cleaning Device 1

FIG. 5 is a block diagram showing the configuration of a control system of the substrate cleaning device 1 of FIG. 1. The substrate cleaning device 1 includes a control device 170. The control device 170 includes a CPU (Central Processing Unit), a RAM (Random Access Memory), a ROM (Read Only Memory) and a storage device. The RAM is used as a work area for the CPU. The ROM stores a system program. The storage device stores a substrate cleaning program.

As shown in FIG. 5, as functions for controlling the operation of each of a plurality of substrate cleaning devices 1, the control device 170 includes a chuck controller 9A, a suction controller 9B, a base controller 9C, a receiving-transferring controller 9D, a lower-surface cleaning controller 9E, a cup controller 9F, an upper-surface cleaning controller 9G, a bevel cleaning controller 9H and a carry-in carry-out controller 9I. The functions of the control device 170 are implemented by execution of the substrate cleaning program stored in the storage device by the CPU. Part or all of the functions of the control device 170 may be implemented by hardware such as an electronic circuit.

The chuck controller 9A controls the lower chuck drivers 13A, 13B and the upper chuck drivers 14A, 14B for reception of the substrate W carried into the substrate cleaning device 1 and holding of the substrate W at a position above the suction holder 21. Further, the chuck controller 9A controls the photoelectric sensor 19 such that the above-mentioned substrate placement state determination and substrate holding state determination are made. The suction controller 9B controls the suction holding driver 22 in order for the suction holder 21 to hold the substrate W by suction and rotate the substrate W held by suction.

The base controller 9C controls the base driver 33 for movement of the mobile base 32 with respect to the substrate W held by the upper holding devices 10A, 10B. The receiving-transferring controller 9D controls the pin lifting-lowering driver 43 for movement of the substrate W between a height position of the substrate W held by the upper holding devices 10A, 10B and a height position of the substrate W held by the suction holder 21.

The lower-surface cleaning controller 9E controls the lower-surface brush rotation driver 55a, the lower-surface brush lifting-lowering driver 55b, the lower-surface cleaning liquid supplier 56 and the injection gas supplier 58 for cleaning of the lower surface of the substrate W. Further, the lower-surface cleaning controller 9E controls the brush cleaning liquid supplier 57 for cleaning of the lower-surface brush 51. The cup controller 9F controls the cup driver 62 in order for the cup 61 to receive the cleaning liquid splashed from the substrate W when the substrate W held by suction by the suction holder 21 is cleaned.

The upper-surface cleaning controller 9G controls the upper-surface cleaning driver 74 and the upper-surface cleaning fluid supplier 75 for cleaning of the upper surface of the substrate W held by suction by the suction holder 21. The bevel cleaning controller 9H controls the bevel brush driver 84 for cleaning of the outer peripheral end of the substrate W held by suction by the suction holder 21. The carry-in carry-out controller 9I controls the shutter driver 92 for opening and closing of the inlet-outlet port 2x of the unit casing 2 when the substrate W is carried into and carried out from the substrate cleaning device 1.

3. Operation of Substrate Cleaning Device 1

FIGS. 6 to 20 are schematic diagrams for explaining one example of the operation of the substrate cleaning device 1 of FIG. 1. In each of FIGS. 6 to 20, a plan view of the substrate cleaning device 1 is shown in the upper field. Further, a side view of the lower holding device 20 and its peripheral portions as viewed in the Y direction is shown in the middle field, and a side view of the lower holding device 20 and its peripheral portions as viewed in the X direction is shown in the bottom field. The side view in the middle field corresponds to the side view of the substrate cleaning device 1 taken along the line A-A of FIG. 1, and the side view in the bottom field corresponds to the side view of the substrate cleaning device 1 taken along the line B-B of FIG. 1. The expansion and contraction rates of part of the constituent elements are different for the plan view in the upper field and the side views in the middle and bottom fields in order to facilitate understanding of the shape and operation state of each constituent element in the substrate cleaning device 1. Further, in each of FIGS. 6 to 21, the cup 61 is indicated by the two-dots and dash lines, and the outer shape of the substrate W is indicated by the thick one-dot and dash lines.

Furthermore, in the plan view in the upper field of each of FIGS. 6 to 20, the state of the shutter 91 or the change of its state is represented by a character string, and the state of the upper holding devices 10A, 10B or the change of its state is represented by a character string. Further, in the side view in the middle field of each of FIGS. 6 to 21, the state of the lower holding device 20 or a change of its state is indicated by a character string. The state of the lower holding device 20 represents whether the suction holder 21 is rotating.

Figure 6:
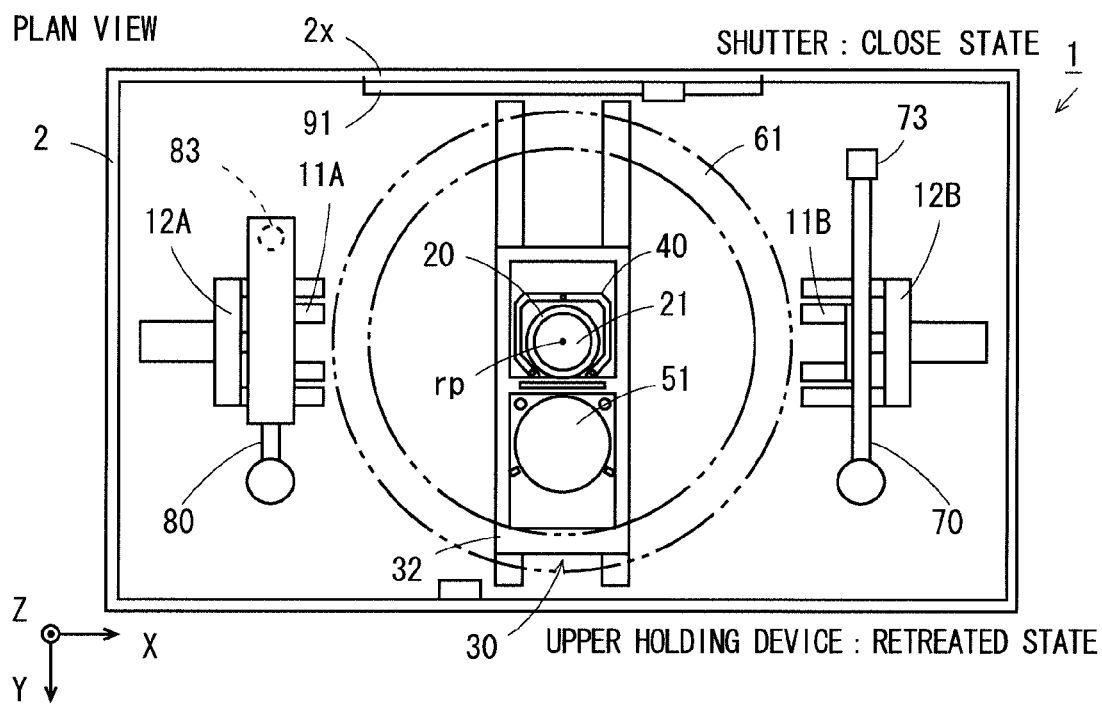
FIG. 6 is a schematic diagram for explaining one example of the operation of the substrate cleaning device of FIG. 1.
Figure 6:
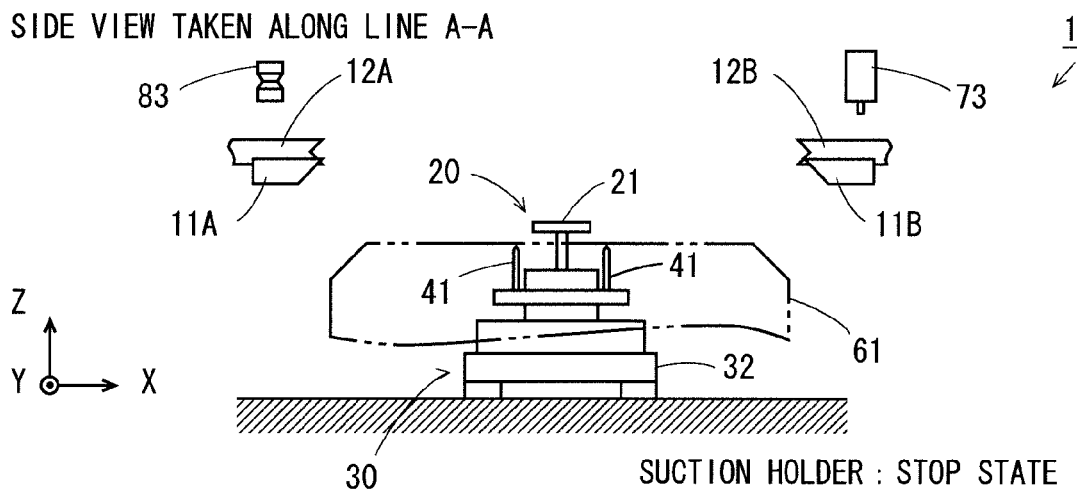
Figure 6:
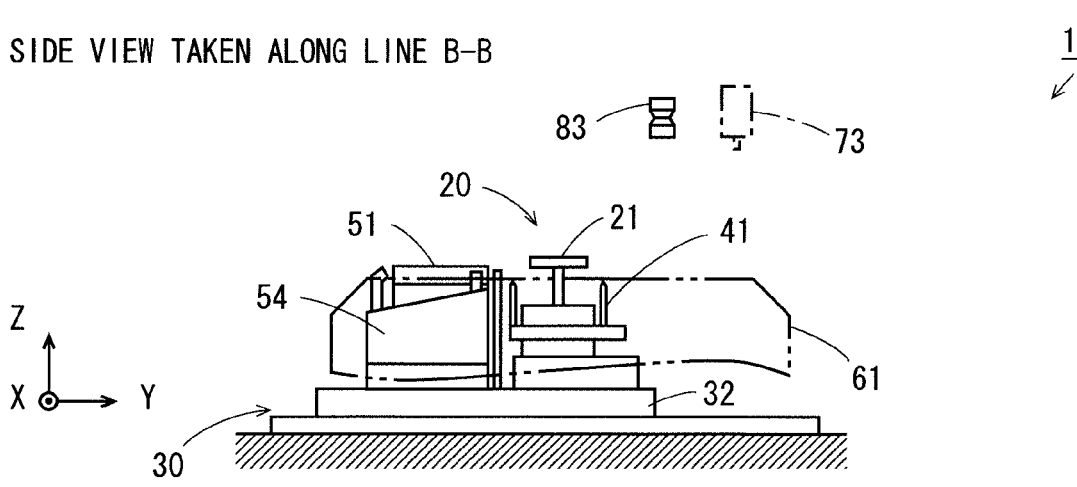

First, as shown in FIG. 6, it is assumed that no substrate W is present in the unit casing 2 as an initial state (waiting state). In the initial state before the substrate W is carried into the substrate cleaning device 1, the shutter 91 of the opening-closing device 90 is in the close state. Therefore, the inlet-outlet port 2x is closed by the shutter 91. Further, the upper holding devices 10A, 10B are in the retreated state. Therefore, the lower chucks 11A, 11B are maintained with the distance between the lower chucks 11A, 11B being sufficiently larger than the diameter of the substrate W. Further, the upper chucks 12A, 12B are also maintained with the distance between the upper chucks 12A, 12B being sufficiently larger than the diameter of the substrate W. The lower holding device 20 is in a stop state in which the rotation of the suction holder 21 is stopped.

Further, in the initial state, the mobile base 32 of the base device 30 is arranged such that the center of the suction holder 21 is located at the center of the cup 61 in plan view. At this time, the lower-surface cleaning device 50 is at a position spaced apart from the suction holder 21 by a certain distance in the Y direction on the mobile base 32. Further, the cleaning surface (upper end portion) of the lower-surface brush 51 of the lower-surface cleaning device 50 is located farther downwardly than the suction holder 21. The position of the lower-surface brush 51 in the up-and-down direction (Z direction) in the initial state is referred to as a lower-surface brush waiting position. In a case in which the substrate W is held by the suction holder 21, the lower-surface brush waiting position is below the substrate W. In particular, in the present embodiment, the lower-surface brush waiting position is equivalent to the lowest position in a range of the up-and-down direction in which the lower-surface brush 51 is liftable and lowerable by the lifting-lowering supporter 54.

Further, in the initial state, the receiving-transferring device 40 is in a state in which the plurality of support pins 41 are located farther downwardly than the suction holder 21. Further, the cup 61 of the cup device 60 is in the lower cup position. In the following description, the center position of the cup 61 in plan view is referred to as a plane reference position rp. Further, the position of the mobile base 32 located on the bottom surface portion 2a when the center of the suction holder 21 is in the plane reference position rp in plan view is referred to as a reference horizontal position.

Further, in the initial state, the spray nozzle 73 of the upper-surface cleaning device 70 is held at a waiting position spaced apart from the cup 61 by a predetermined distance on one side in the X direction and farther upwardly than the upper holding devices 10A, 10B and the cup 61. Hereinafter, the waiting position of the spray nozzle 73 in the initial state is referred to as a spray nozzle waiting position.

Further, the bevel brush 83 of the end-portion cleaning device 80 is held at a waiting position spaced apart from the cup 61 by a predetermined distance on the other side in the X direction and farther upwardly than the upper holding devices 10A, 10B and the cup 61. Hereinafter, the waiting position of the bevel brush 83 in the initial state is referred to as a bevel brush waiting position.

Figure 7:
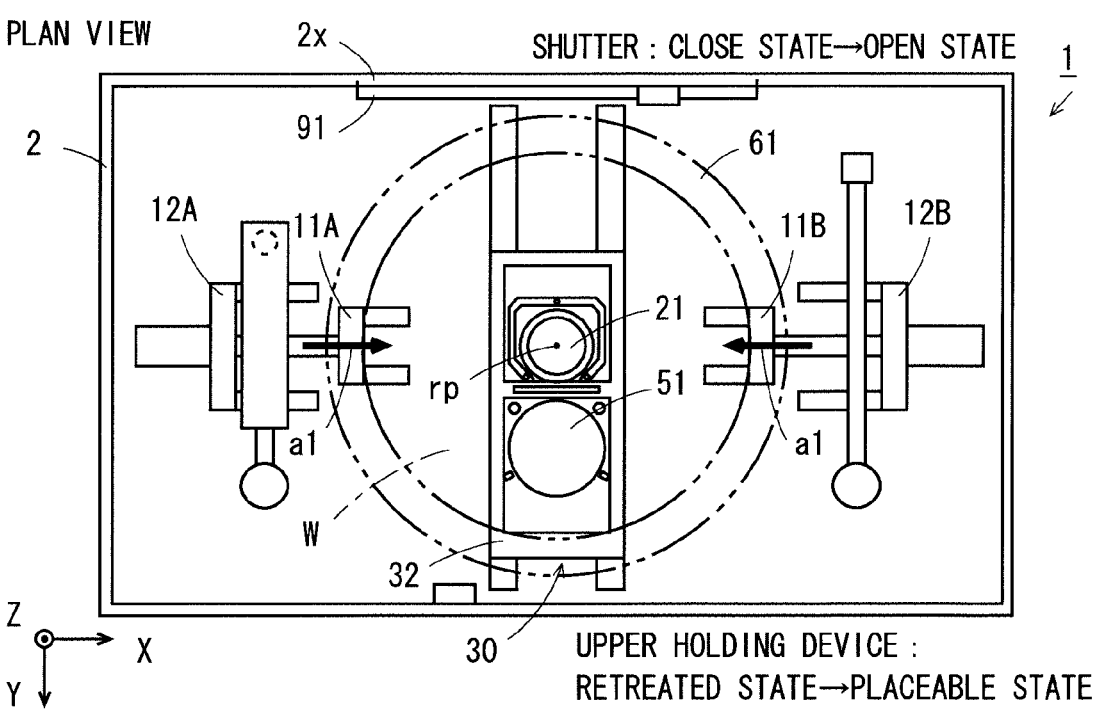
FIG. 7 is a schematic diagram for explaining one example of the operation of the substrate cleaning device of FIG. 1.
Figure 7:
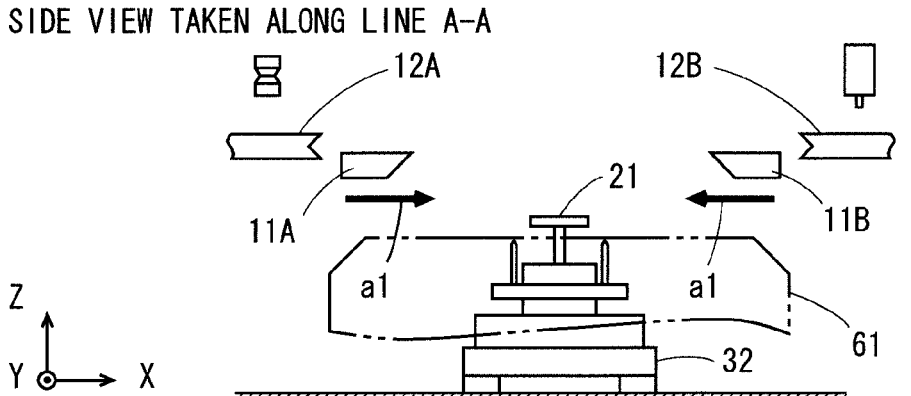
Figure 7:
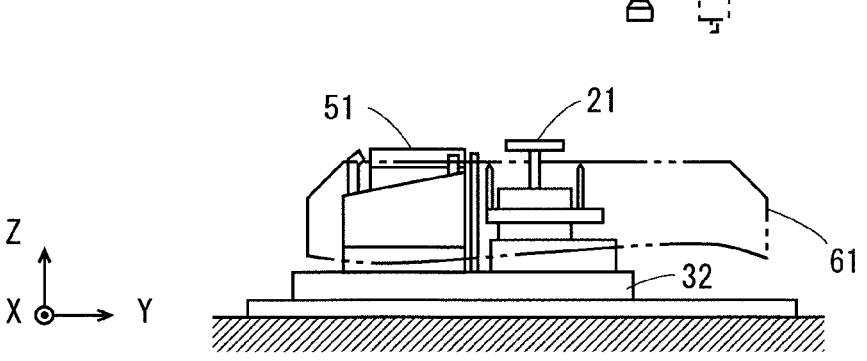

As shown in FIG. 7, when the substrate W is carried into the substrate cleaning device 1, the shutter 91 changes from the close state to the open state immediately before the substrate W enters the unit casing 2. Further, as indicated by the thick solid arrows a1 in FIG. 7, the lower chucks 11A, 11B are moved close to each other, so that the upper holding devices 10A, 10B change from the retreated state to the placeable state.

As described above, an operation of changing the shutter 91 from the close state to the open state is referred to as a shutter opening operation. Further, an operation of changing the upper holding devices 10A, 10B from the retreated state to the placeable state is referred to as a placement preparing operation. In this case, the chuck controller 9A and the carry-in carry-out controller 9I of FIG. 5 respectively start the shutter opening operation and the placement preparing operation such that the period for the shutter opening operation and the period for the placement preparing operation at least partially overlap with each other.

Figure 8:
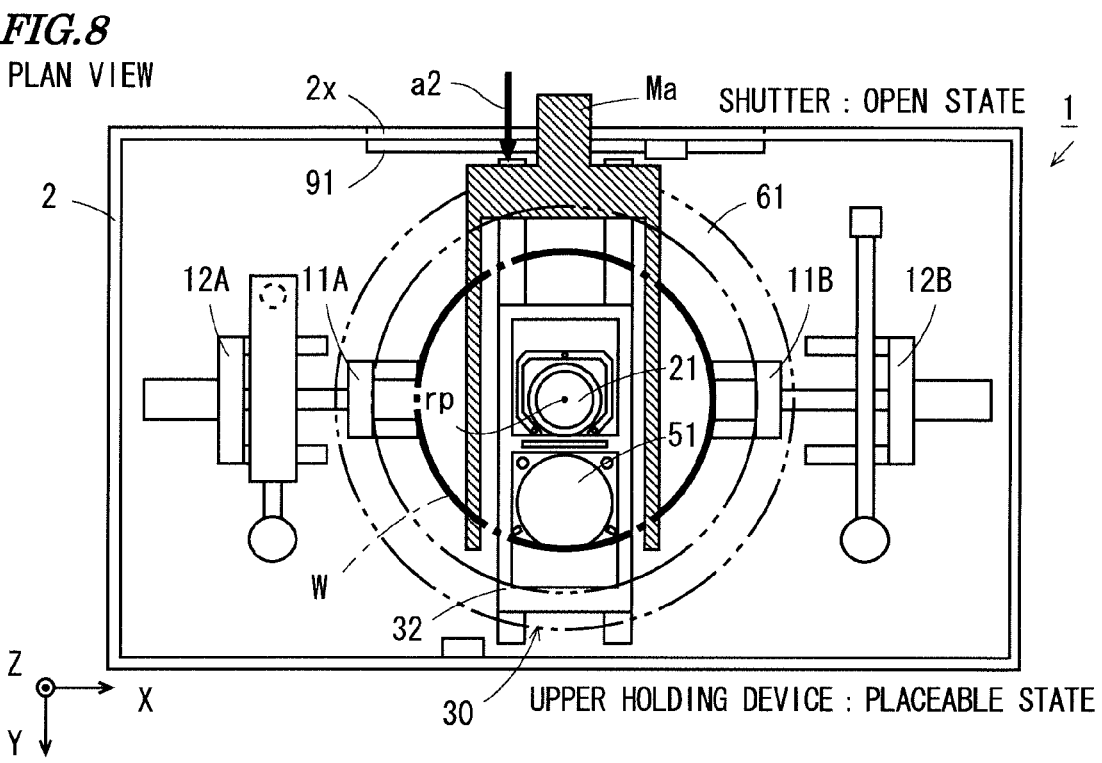
FIG. 8 is a schematic diagram for explaining one example of the operation of the substrate cleaning device of FIG. 1.
Figure 8:
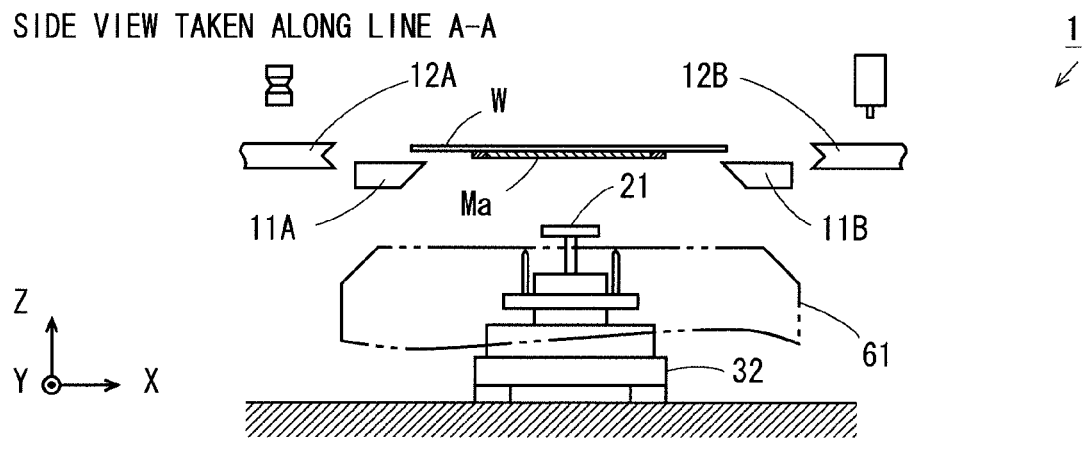
Figure 8:
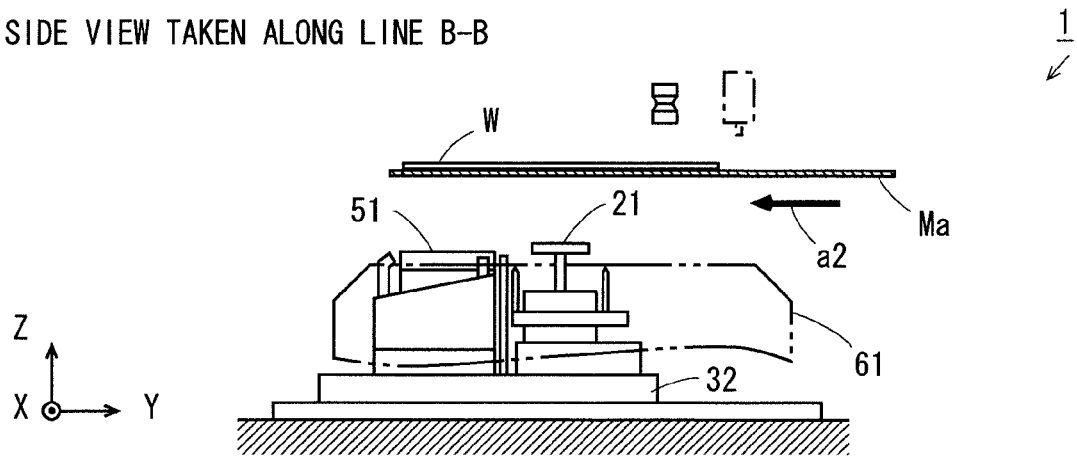

Next, as indicated by the thick solid arrow a2 in FIG. 8, a hand (substrate holder) Ma of a substrate transporting robot (not shown) enters the unit casing 2 through the inlet-outlet port 2x to move the substrate W to the substantially center position in the unit casing 2. At this time, the substrate W held by the hand Ma is located between the upper chuck 12A and the upper chuck 12B.

Next, the hand Ma is lowered. At this time, the upper holding devices 10A, 10B are in the placeable state. Therefore, when the hand Ma is moved to a position farther downwardly than the upper holding devices 10A, 10B, the substrate W held by the hand Ma is placed on the pair of lower chucks 11A, 11B. Thus, a plurality of portions of the lower-surface peripheral portion of the substrate W are respectively supported by the plurality of support pieces 200 (FIG. 3) of the lower chucks 11A, 11B. Thereafter, the empty hand Ma exits from the inlet-outlet port 2x.

Figure 9:
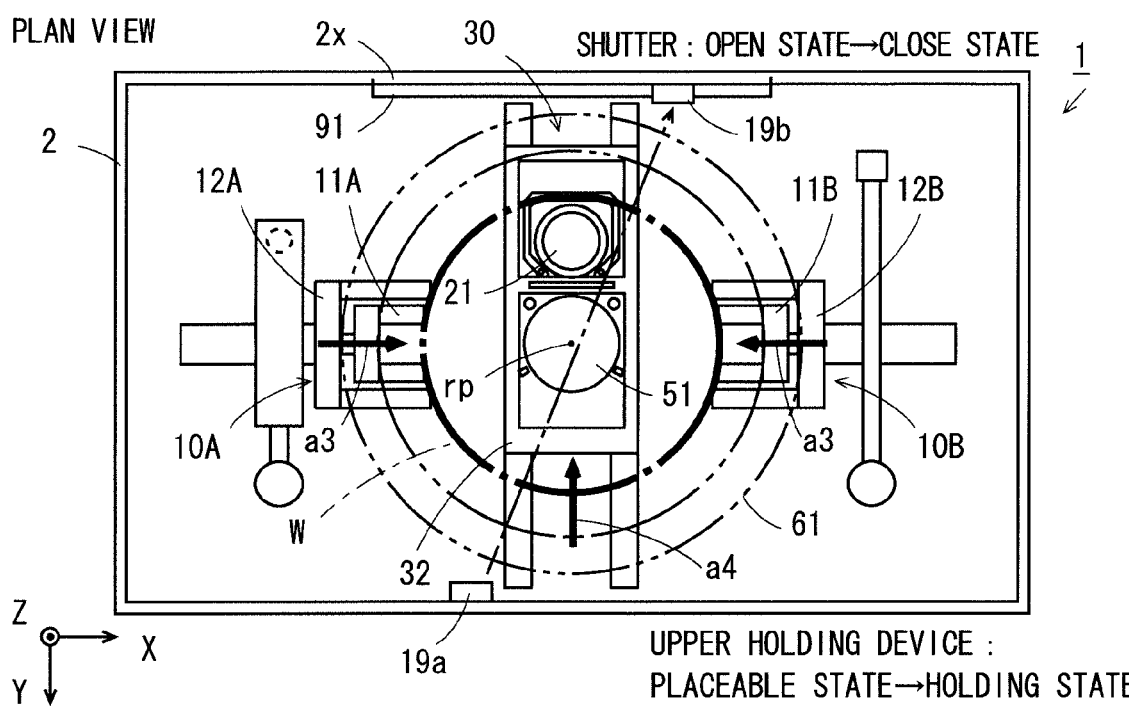
FIG. 9 is a schematic diagram for explaining one example of the operation of the substrate cleaning device of FIG. 1.
Figure 9:
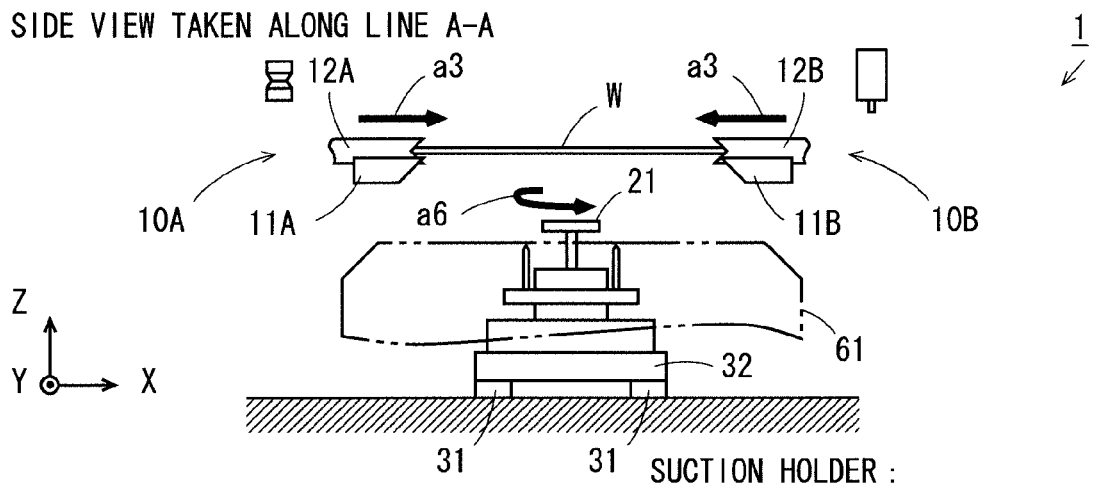
Figure 9:
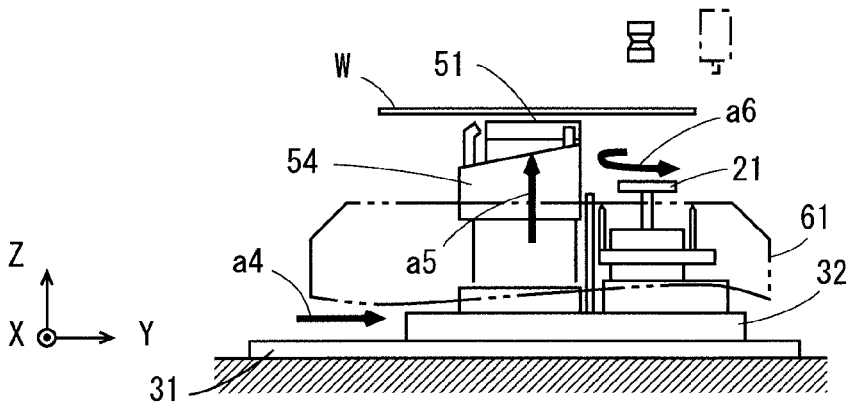

Next, after the hand Ma exits, as shown in FIG. 9, the shutter 91 changes from the open state to the close state. Further, the photoelectric sensor 19 (FIG. 5) makes the substrate placement state determination. Specifically, light is emitted from the light emitter 19a to the light receiver 19b, and it is determined whether the substrate W is normally placed on the upper holding devices 10A, 10B based on a light receiving signal of the light receiver 19b. Here, in a case in which it is determined that the substrate W is not normally placed, the processing for the substrate W is stopped.

Further, after the hand Ma exits, as indicated by the thick solid arrows a3 in FIG. 9, the upper chucks 12A, 12B are moved closer to each other, so that a plurality of holding pieces 300 of the upper chucks 12A, 12B abut against the outer peripheral end of the substrate W. Thus, the upper holding devices 10A, 10B change from the placeable state to the holding state, and the substrate W is held by the upper holding devices 10A, 10B. During this change, after one of the upper chucks 12A, 12B is moved to the target position as described above, the other upper chuck is moved toward the one upper chuck, whereby the substrate W is accurately positioned in the X direction.

At this time, the substrate holding state determination is further made by the photoelectric sensor 19 (FIG. 5). Specifically, light is emitted from the light emitter 19a to the light receiver 19b, and it is determined whether the substrate W is normally held by the upper holding devices 10A, 10B based on a light receiving signal of the light receiver 19b. Here, in a case in which it is determined that the substrate W is not normally held, the processing for the substrate W is stopped.

In the substrate cleaning device 1 according to the present embodiment, with the substrate W held by the upper holding devices 10A, 10B, the lower-surface center region of the substrate W is cleaned by the lower-surface brush 51. As such, after the hand Ma exits, for preparation for cleaning of the lower-surface center region of the substrate W, the lower-surface brush 51 is moved to a position opposite to a predetermined region (initial contact region) of the lower surface of the substrate W that is to be initially brought into contact with the lower-surface brush 51. In the present example, the initial contact region is the lower-surface center region of the substrate W.

In this case, specifically, the mobile base 32 is moved in the Y direction such that the lower-surface brush 51 overlaps with the initial contact region of the substrate W in plan view. Further, the lifting-lowering supporter 54 is lifted such that the lower-surface brush 51 is moved to be close to a height position close to the lower surface of the substrate W. More specifically, in the example of FIG. 9, as indicated by the thick solid arrow a4, the mobile base 32 is moved forwardly from the reference horizontal position until the center of the lower-surface brush 51 overlaps with the plane reference position rp in plan view. Further, as indicated by the thick solid arrow a5 in FIG. 9, the lifting-lowering supporter 54 is lifted such that the lower-surface brush 51 is moved to be close to a position in the vicinity of the substrate W (a position that is spaced apart from the substrate W by about 5 mm) from the lower-surface brush waiting position. The lifting-lowering supporter 54 may be lifted to a position at which the lower-surface brush 51 comes into contact with the lower surface of the substrate W.

As described above, an operation of changing the shutter from the open state to the close state is referred to as a shutter closing operation. Further, an operation of changing the upper holding devices 10A, 10B from the placeable state to the holding state performed is referred to as a holding change operation. Further, an operation of moving the lower-surface brush such that the lower-surface brush 51 overlaps with the initial contact region of the substrate W in plan view and an operation of moving the lower-surface brush 51 toward the lower surface of the substrate W held by the upper holding devices 10A, 10B from the lower-surface brush waiting position in the up-and-down direction is referred to as a first brush preparing operation. In this case, the chuck controller 9A, the base controller 9C, the lower-surface cleaning controller 9E and the carry-in carry-out controller 9I of FIG. 5 respectively start the shutter closing operation, the holding change operation and the first brush preparing operation such that the period for the shutter closing operation, the period for the holding change operation and the period for the first brush preparing operation at least partially overlap with one another.

Here, as further indicated by the thick solid arrow a6 in FIG. 9, after the hand Ma exits, the suction holder 21 starts rotating. That is, the lower holding device 20 changes from the stop state to a rotation state. This change of the lower holding device 20 occurs in a period from the time when the substrate W enters the unit casing 2 until the substrate W is held by the upper holding devices 10A, 10B, for example.

Next, the lower-surface brush 51 is pressed against the initial contact region (the lower-surface center region in the present example) of the substrate W. Further, as indicated by the thick solid arrow a7 in FIG. 10, the lower-surface brush 51 is rotated (spins) about the axis extending in the up-and-down direction. Thus, contaminants adhering to the lower-surface center region of the substrate W are physically stripped by the lower-surface brush 51.

Figure 10:
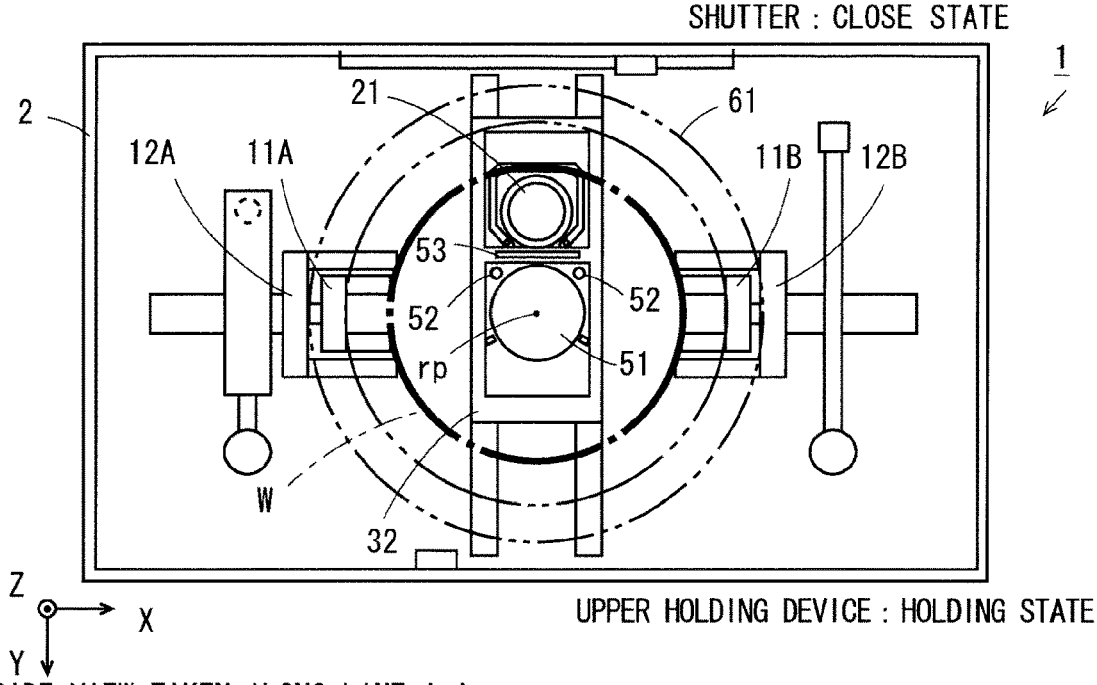
FIG. 10 is a schematic diagram for explaining one example of the operation of the substrate cleaning device of FIG. 1.
Figure 10:
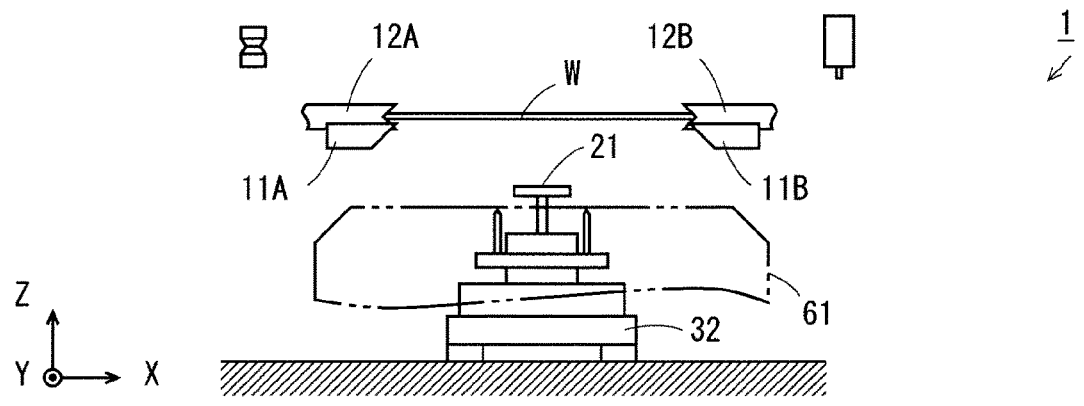
Figure 10:
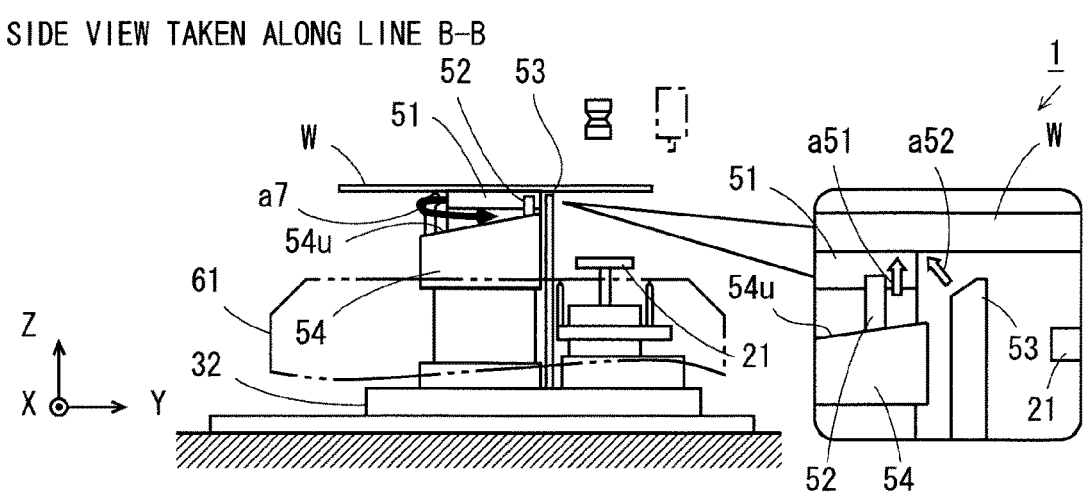

In the bottom field in FIG. 10, an enlarged side view of a portion in which the lower-surface brush 51 comes into contact with the lower surface of the substrate W is shown in a balloon. As shown in the balloon, with the lower-surface brush 51 in contact with the substrate W, the substrate nozzle 52 and the gas injector 53 are held at positions close to the lower surface of the substrate W. At this time, as indicated by the outlined arrow a51, the substrate nozzle 52 discharges the cleaning liquid toward the lower surface of the substrate W at a position in the vicinity of the lower-surface brush 51. Thus, the cleaning liquid that has been supplied to the lower surface of the substrate W from the substrate nozzles 52 is guided to the portion in which the lower-surface brush 51 and the substrate W come into contact with each other, whereby contaminants that have been removed from the back surface of the substrate W by the lower-surface brush 51 are washed away by the cleaning liquid.

Here, the upper surface 54$u$ of the lifting-lowering supporter 54 is inclined downwardly in a direction away from the suction holder 21. In this case, in a case in which the cleaning liquid including contaminants falls on the lifting-lowering supporter 54 from the lower surface of the substrate W, the cleaning liquid received by the upper surface 54$u$ is guided in a direction away from the suction holder 21.

Further, when the lower surface of the substrate W is cleaned by the lower-surface brush 51, the gas injector 53 injects gas toward the lower surface of the substrate W at a position between the lower-surface brush 51 and the suction holder 21 as indicated by the outlined arrow a52 in the balloon of FIG. 10. In the present embodiment, the gas injector 53 is attached onto the mobile base 32 such that the gas injection port extends in the X direction. In this case, when gas is injected to the lower surface of the substrate W from the gas injector 53, a strip-shaped gas curtain extending in the X direction is formed between the lower-surface brush 51 and the suction holder 21. Thus, when the lower surface of the substrate W is cleaned by the lower-surface brush 51, the cleaning liquid including contaminants is prevented from being splashed toward the suction holder 21. Thus, when the lower surface of the substrate W is cleaned by the lower-surface brush 51, the cleaning liquid including contaminants is prevented from adhering to the suction holder 21, and the suction surface of the suction holder 21 is maintained clean.

While the gas injector 53 injects gas obliquely upwardly toward the lower-surface brush 51 from the gas injector 53 as indicated by the outlined arrow a52 in the example of FIG. 10, the present disclosure is not limited to this. The gas injector 53 may inject gas in the Z direction toward the lower surface of the substrate W from the gas injector 53.

As described above, in a period during which the lower-surface center region of the substrate W is cleaned, the lower holding device 20 is continuously in the rotation state. Thus, even in a case in which falling onto the suction holder 21, droplets or the like of the cleaning liquid used for cleaning the substrate W are shaken off from the rotating suction holder 21. This prevents droplets or the like of the cleaning liquid from remaining on the suction holder 21.

Next, in the state of FIG. 10, when the cleaning of the lower-surface center region of the substrate W is completed, the lifting-lowering supporter 54 is lowered such that the cleaning surface of the lower-surface brush 51 is spaced apart from the substrate W by a predetermined distance. Further, discharging of the cleaning liquid from the substrate nozzles 52 to the substrate W is stopped. At this time, the injection of gas from the gas injector 53 to the substrate W continues.

Figure 11:
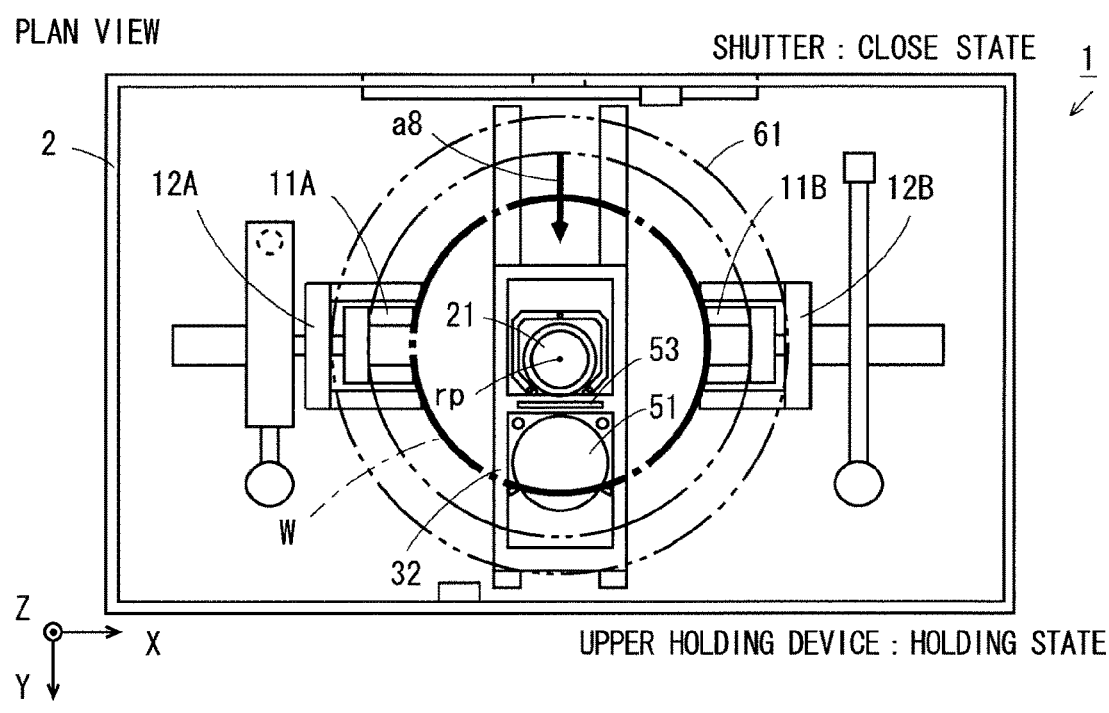
FIG. 11 is a schematic diagram for explaining one example of the operation of the substrate cleaning device of FIG. 1.
Figure 11:
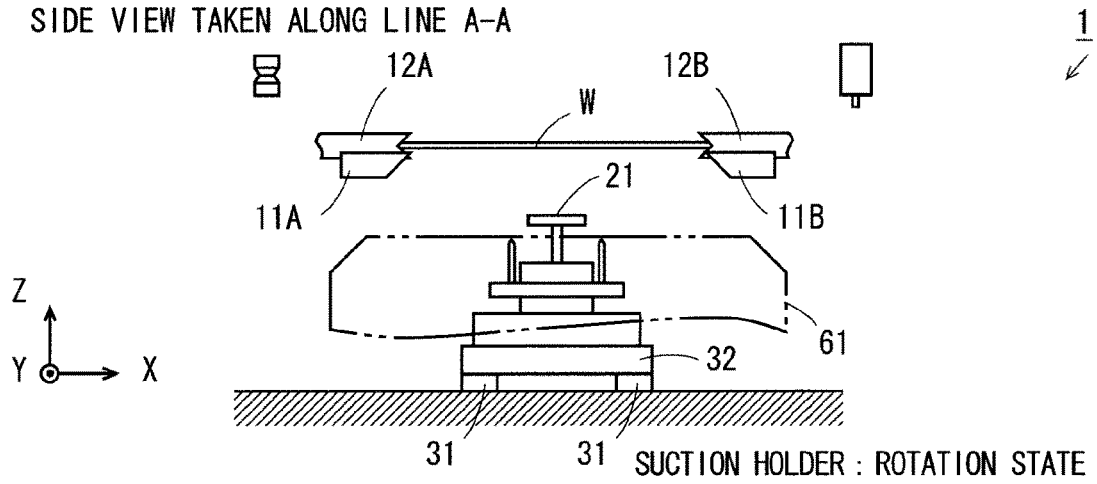
Figure 11:
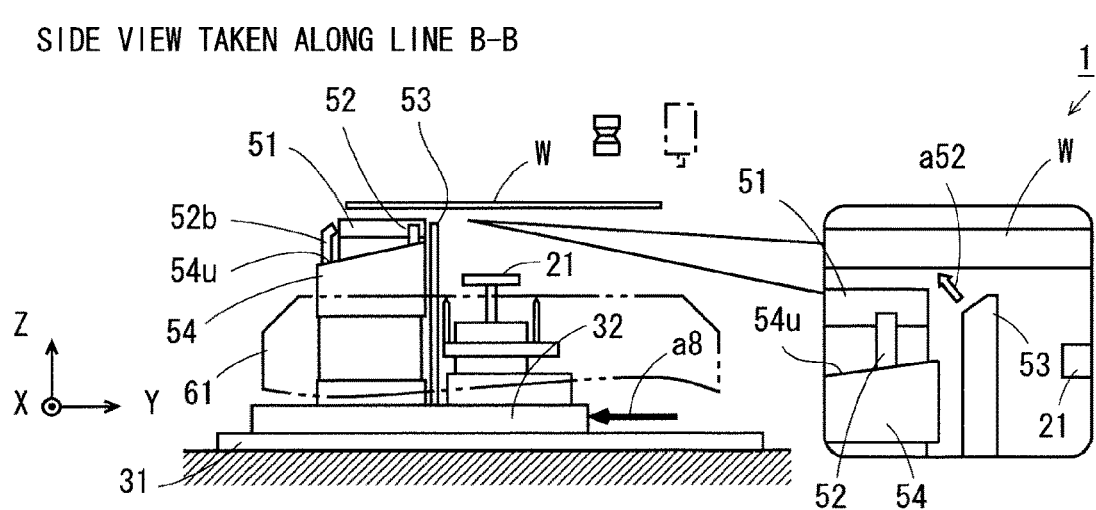

Thereafter, as indicated by the thick solid arrow a8 in FIG. 11, the mobile base 32 is moved to a position deviated rearwardly from the reference horizontal position by a predetermined distance in plan view. At this time, injection of gas from the gas injector 53 to the substrate W continues, so that the lower-surface center region of the substrate W is sequentially dried by a gas curtain. When the lower-surface center region of the substrate W is dried by the gas injector 53, the rotation of the lower-surface brush 51 may be temporarily stopped.

Figure 12:
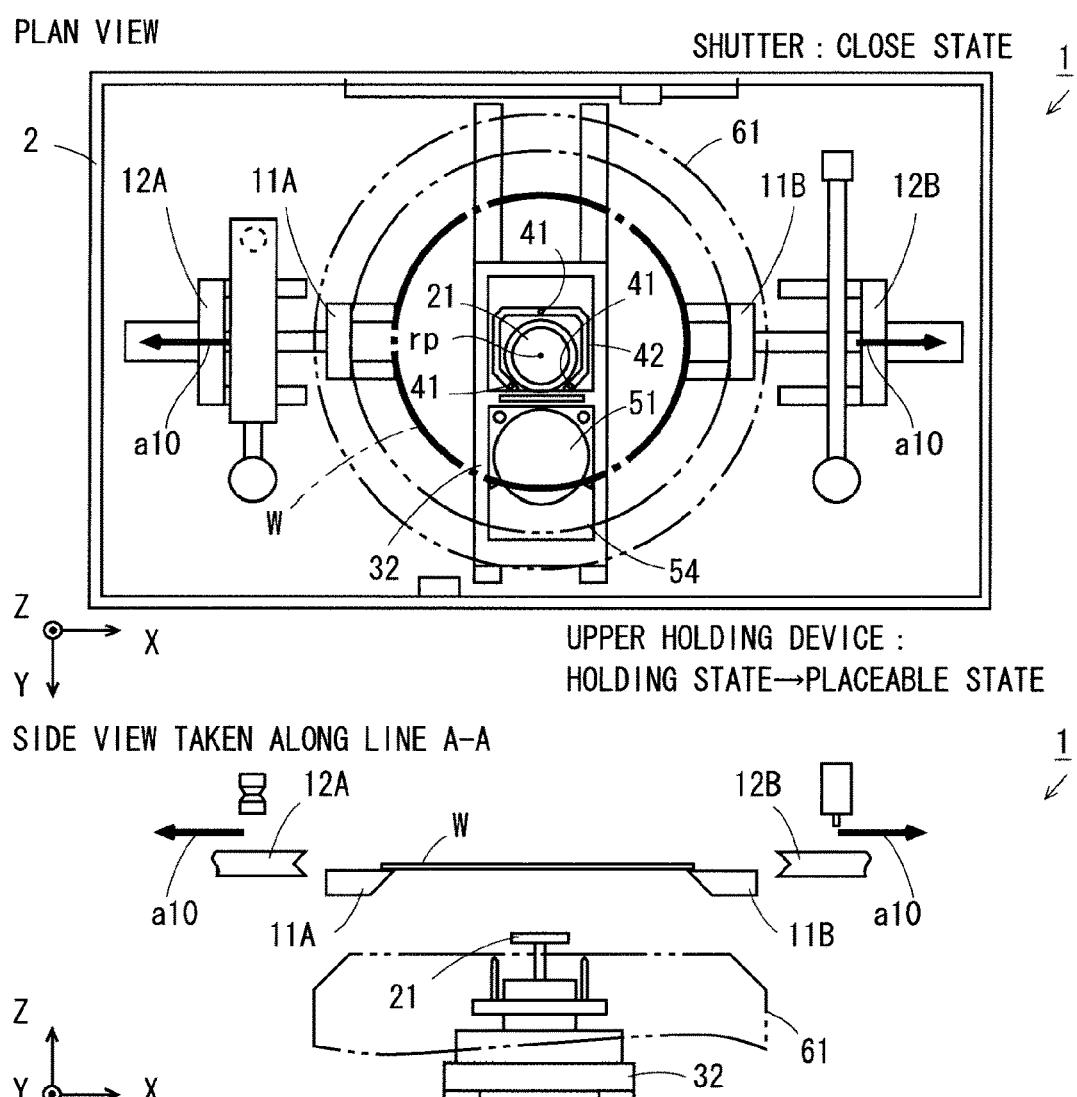
FIG. 12 is a schematic diagram for explaining one example of the operation of the substrate cleaning device of FIG. 1.
Figure 12:
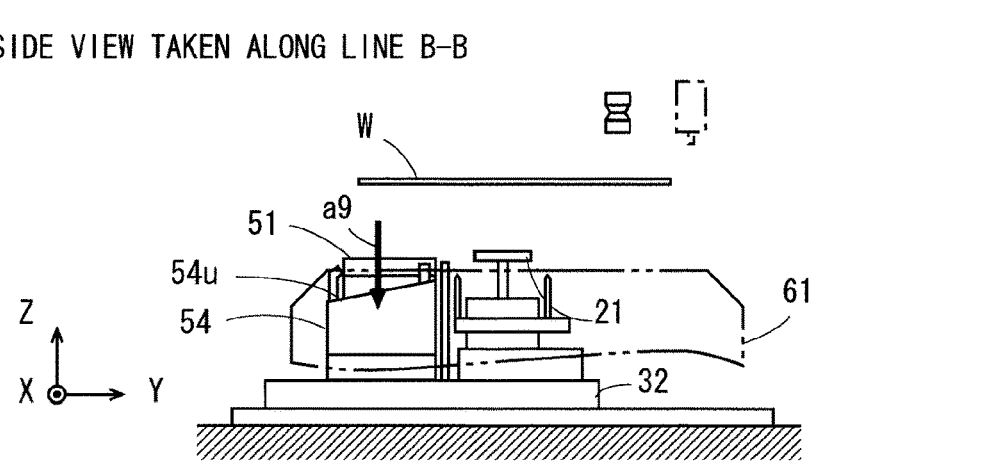

Next, as indicated by the thick solid arrow a9 in FIG. 12, the lifting-lowering supporter 54 is lowered such that the cleaning surface of the lower-surface brush 51 is located farther downwardly than the suction surface (upper end portion) of the suction holder 21. Thus, the lower-surface brush 51 is moved to the lower-surface brush waiting position (height position). After cleaning of the lower-surface center region of the substrate W, before drying by the gas injector 53, the lower-surface brush 51 may be moved from a position at which the lower-surface brush 51 comes into contact with the lower surface of the substrate W to the lower-surface brush waiting position.

Further, as indicated by the thick solid arrows a10 in FIG. 12, the upper chucks 12A, 12B are moved away from each other such that the upper chucks 12A, 12B are spaced apart from the outer peripheral end of the substrate W. Thus, the upper holding devices 10A, 10B change from the holding state to the placeable state, and the substrate W is supported on the lower chucks 11A, 11B so as to be able to be picked up. During this change, with one of the upper chucks 12A, 12B located at the target position as described above, the other upper chuck is moved away from the one upper chuck. Thus, the substrate W on the lower chucks 11A, 11B is accurately positioned in the X direction.

Figure 13:
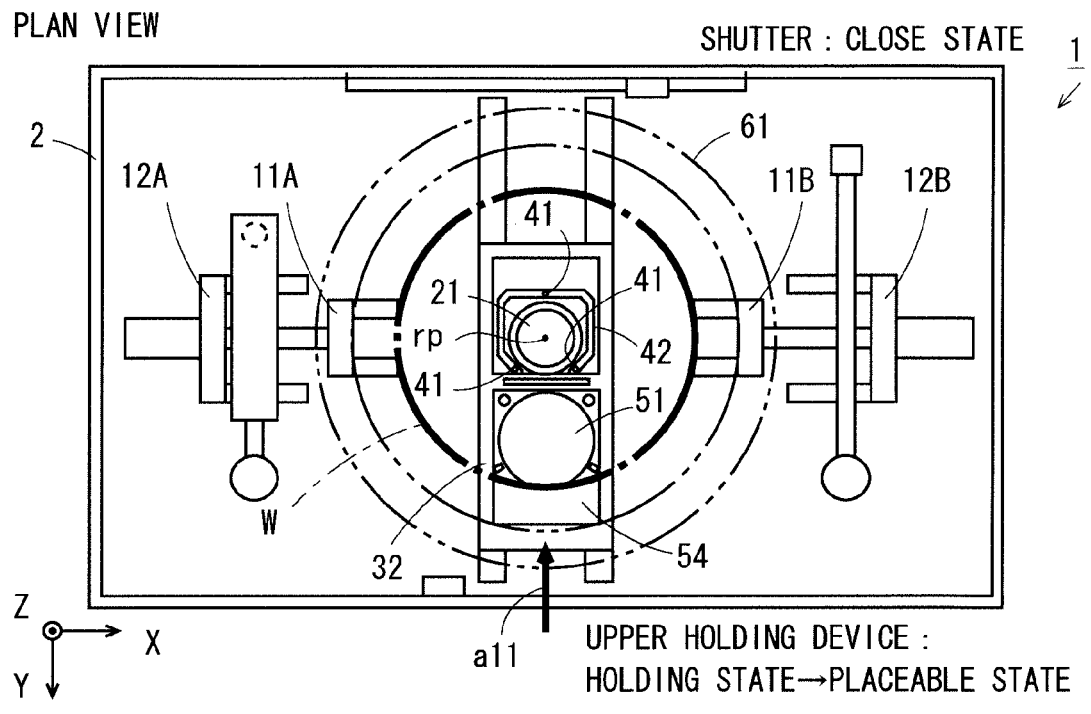
FIG. 13 is a schematic diagram for explaining one example of the operation of the substrate cleaning device of FIG. 1.
Figure 13:
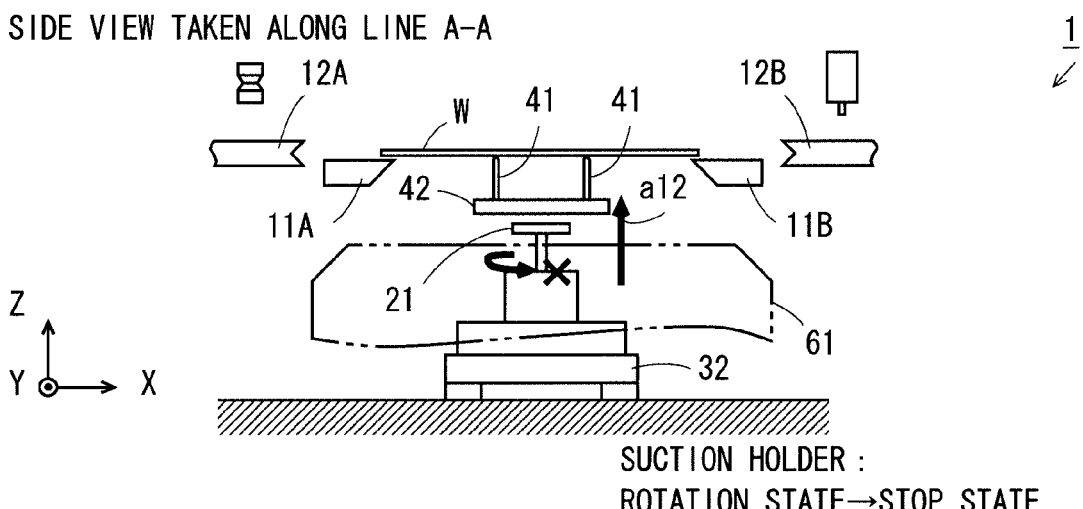
Figure 13:
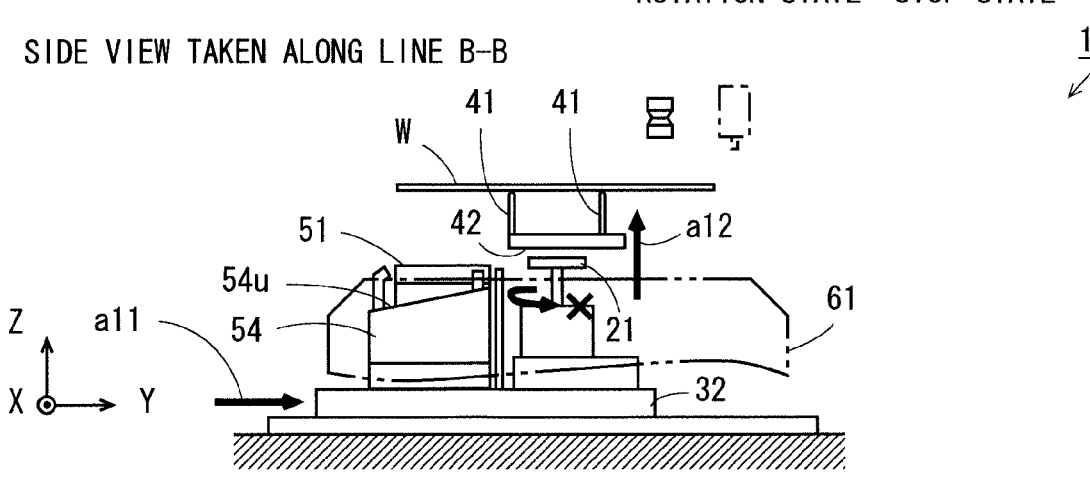

Thereafter, as shown in each of the middle and lower fields of FIG. 13, the lower holding device 20 changes from the rotation state to the stop state. That is, the rotation of the suction holder 21 of the lower holding device 20 is stopped. It requires about 2 sec, for example, to stop this rotation. Further, as indicated by the thick solid arrow a11 in FIG. 13, the mobile base 32 is moved forwardly toward the reference horizontal position. Further, as indicated by the thick solid arrow a12 in FIG. 13, the pin coupling member 42 is lifted such that the upper end portions of the plurality of support pins 41 are located slightly farther upwardly than the lower chucks 11A, 11B. Thus, the substrate W supported by the lower chucks 11A, 11B is received by the plurality of support pins 41.

Here, the receiving-transferring controller 9D of FIG. 5 lifts the plurality of support pins 41 at a high speed in a period during which the upper end portions of the plurality of support pins 41 are moved from a position farther downward than the suction holder 21 to a height position slightly farther downward than the plurality of support pieces 200 (FIG. 3) of the lower chucks 11A, 11B. On the other hand, the receiving-transferring controller 9D lifts the plurality of support pins 41 at a low speed in a period during which the upper end portions of the plurality of support pins 41 are moved from a position slightly farther downward than the plurality of support pieces 200 to a height position slightly farther upward than the plurality of support pieces 200. This prevents the substrate W from being damaged when the plurality of support pins 41 come into contact with the substrate W, and shortens a period of time until the plurality of support pins 41 in the initial state receive the substrate W.

As described above, an operation of changing the lower holding device 20 from the rotation state to the stop state is referred to as a rotation stop operation. Further, an operation of moving the mobile base 32 in the horizontal direction (forwardly in the present example) toward the reference horizontal position is referred to as a horizontal moving operation. Further, an operation of lifting the plurality of support pins 41 is referred to as an up-and-down moving operation. The horizontal moving operation for the mobile base 32 and the up-and-down moving operation for the plurality of support pins 41 are operations performed for transfer of the substrate W from the upper holding device 10A, 10B to the lower holding device 20. In this case, the chuck controller 9A, the base controller 9C and the receiving-transferring controller 9D of FIG. 5 respectively start the rotation stop operation, the horizontal moving operation and the up-and-down moving operation such that at least part of the period for the rotation stop operation, at least part of the period for the horizontal moving operation and at least part of the period for the up-and-down moving operation overlap with one another.

Figure 14:
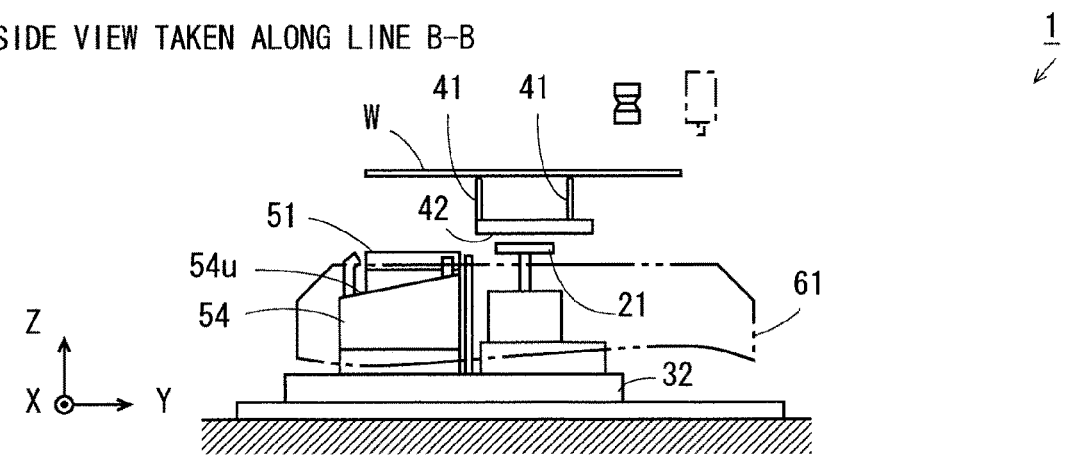
FIG. 14 is a schematic diagram for explaining one example of the operation of the substrate cleaning device of FIG. 1.

Next, as indicated by the thick solid arrows a13 in FIG. 14, the lower chucks 11A, 11B are moved away from each other. Thus, the upper holding devices 10A, 10B change from the placeable state to the retreated state. At this time, the lower chucks 11A, 11B are located at positions at which the lower chucks 11A, 11B do not overlap with the substrate W supported by the plurality of support pins 41 in plan view. Thus, the substrate W supported in a horizontal posture by the plurality of support pins 41 can be moved in the up-and-down direction (Z direction) between the upper holding devices 10A, 10B. Further, in the present embodiment, when the upper holding devices 10A, 10B are in the retreated state, the lower chucks 11A, 11B and the upper chucks 12A, 12B are located at positions at which the lower chucks 11A, 11B or the upper chucks 12A, 12B do not overlap with the cup 61 in plan view.

Figure 15:
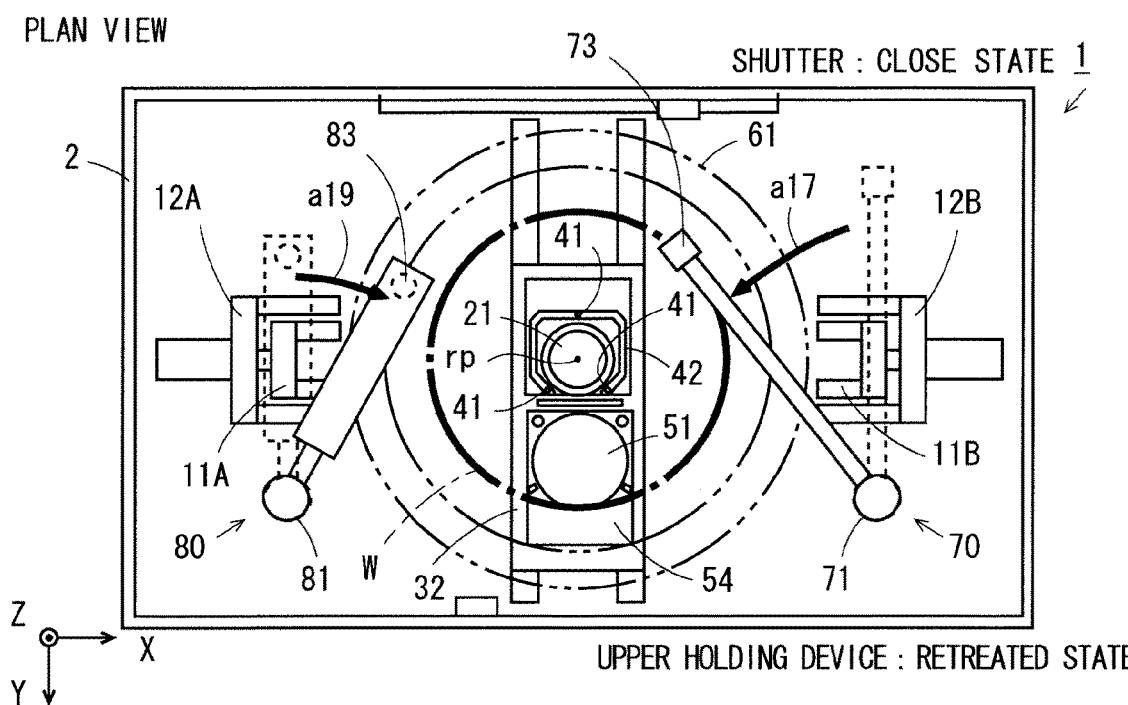
FIG. 15 is a schematic diagram for explaining one example of the operation of the substrate cleaning device of FIG. 1.
Figure 15:
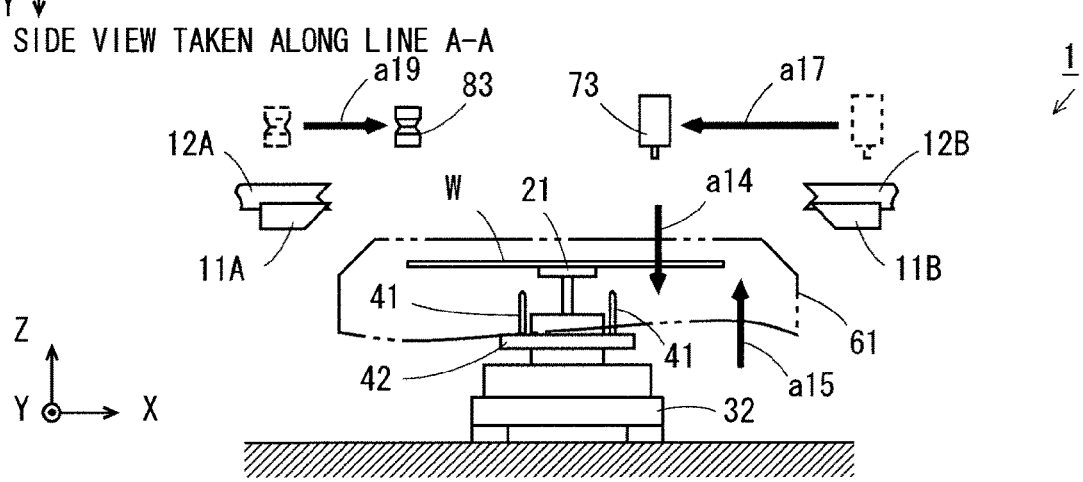
Figure 15:
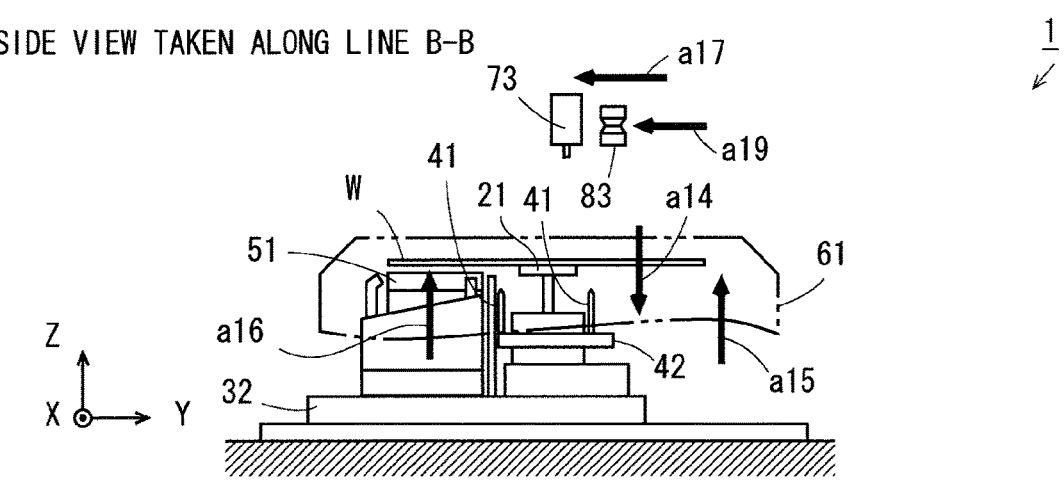
Figure 16:
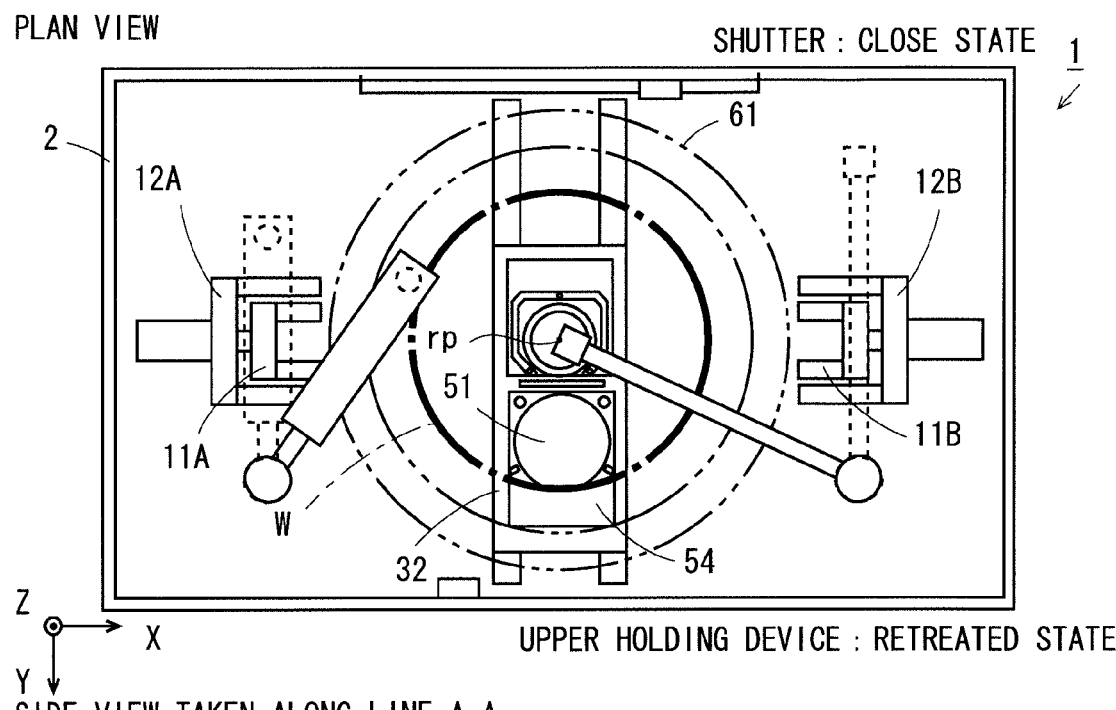
FIG. 16 is a schematic diagram for explaining one example of the operation of the substrate cleaning device of FIG. 1.
Figure 16:
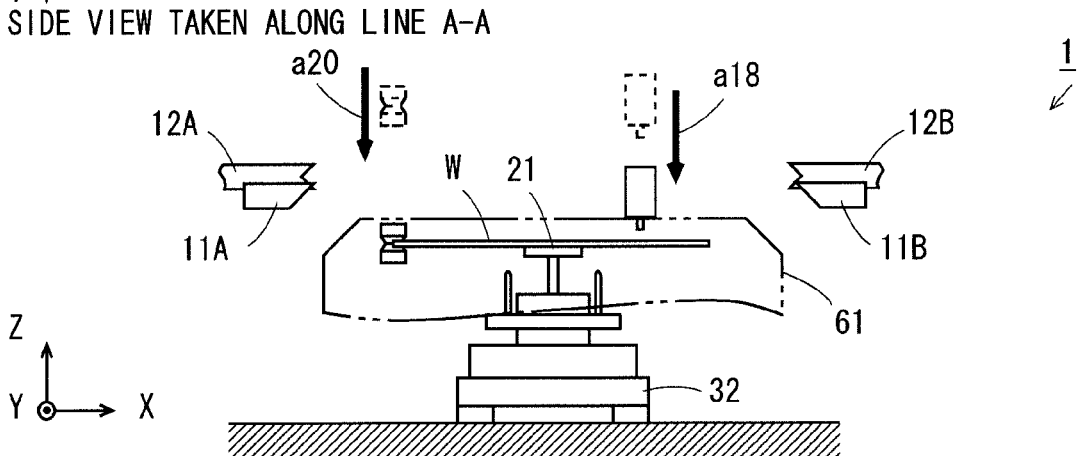
Figure 16:
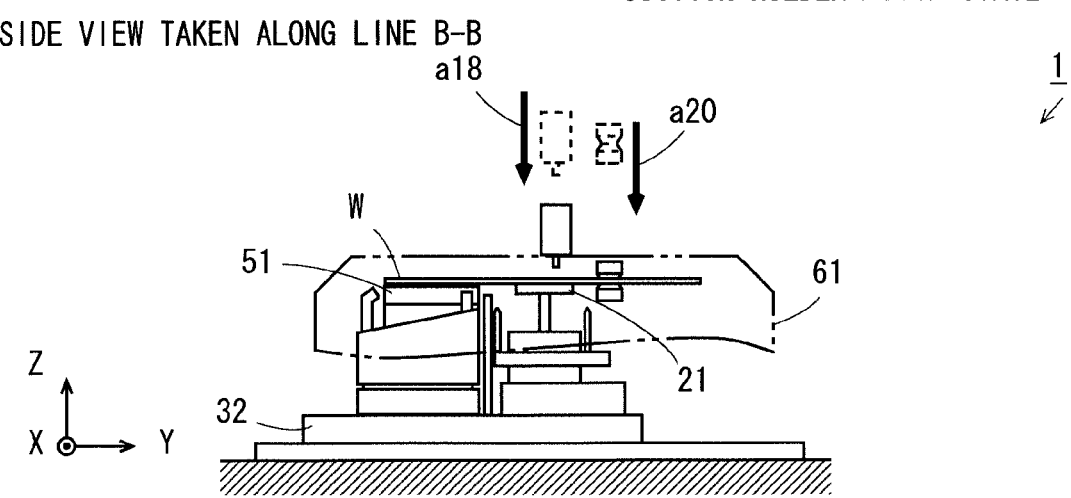

Next, as indicated by the thick solid arrow a14 in FIG. 15, the pin coupling member 42 is lowered such that the upper end portions of the plurality of support pins 41 are located farther downwardly than the suction holder 21. Thus, the substrate W supported on the plurality of support pins 41 is received by the suction holder 21. In this state, the suction holder 21 holds the lower-surface center region of the substrate W by suction.

The receiving-transferring controller 9D of FIG. 5 lowers the plurality of support pins 41 at a high speed to such an extent that the substrate W does not float, in a period during which the upper end portions of the plurality of support pins 41 are moved from a position farther upward than the suction holder 21 to a height position slightly farther upward than the suction holder 21. On the other hand, the receiving-transferring controller 9D of FIG. 5 lowers the plurality of support pins 41 at a low speed in a period during which the upper end portions of the plurality of support pins 41 are moved from a height position slightly farther upward than the suction holder 21 to a height position farther downward than the suction holder 21. This prevents the substrate W from being damaged when the suction holder 21 comes into contact with the substrate W, and shortens a period of time until the substrate W on the upper holding devices 10A, 10B is transferred to the lower holding device 20.

Here, as described above, an operation of lowering the substrate W held by the upper holding devices 10A, 10B and transferring the substrate W onto the lower holding device 20 performed by the receiving-transferring device 40 is referred to as a substrate lowering operation. In the present embodiment, each of a cup lifting operation, a second brush preparing operation, a first nozzle preparing operation and a third brush preparing operation, which will be described below, is performed such that each of the period for the cup lifting operation, the period for the second brush preparing operation, the period for the first nozzle preparing operation and the period for the third brush preparing operation at least partially overlaps with the period for the substrate lowering operation performed by the receiving-transferring device 40.

As indicated by the thick solid arrow a15 in FIG. 15, the cup lifting operation is an operation of lifting the cup 61 from the lower cup position to the upper cup position. As described above, the lower chucks 11A, 11B or the upper chucks 12A, 12B do not overlap with the cup 61 in plan view when the upper holding devices 10A, 10B are in the retreated state. Therefore, the above-mentioned cup lifting operation is preferably started when at least the upper holding devices 10A, 10B are in the retreated state. In this case, when the cup 61 is lifted, the cup 61 and the upper holding devices 10A, 10B are prevented from interfering with each other.

As indicated by the thick solid arrow a16 in FIG. 15, the second brush preparing operation is an operation of lifting the lower-surface brush 51 from the lower-surface waiting position toward the lower surface of the substrate W held by the lower holding device 20. During this second brush preparing operation, as indicated by the thick solid arrow a23 in FIG. 17, described below, the lower-surface brush 51 continues to rotate (spins about an axis extending in the up-and-down direction).

Here, during the second brush preparing operation, the lower-surface cleaning controller 9E of FIG. 5 temporarily stops the lifting of the lower-surface brush 51 or decreases the lifting speed of the lower-surface brush 51 at a point in time at which the lower-surface brush 51 reaches a height position slightly downward than the lower surface of the substrate W. This prevents the substrate W from being damaged when the lower-surface brush 51 comes into contact with the substrate W.

The first nozzle preparing operation is an operation of moving the spray nozzle 73 from a spray nozzle waiting position toward a spray nozzle processing position above the substrate W. At a point in time at which the first nozzle preparing operation is started, the spray nozzle 73 is located at a height position farther upward than the upper holding devices 10A, 10B and the cup 61. When the first nozzle preparing operation is started, the rotation support shaft 71 of the upper-surface cleaning device 70 is rotated. Thus, as indicated by the thick solid arrow a17 in FIG. 15, the spray nozzle 73 is moved to a position above the substrate W from the spray nozzle waiting position. Subsequently, the rotation support shaft 71 is lowered by a predetermined distance. Thus, as indicated by the thick solid arrow a18 in FIG. 16, the tip portion of the spray nozzle 73 is lowered to a height position that is about several centimeters above the upper surface of the substrate W, and the spray nozzle 73 reaches the spray nozzle processing position.

The third brush preparing operation is an operation of moving the bevel brush 83 from the bevel brush waiting position toward the bevel brush processing position at which the bevel brush 83 comes into contact with the outer peripheral end of the substrate W. At a point in time at which the third brush preparing operation is started, the bevel brush 83 is located at a height position farther upward than the upper holding devices 10A, 10B and the cup 61. When the third brush preparing operation is started, the rotation support shaft 81 of the end-portion cleaning device 80 is rotated.

Thus, as indicated by the thick solid arrow a17 in FIG. 15, the bevel brush 83 is moved to a position above part of the outer peripheral end of the substrate W from the bevel brush waiting position. Further, the rotation support shaft 81 is lowered by a predetermined distance. Thus, as indicated by the thick solid arrow a20 in FIG. 16, the bevel brush 83 is lowered to a position at which the bevel brush 83 comes into contact with part of the outer peripheral end of the substrate W and reaches the bevel brush processing position.

Here, during the third brush preparing operation, at a point in time at which the bevel brush 83 reaches a position that is slightly spaced apart from the outer peripheral end of the substrate W, the bevel cleaning controller 9H of FIG. 5 temporarily stops lowering of the bevel brush 83 or decreases the lowering speed of the bevel brush 83. This prevents the substrate W from being damaged when the bevel brush 83 comes into contact with the substrate W.

Figure 17:
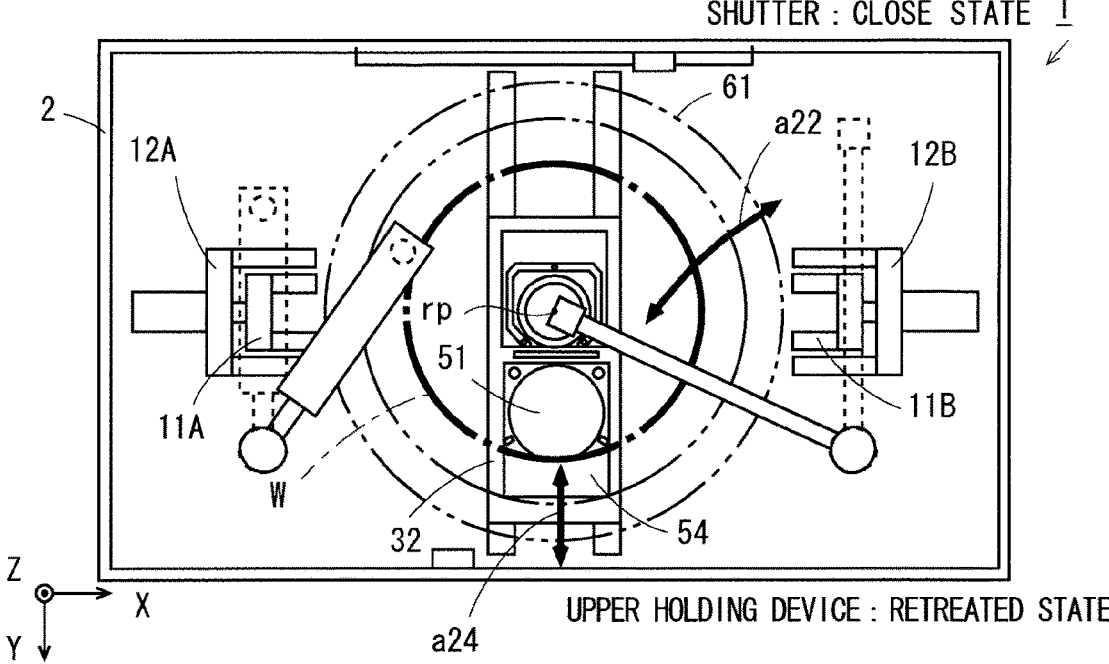
FIG. 17 is a schematic diagram for explaining one example of the operation of the substrate cleaning device of FIG. 1.
Figure 17:
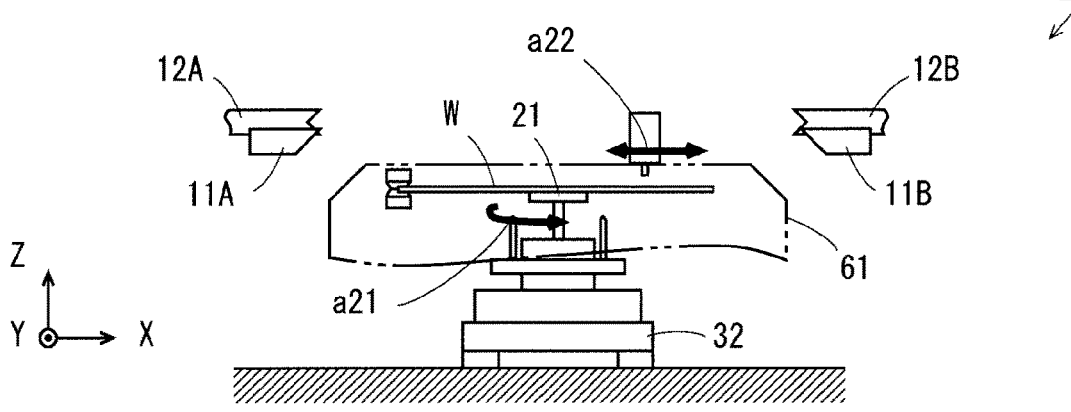
Figure 17:
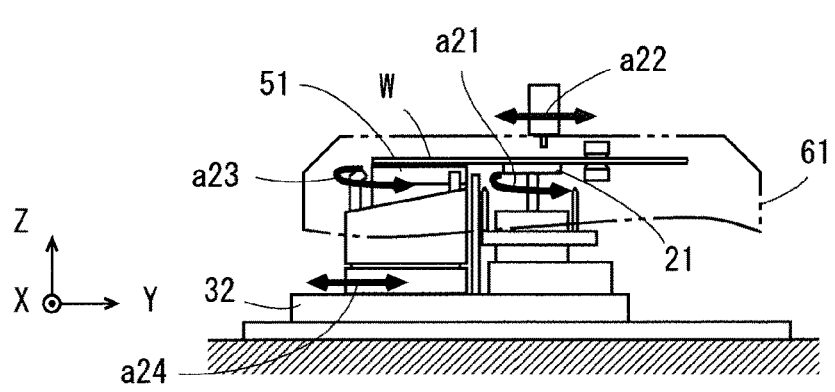
Figure 18:
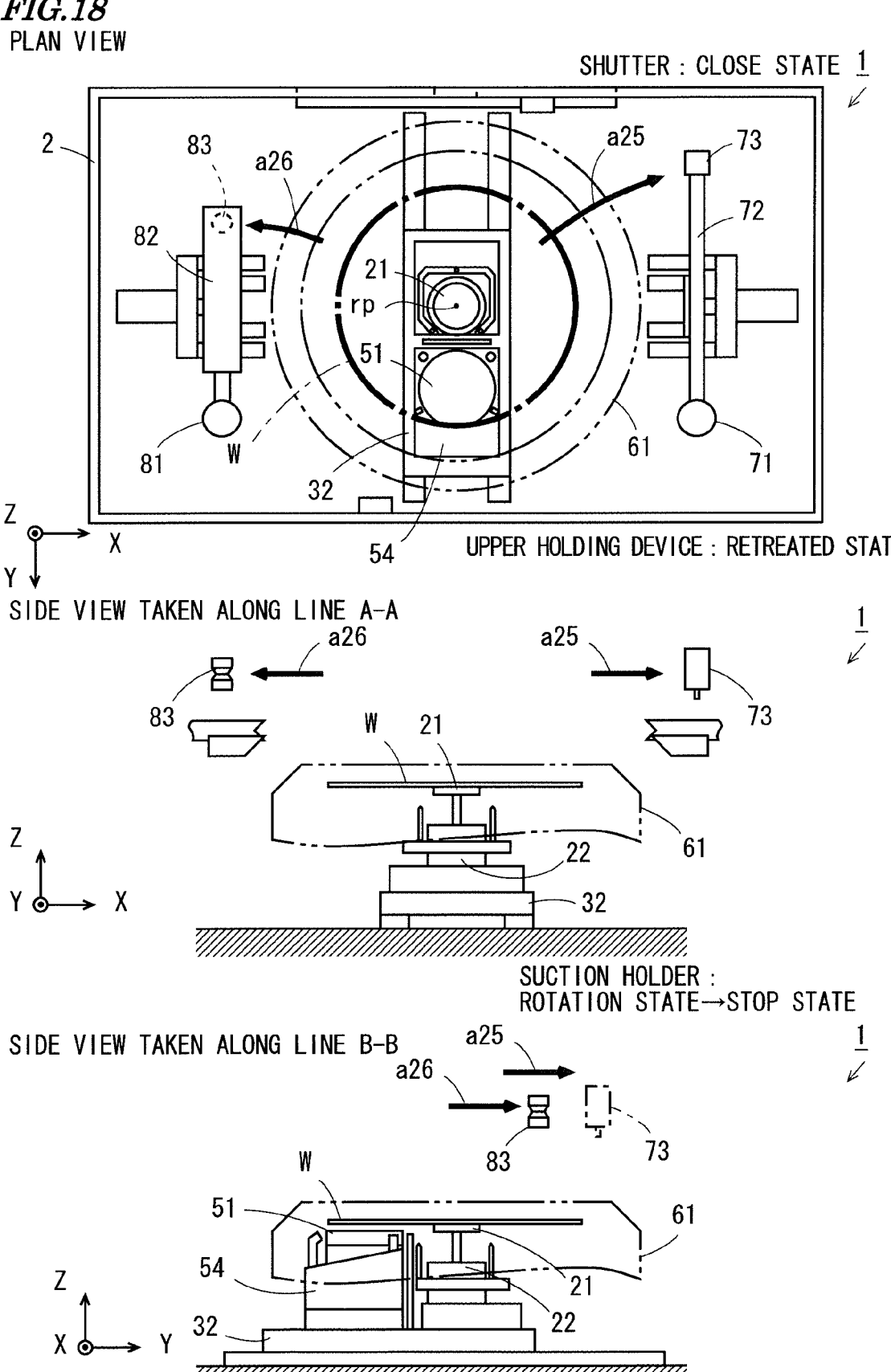
FIG. 18 is a schematic diagram for explaining one example of the operation of the substrate cleaning device of FIG. 1.

Next, as indicated by the thick solid arrow a21 in FIG. 17, the suction holder 21 rotates about the axis extending in the up-and-down direction (an axial center of the rotation shaft of the suction holding driver 22). Thus, the substrate W held by suction by the suction holder 21 is rotated in a horizontal attitude. The rotation of the suction holder 21 may be started as long as it is after the substrate W that has been transferred from the receiving-transferring device 40 to the lower holding device 20 is held by suction by the suction holder.

Thereafter, the fluid mixture of the cleaning liquid and gas is injected from the spray nozzle 73 to the upper surface of the substrate W. Further, the rotation support shaft 71 is rotated. Thus, as indicated by the thick solid arrow a22 in FIG. 17, the spray nozzle 73 is moved in a circular arc shape at a position above the rotating substrate W. The fluid mixture is injected to the entire upper surface of the substrate W, so that the entire upper surface of the substrate W is cleaned.

Further, at this time, with the center portion of the outer peripheral surface of the bevel brush 83 being in contact with the outer peripheral end of the substrate W, the bevel brush 83 is rotated (spins) about an axis extending in the up-and-down direction. Thus, contaminants adhering to the outer peripheral end of the substrate W are physically stripped by the bevel brush 83. The contaminants that have been stripped from the outer peripheral end of the substrate W are washed away by the cleaning liquid of the fluid mixture injected from the spray nozzle 73 to the substrate W.

Further, as indicated by the thick solid arrow a23 in FIG. 17, the lower-surface brush 51 is continuously rotated (spins) about the axis extending in the up-and-down direction. Further, the substrate nozzles 52 discharge the cleaning liquid toward the lower surface of the substrate W, and the gas injector 53 injects the gas toward the lower surface of the substrate W. Thus, it is possible to clean the entire lower-surface outer region of the substrate W held by suction and rotated by the suction holder 21 using the lower-surface brush 51. The rotation direction of the lower-surface brush 51 may be opposite to the rotation direction of the suction holder 21. In this case, the lower-surface outer region of the substrate W can be cleaned efficiently.

The lifting-lowering supporter 54 may be configured to be movable in the Y direction relative to the lower holding device 20 on the mobile base 32. In this case, as indicated by the thick solid arrow a24 in FIG. 17, the lifting-lowering supporter 54 is moved in the Y direction on the mobile base 32. Thus, the range that can be cleaned by the lower-surface brush 51 with the mobile base 32 fixed at a predetermined position is enlarged.

When cleaning of the upper surface, the outer peripheral end and the lower-surface outer region of the substrate W is completed, injection of the fluid mixture from the spray nozzle 73 to the substrate W is stopped. Further, as indicated by the thick solid arrow a25 in FIG. 18, the spray nozzle 73 is moved to the spray nozzle waiting position (the position in the initial state). Further, as indicated by the thick solid arrow a26 in FIG. 18, the bevel brush 83 is moved to the bevel brush waiting position (the position in the initial state). Further, the lifting-lowering supporter 54 is lowered. Thus, the lower-surface brush 51 is moved from the position at which the lower-surface brush 51 comes into contact with the lower surface of the substrate W to the lower-surface brush waiting position. Further, discharging of the cleaning liquid from the substrate nozzles 52 to the substrate W and injection of gas from the gas injector 53 to the substrate W are stopped. In this state, the suction holder 21 is rotated at a high speed, so that the cleaning liquid adhering to the substrate W is shaken off, and the entire substrate W is dried (spin drying). During this spin drying, the rotation of the lower-surface brush 51 may be stopped temporarily.

Figure 19:
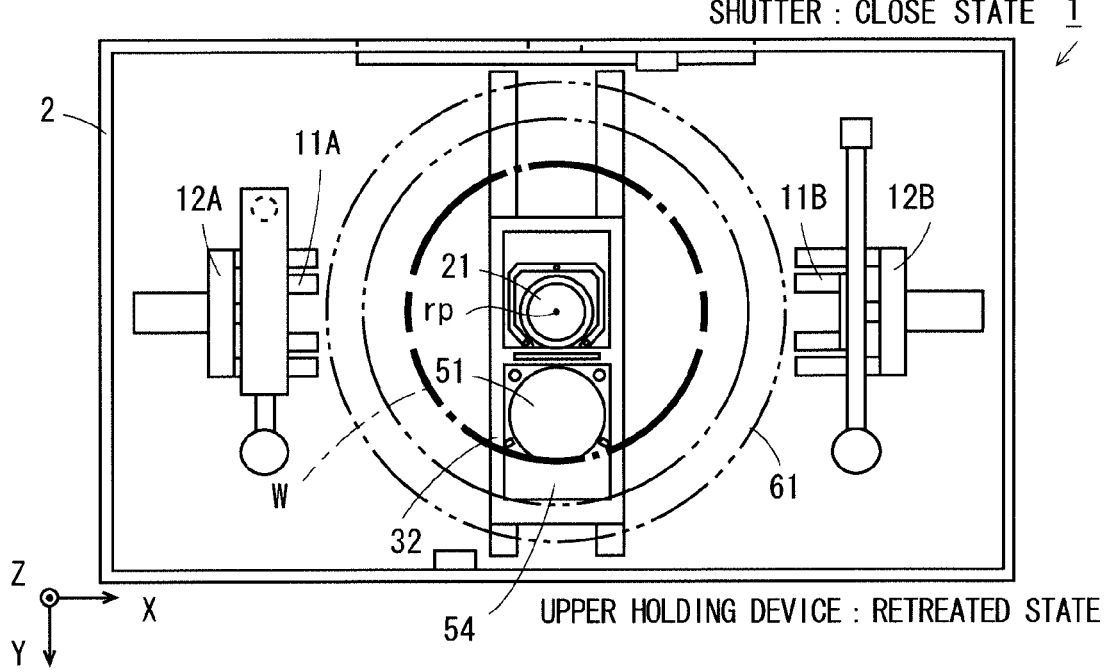
FIG. 19 is a schematic diagram for explaining one example of the operation of the substrate cleaning device of FIG. 1.
Figure 19:
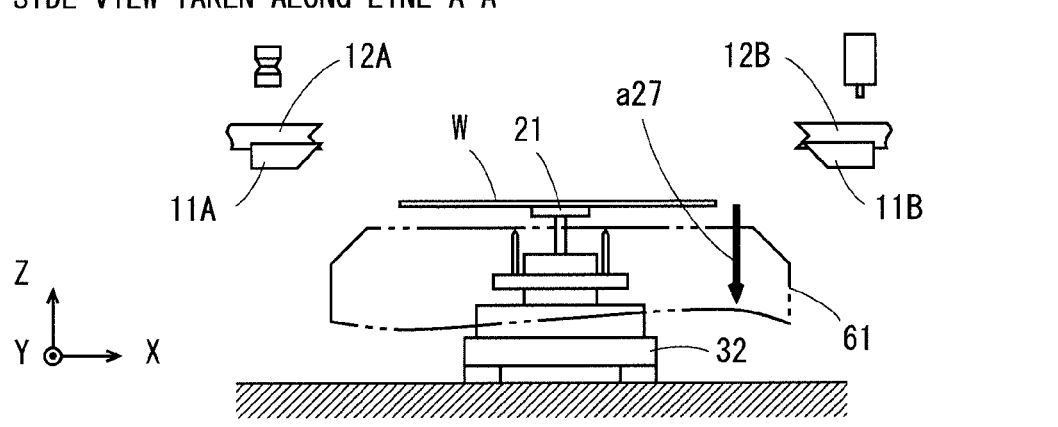
Figure 19:
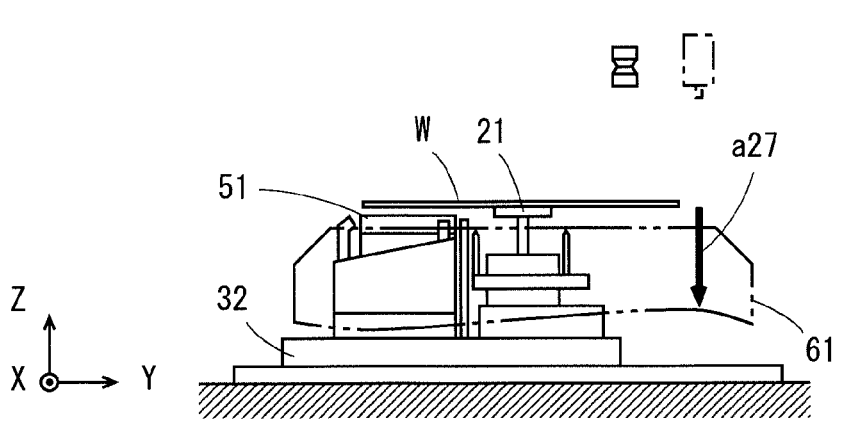

Next, as indicated by the thick solid arrow a27 in FIG. 19, the cup 61 is lowered from the upper cup position to the lower cup position. Thereafter, the substrate W is carried out from the unit casing 2 of the substrate cleaning device 1. When the substrate W is carried out from the unit casing 2, the shutter 91 changes from the close state to the open state (the shutter opening operation) immediately before the hand (substrate holder) Ma of the substrate transporting robot (not shown) enters the unit casing 2.

Figure 20:
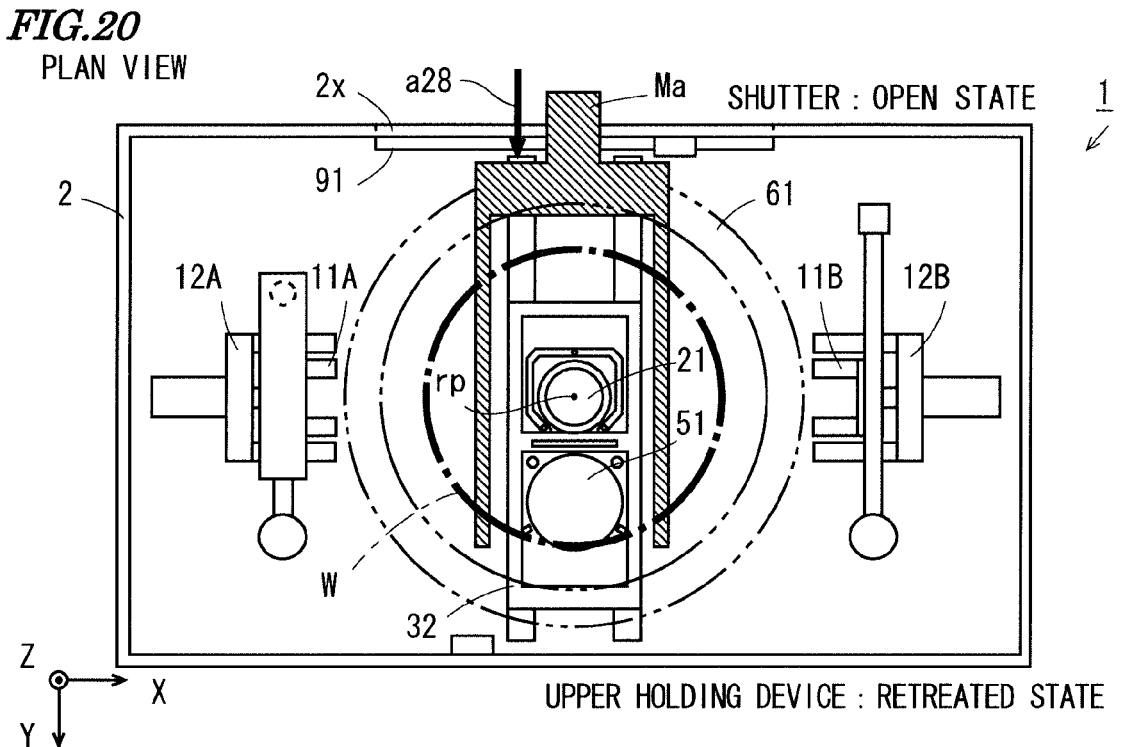
FIG. 20 is a schematic diagram for explaining one example of the operation of the substrate cleaning device of FIG. 1.
Figure 20:
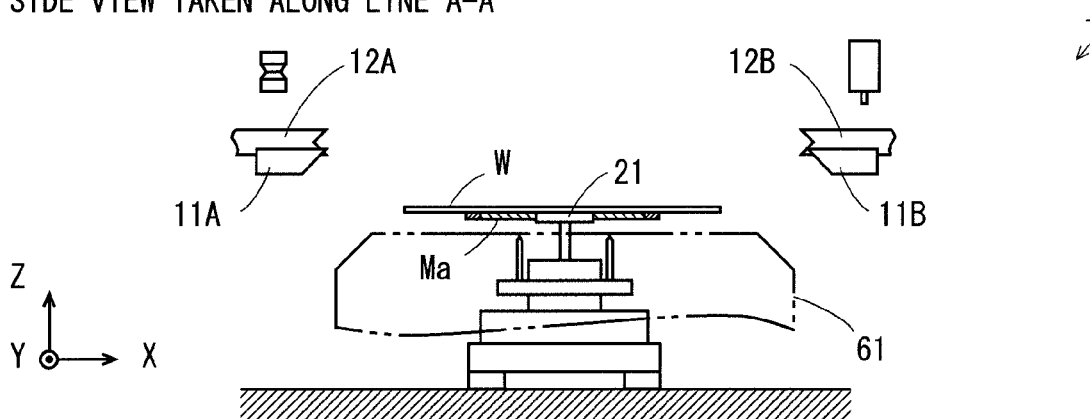
Figure 20:
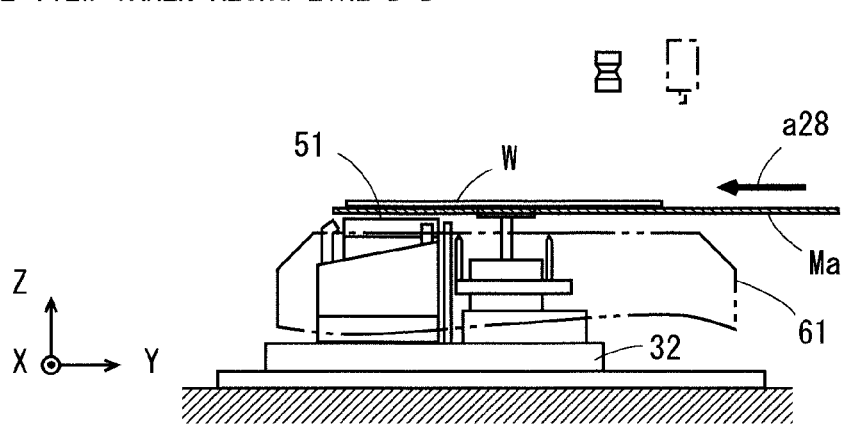

Subsequently, as indicated by the thick solid arrow a28 in FIG. 20, the hand (substrate holder) Ma of the substrate transporting robot enters the unit casing 2 through the inlet-outlet port 2x. Subsequently, the hand Ma receives the substrate W on the suction holder 21 and exits from the inlet-outlet port 2x. After the hand Ma exits, the shutter 91 changes from the open state to the close state (the shutter closing operation).

Consecutively to carrying out of the above-mentioned substrate W, an unprocessed new substrate W may be carried into the unit casing 2 (replacement of the substrate W). In this case, the chuck controller 9A and the carry-in carry-out controller 9I of FIG. 5 respectively start the shutter opening operation for carrying out of the processed substrate W and the placement preparing operation for reception of the unprocessed substrate W by the upper holding devices 10A, 10B such that the period for the shutter opening operation and the period for the placement preparing operation at least partially overlap with each other.

As described above, the lower-surface brush 51 is basically continuously rotated in a period during which the substrate cleaning device 1 is powered on. The lower-surface cleaning controller 9E of FIG. 5 controls the brush cleaning liquid supplier 57 to supply the cleaning liquid for cleaning a brush from the brush cleaning liquid supplier 57 to the brush nozzles 52a, 52b of FIG. 1 in a predetermined brush cleaning period. In this case, the brush cleaning period may include a period during which the substrate W is not present in the unit casing 2. Further, the brush cleaning period may include a period during which the lower-surface brush 51 is located at the lower-surface brush waiting position in the up-and-down direction.

4. Effects (a) In the above-mentioned substrate cleaning device 1, the substrate W is held by the upper holding devices 10A, 10B, and the lower-surface center region of the substrate W is cleaned. Next, by the substrate lowering operation of the receiving-transferring device 40, the substrate W is transferred from the upper holding devices 10A, 10B to the lower holding device 20. At this time, the substrate W held by the upper holding devices 10A, 10B is lowered from the height positions of the upper holding devices 10A, 10B to the height position of the suction holder 21 of the lower holding device 20 by the substrate lowering operation of the receiving-transferring device 40. Thereafter, the substrate W is held by suction by the suction holder 21 to be rotated. In this state, the lower-surface outer region of the substrate W is cleaned by the lower-surface cleaning device 50. The upper surface of the substrate W is cleaned by the upper-surface cleaning device 70, and the outer peripheral end of the substrate W is cleaned by the end-portion cleaning device 80. The cleaning liquid splashing from the substrate W is received by the cup 61, and is collected or discarded.

(b) The cup 61 is in the waiting state at the lower cup position in a period during which the substrate W held by the lower holding device 20 is not cleaned. This prevents the cup 61 and other constituent elements of the substrate cleaning device 1 from interfering with each other. Therefore, immediately before the cleaning of the substrate W held by the lower holding device 20 is started, the cup lifting operation of lifting the cup 61 from the lower cup position to the upper cup position is performed.

The receiving-transferring controller 9D and the cup controller 9F of FIG. 5 respectively start the substrate lowering operation and the cup lifting operation such that the period for the substrate lowering operation and the period for the cup lifting operation at least partially overlap with each other each other. Thus, as compared to a case in which the substrate lowering operation and the cup lifting operation are respectively performed such that the period for the substrate lowering operation and the period for the cup lifting operation do not overlap with each other, the period required for processing for one substrate W is shortened by the overlap period. Thus, the throughput of the substrate processing is improved.

The substrate lowering operation and the cup lifting operation are preferably performed so as to start or end at the same time. In this case, an overlap period corresponding to at least one of the periods for the two operations can be ensured.

(c) Further, the receiving-transferring controller 9D and the lower-surface cleaning controller 9E of FIG. 5 respectively start the substrate lowering operation and the second brush preparing operation such that the period for the substrate lowering operation and the period for the second brush preparing operation at least partially overlap with each other. Thus, as compared to a case in which the substrate lowering operation and the second brush preparing operation are respectively performed such that the period for the substrate lowering operation and the period for the second brush preparing operation do not overlap with each other, the period required for processing for one substrate W is shortened by the overlap period. Thus, the throughput of the substrate processing is improved.

The substrate lowering operation and the second brush preparing operation are preferably performed so as to start or end at the same time. In this case, an overlap period corresponding to at least one of the periods for the two operations can be ensured.

(d) Further, the receiving-transferring controller 9D and the upper-surface cleaning controller 9G of FIG. 5 respectively start the substrate lowering operation and the first nozzle preparing operation such that the period for the substrate lowering operation and the period for the first nozzle preparing operation at least partially overlap with each other. Thus, as compared to a case in which the substrate lowering operation and the first nozzle preparing operation are respectively performed such that the period for the substrate lowering operation and the period for the first nozzle preparing operation do not overlap with each other, the period required for processing for one substrate W is shortened by the overlap period. Thus, the throughput of the substrate processing is improved.

The substrate lowering operation and the first nozzle preparing operation are preferably performed so as to start or end at the same time. In this case, an overlap period corresponding to at least one of the periods for the two operations can be ensured.

(e) Further, the receiving-transferring controller 9D and the bevel cleaning controller 9H of FIG. 5 respectively start the substrate lowering operation and the third brush preparing operation such that the period for the substrate lowering operation and the period for the third brush preparing operation at least partially overlap with each other. Thus, as compared to a case in which the substrate lowering operation and the third brush preparing operation are respectively performed such that the period for the substrate lowering operation and the period for the third brush preparing operation do not overlap with each other, the period required for processing for one substrate W is shortened by the overlap period. Thus, the throughput of the substrate processing is improved.

The substrate lowering operation and the third brush preparing operation are preferably performed so as to start or end at the same time. In this case, an overlap period corresponding to at least one of the periods for the two operations can be ensured.

(f) Further, in the present embodiment, at least part of the period for the substrate lowering operation, at least part of the period for the cup lifting operation, at least part of the period for the second brush preparing operation, at least part of the period for the first nozzle preparing operation and the period for the third brush preparing operation overlap with one another. In this manner, in a case in which a large number of operations are performed in parallel, the throughput of the substrate processing is further improved.

The substrate lowering operation, the cup lifting operation, the second brush preparing operation, the first nozzle preparing operation and the third brush preparing operation are preferably performed so as to start or end at the same time. In this case, the throughput of the substrate processing can be further improved.

5. Other Embodiments (a) In the above-mentioned embodiment, at least part of the period for the substrate lowering operation, at least part of the period for the cup lifting operation, at least part of the period for the second brush preparing operation, at least part of the period for the first nozzle preparing operation and at least part of the period for the third brush preparing operation overlap with one another. However, the present disclosure is not limited to this.

In a case in which the period for the substrate lowering operation and the period for the cup lifting operation at least partially overlap with each other, the period for the second brush preparing operation, the period for the first nozzle preparing operation or the period for the third brush preparing operation does not have to overlap with the period for the substrate lowering operation. Also in this case, the period for the substrate lowering operation and the period for the cup lifting operation at least partially overlap with each other, so that the throughput of the substrate processing is improved as described above.

In a case in which the period for the substrate lowering operation and the period for the second brush preparing operation at least partially overlap with each other, the period for the cup lifting operation, the period for the first nozzle preparing operation or the period for the third brush preparing operation does not have to overlap with the period for the substrate lowering operation. Also in this case, the period for the substrate lowering operation and the period for the second brush preparing operation at least partially overlap with each other, so that the throughput of the substrate processing is improved as described above.

In a case in which the period for the substrate lowering operation and the period for the first nozzle preparing operation at least partially overlap with each other, the period for the cup lifting operation, the period for the second brush preparing operation or the period for the third brush preparing operation does not have to overlap with the period for the substrate lowering operation. Also in this case, the period for the substrate lowering operation and the period for the first nozzle preparing operation at least partially overlap with each other, so that the throughput of the substrate processing is improved as described above.

In a case in which the period for the substrate lowering operation and the period for the third brush preparing operation at least partially overlap with each other, the period for the cup lifting operation, the period for the second brush preparing operation or the period for the first nozzle preparing operation does not have to overlap with the period for the substrate lowering operation. Also in this case, the period for the substrate lowering operation and the period for the third brush preparing operation at least partially overlap with each other, so that the throughput of the substrate processing is improved as described above.

(b) The substrate cleaning device 1 according to the above-mentioned embodiment may have a back rinse nozzle that supplies a rinse liquid to the lower-surface outer region of the substrate W held by suction by the lower holding device 20. Further, the substrate cleaning device 1 may further have a rinse nozzle that supplies a rinse liquid to the upper surface of the substrate W held by suction by the lower holding device 20.

Figure 21:
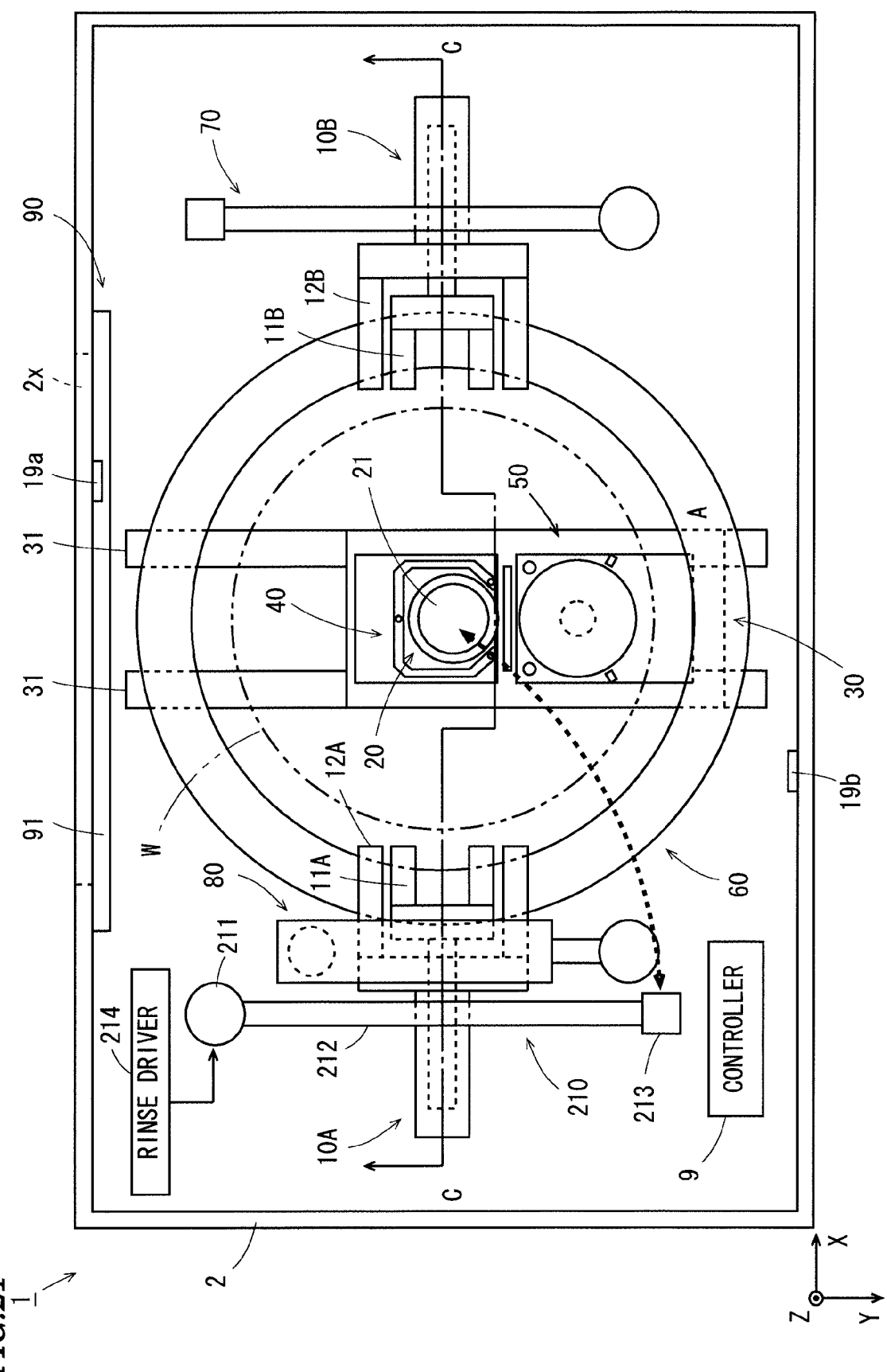
FIG. 21 is a schematic plan view of the substrate cleaning device according to another embodiment.
Figure 22:
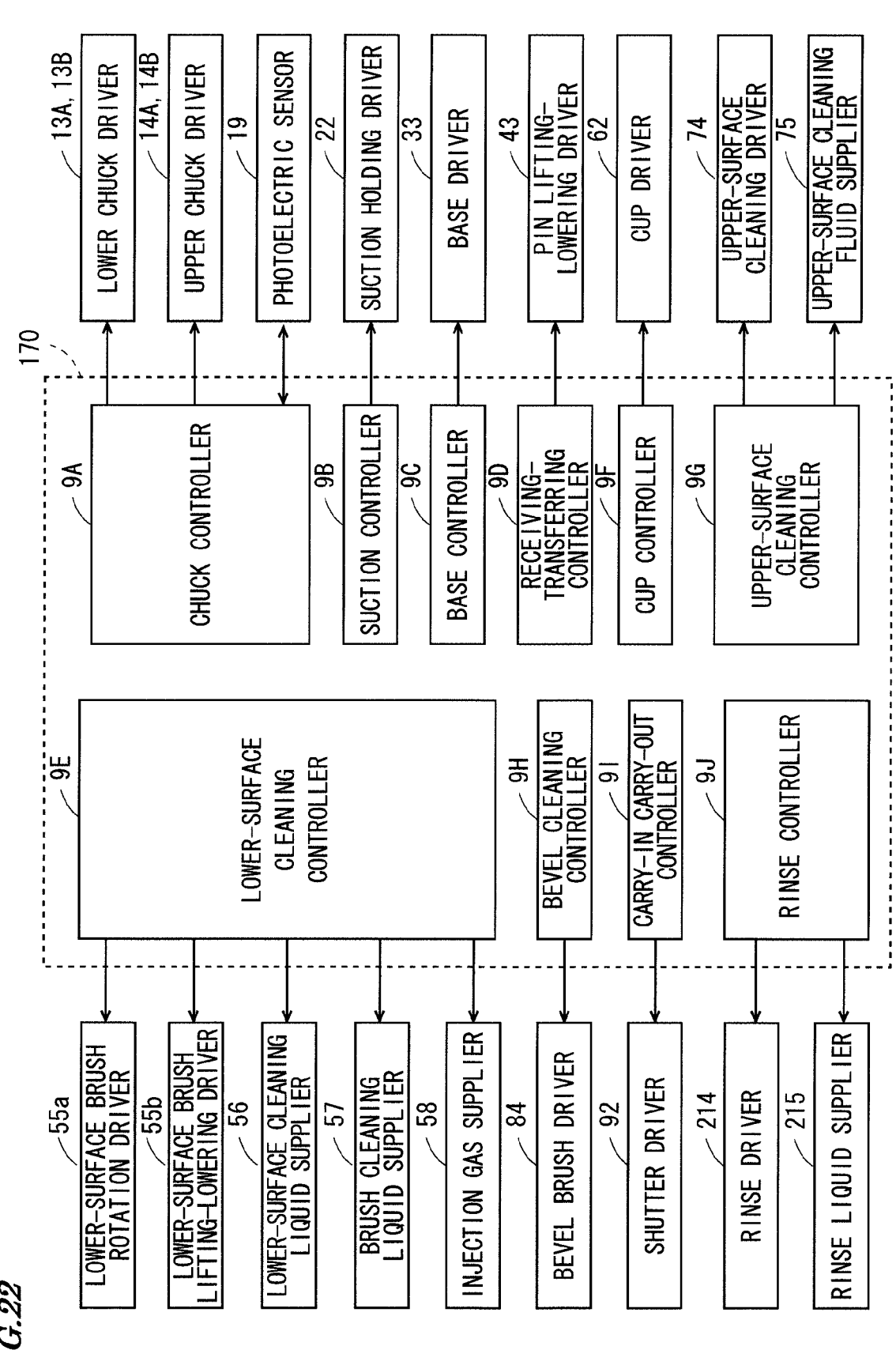
FIG. 22 is a block diagram showing the configuration of a control system of the substrate cleaning device of FIG. 21.

FIG. 21 is a schematic plan view of a substrate cleaning device 1 according to another embodiment. FIG. 22 is a block diagram showing the configuration of a control system of the substrate cleaning device 1 of FIG. 21. The schematic plan view of FIG. 21 corresponds to the schematic plan view of FIG. 1. The block diagram of FIG. 22 corresponds to the block diagram of FIG. 5. In regard to the substrate cleaning device 1 of FIG. 21, differences from the substrate cleaning device 1 according to the above-mentioned embodiment will be described.

As shown in FIG. 21, the substrate cleaning device 1 of the present example includes an upper-surface rinse device 210 in addition to the upper holding devices 10A, 10B, the lower holding device 20, the base device 30, the receiving-transferring device 40, the lower-surface cleaning device 50, the cup device 60, the upper-surface cleaning device 70, the end-portion cleaning device 80 and the opening-closing device 90.

The upper-surface rinse device 210 is provided so as to be adjacent to the end-portion cleaning device 80 at a position near the side of the cup 61 in the X direction. The upper-surface rinse device 210 includes a rotation support shaft 211, an arm 212, a rinse nozzle 213 and a rinse driver 214.

The rotation support shaft 211 is supported on the bottom surface portion 2a by the rinse driver 214 to extend in the up-and-down direction, and to be liftable, lowerable and rotatable. At a position farther upward than the upper holding device 10A, the arm 212 is provided to extend in the horizontal direction from the upper end portion of the rotation support shaft 211. The rinse nozzle 213 is attached to a top portion of the arm 212.

A rinse liquid supplier 215 (FIG. 22) is connected to the rinse nozzle 213. The rinse liquid supplier 215 supplies a rinse liquid to the rinse nozzle 213. In the present example, pure water is used as a cleaning liquid supplied to the rinse nozzle 213. During or after cleaning of the upper surface of the substrate W by the spray nozzle 73, and before drying of the substrate W, the rinse nozzle 213 discharges the cleaning liquid supplied from the rinse liquid supplier 215 to the upper surface of the substrate W.

The rinse driver 214 includes one or a plurality of pulse motors, an air cylinder and the like, lifts and lowers the rotation support shaft 211, and rotates the rotation support shaft 211. With the above-mentioned configuration, as indicated by the thick dotted arrow in FIG. 21, on the upper surface of the substrate W held by suction and rotated by the suction holder 21, the rinse nozzle 213 is moved in a circular arc shape. Thus, the rinse liquid can be supplied to the entire upper surface of the substrate W.

Further, as described above, in a case in which the substrate cleaning device 1 further has the back rinse nozzle, the rinse liquid can also be supplied to the lower surface of the substrate W held by suction and rotated by the suction holder 21. In this manner, with the substrate cleaning device 1 of FIG. 21, the rinse processing can be performed on the upper surface and the lower surface of the substrate W after cleaning or during cleaning.

As shown in FIG. 22, the control device 170 of the present example includes, as a function, a rinse controller 9J in addition to the various controllers shown in FIG. 5. Similarly to the other controllers, the function of the rinse controller 9J is implemented by execution of the substrate cleaning program stored in the storage device by the CPU on the RAM. Part or all of the rinse controller 9J may be implemented by hardware such as an electronic circuit. The rinse controller 9J controls the rinse driver 214 and the rinse liquid supplier 215 in order to perform the rinse processing on the upper surface of the substrate W held by suction by the suction holder 21.

In the substrate cleaning device 1 of FIG. 21, a series of processes shown in FIGS. 6 to 20 are performed on one substrate W basically in the same manner as in the substrate cleaning device 1 according to the above-mentioned embodiment. Here, during the above-mentioned series of processes, the rinse controller 9J of FIG. 22 may control the rinse driver 214 and the rinse liquid supplier 215 as described below.

Figure 23:
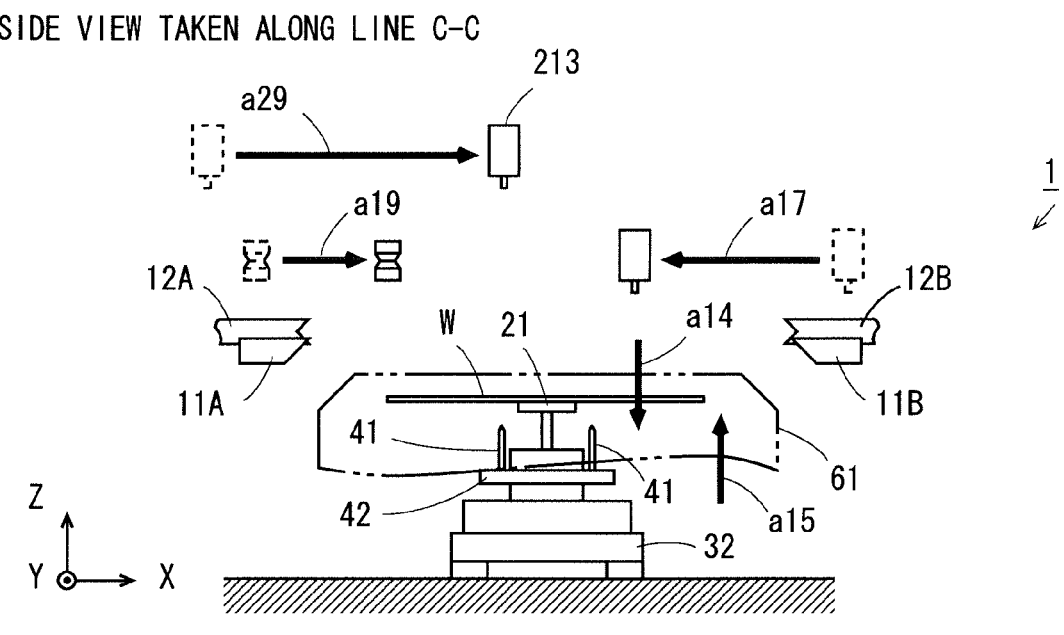
FIG. 23 is a side view for explaining one control example of a rinse driver and a rinse liquid supplier by the rinse controller of FIG. 22.

FIG. 23 is a side view for explaining one example of control of the rinse driver 214 and the rinse liquid supplier 215 by the rinse controller 9J of FIG. 22. The side view of FIG. 23 is a side view of the lower holding device 20 and its peripheral portions when the substrate cleaning device 1 of FIG. 21 is viewed in the Y direction, and corresponds to the side view taken along the line C-C of FIG. 21. Further, the timing for the operation state of the substrate cleaning device 1 shown in the side view of FIG. 23 corresponds to the timing for the operation state of FIG. 15 of the substrate cleaning device 1 according to the above-mentioned embodiment.

As shown in FIG. 23, in the present example, a second nozzle preparing operation is performed so as to at least partially overlap with the period for the substrate lowering operation of the receiving-transferring device 40. The second nozzle preparing operation is an operation of moving the rinse nozzle 213 from a rinse nozzle waiting position near the side of the cup 61 to a rinse nozzle processing position above the substrate W.

At a point in time at which the second nozzle preparing operation is started, the rinse nozzle 213 is held at a height position farther upward than the upper holding devices 10A, 10B and the cup 61. When the second nozzle preparing operation is started, the rotation support shaft 211 of the upper-surface rinse device 210 is rotated. Thus, as indicated by the thick solid arrow a29 in FIG. 23, the rinse nozzle 213 is moved to a position above the substrate W from the rinse nozzle waiting position. Subsequently, the rotation support shaft 211 is lowered by a predetermined distance. Thus, the tip portion of the rinse nozzle 213 is lowered to a height position that is about several centimeters above the upper surface of the substrate W, and the rinse nozzle 213 reaches the rinse nozzle processing position. Thereafter, the rinse liquid is supplied to the upper surface of the substrate W from the rinse nozzle 213 located at the rinse nozzle processing position.

In the present example, the receiving-transferring controller 9D and the rinse controller 9J of FIG. 22 respectively start the substrate lowering operation and the second nozzle preparing operation such that the period for the substrate lowering operation and the period for the second nozzle preparing operation at least partially overlap with each other. Thus, as compared to a case in which the substrate lowering operation and the first nozzle preparing operation are respectively performed such that the period for the substrate lowering operation and the period for the first nozzle preparing operation do not overlap with each other, the period required for processing for one substrate W is shortened by the overlap period. Thus, the throughput of the substrate processing is improved. In the substrate cleaning device 1 of FIG. 21, the lower-surface cleaning device 50 does not have to be provided, the upper-surface cleaning device 70 does not have to be provided, and the end-portion cleaning device does not have to be provided.

Also in the present example, the cup lifting operation (the arrow a15 in FIG. 23), the second brush preparing operation, the first nozzle preparing operation (the arrow a17 in FIG. 23) and the third brush preparing operation (the arrow a19 in FIG. 23) are performed so as to at least partially overlap with the period for the substrate lowering operation of the receiving-transferring device 40. However, these operations (the cup lifting operation, the second brush preparing operation, the first nozzle preparing operation and the third brush preparing operation) may be performed so as not to overlap with the period for the substrate lowering operation of the receiving-transferring device 40.

(c) While the predetermined region (initial contact region) of the lower surface of the substrate W to be initially brought into contact with the lower-surface brush 51 is set to the lower-surface center region of the substrate W with respect to the substrate W held by the upper holding devices 10A, 10B in the above-mentioned embodiment, the present disclosure is not limited to this. The initial contact region may be set to a position deviated from the lower-surface center region by a predetermined distance in the Y direction. In this case, when the lower-surface center region of the substrate W is cleaned, after the lower-surface brush 51 comes into contact with the initial contact region, the mobile base 32 operates such that the lower-surface brush 51 is moved from the initial contact region to the lower-surface center region on the lower surface.

(d) While the upper holding devices 10A, 10B are configured to hold the outer peripheral end of the substrate W in the substrate cleaning device 1 according to the above-mentioned embodiment, the present disclosure is not limited to this. For example, each of the upper holding devices 10A, 10B may include a plurality of suction pads instead of the above-mentioned lower chucks 11A, 11B and upper chucks 12A, 12B, and may be configured to be capable of holding part of the lower surface of the substrate W by suction. In this case, the upper holding devices 10A, 10B hold the lower-surface outer region of the substrate W by suction as a peripheral portion of the substrate W. Thus, with the substrate W held by suction by the upper holding devices 10A, 10B, the lower-surface center region of the substrate W can be cleaned.

(e) While the receiving-transferring device 40 performs the up-and-down moving operation for the plurality of support pins 41 for transfer of the substrate W from the upper holding devices 10A, 10B to the lower holding device 20 in the substrate cleaning device 1 according to the above-mentioned embodiment, the present disclosure is not limited to this.

The substrate cleaning device 1 may be provided with a lifting-lowering driver that lifts and lowers the lower holding device 20 relative to the upper holding devices 10A, 10B. Alternatively, the substrate cleaning device 1 may be provided with a lifting-lowering driver that lifts and lowers the upper holding devices 10A, 10B relative to the lower holding device 20. In these cases, when at least one of the lower holding device 20 and the upper holding devices 10A, 10B performs a lifting-lowering operation relative to the other one of the lower holding device 20 and the upper holding devices 10A, 10B, it is possible to receive and transfer the substrate W between the two holding devices without using the plurality of support pins 41. In this case, the receiving-transferring device 40 is not required, and the lifting-lowering driver of the lower holding device 20 or the lifting-lowering driver of the upper holding devices 10A, 10B functions as a constituent element that performs the substrate lowering operation.

(f) While the horizontal moving operation for the mobile base 32 is performed by the base device 30 for transfer of the substrate W from the upper holding devices 10A, 10B to the lower holding device 20 in the substrate cleaning device 1 according to the above-mentioned embodiment, the present disclosure is not limited to this.

A movement driver that moves the upper holding devices 10A, 10B relative to the lower holding device 20 in the Y direction may be provided in the substrate cleaning device 1. In this case, when the upper holding devices 10A, 10B are moved in the Y direction relative to the lower holding device 20, it is possible to receive and transfer the substrate W between two holding devices without moving the lower holding device 20 in a horizontal direction.

(g) As shown in the above-mentioned embodiment, in a case in which the cleaning liquid for cleaning a substrate and the cleaning liquid for cleaning a brush are the same, the two substrate nozzles 52 do not have to be provided. In this case, during cleaning of the lower-surface center region of the substrate W and during cleaning of the lower-surface outer region of the substrate W, the cleaning liquid discharged from the brush nozzles 52*a*, 52*b* to the lower-surface brush 51 can be used as the cleaning liquid for cleaning the substrate.

(h) While the cleaning liquid is supplied from the two substrate nozzles 52 to the substrate W during cleaning of the lower-surface center region of the substrate W by the lower-surface brush 51 in the substrate cleaning device 1 according to the above-mentioned embodiment, the present disclosure is not limited to this.

In the substrate cleaning device 1, before the lower surface of the substrate W is cleaned by the lower-surface brush 51, the lower-surface brush 51 may be cleaned in advance to be impregnated with the cleaning liquid. In this case, by bringing the lower-surface brush 51 impregnated with the cleaning liquid into contact with the lower surface of the substrate W, it is possible to clean the lower surface of the substrate W without supply of a new cleaning liquid, with the lower-surface brush 51 being in contact with the substrate W.

(i) The substrate cleaning device 1 according to the above-mentioned embodiment may have at least one device out of the lower-surface cleaning device 50, the upper-surface cleaning device 70 and the end-portion cleaning device 80, and a device other than the at least one device does not have to be provided. Further, the substrate cleaning device 1 according to the above-mentioned embodiment may have a constituent element that performs processing other than the cleaning processing on the substrate W held by the upper holding devices 10A, 10B.

6. Correspondences Between Constituent Elements in Claims and Parts in Preferred Embodiments In the following paragraphs, non-limiting examples of correspondences between various elements recited in the claims below and those described above with respect to various preferred embodiments of the present disclosure are explained. As each of various elements recited in the claims, various other elements having configurations or functions described in the claims can be also used.

In the above-mentioned embodiment, the substrate cleaning device 1 is an example of a substrate cleaning device, the height position of the substrate W held by the upper holding devices 10A, 10B is an example of a first height position, the upper holding devices 10A, 10B are examples of a first substrate holder, the height position of the substrate W held by the lower holding device 20 is an example of a second height position, and the lower holding device 20 is an example of a second substrate holder.

Further, the cleaning processing for the lower-surface center region of the substrate W performed by the lower-surface brush 51 is an example of first processing, the cleaning processing for the upper surface of the substrate W, the cleaning processing for the outer peripheral end of the substrate W, the cleaning processing for the lower-surface outer region of the substrate W and the rinse processing for the substrate W are examples of second processing, and the lower-surface cleaning device 50, the upper-surface cleaning device 70, the end-portion cleaning device 80 and the upper-surface rinse device 210 are examples of a processor.

Further, the receiving-transferring device 40 is an example of a substrate mover, the control device 170 is an example of a controller, the cup 61 is an example of a processing cup, the cup driver 62 is an example of a cup driver, the lower-surface brush 51 is an example of a lower-surface brush, the lifting-lowering supporter 54 and the lower-surface brush lifting-lowering driver 55*b* are examples of a lower-surface brush mover.

Further, the cleaning liquid and the rinse liquid are examples of a processing liquid, the spray nozzle 73 and the rinse nozzle 213 are examples of a fluid nozzle, the rotation support shaft 71, the arm 72, the upper-surface cleaning driver 74, the rotation support shaft 211, the arm 212 and the rinse driver 214 are examples of a nozzle mover, the bevel brush 83 is an example of an end-portion brush, and the rotation support shaft 81, the arm 82 and the bevel brush driver 84 are examples of an end-portion brush mover.

7. Overview of Embodiments (Item 1) A substrate processing device according to item 1 includes a first substrate holder configured to hold a substrate at a first height position, a second substrate holder configured to hold the substrate at a second height position lower than the first height position, a processor configured to perform first processing on the substrate held by the first substrate holder and performing second processing on the substrate held by the second substrate holder, a substrate mover that performs a substrate lowering operation of lowering the substrate from the first height position to the second height position for transfer of the substrate from the first substrate holder to the second substrate holder, and a controller, wherein the second processing includes processing with use of a processing liquid, the processor includes a processing cup formed to surround the second substrate holder in plan view and provided to be liftable and lowerable between an upper cup position corresponding to the second height position and a lower cup position lower than the upper cup position, and a cup driver that lifts and lowers the processing cup, and the controller, by controlling the substrate mover and the cup driver, causes the substrate lowering operation performed by the substrate mover and a cup lifting operation of lifting the processing cup from the lower cup position toward the upper cup position to be performed such that a period for the substrate lowering operation and a period for the cup lifting operation at least partially overlap with each other.

In the substrate processing device, the substrate is held at the first height position by the first substrate holder, and the first processing is performed. Next, the substrate is transferred from the first substrate holder to the second substrate holder. At this time, the substrate is lowered from the first height position to the second height position by the substrate lowering operation. The substrate is held at the second height position by the second substrate holder, and the second processing is performed.

In the second processing, the processing liquid is used. As such, the processing cup is arranged at the upper cup position. The processing liquid used in the second processing is received by the processing cup at the upper cup position. In a case in which not receiving the processing liquid, the processing cup retreats to the lower cup position so as to prevent interference with another member. Therefore, when the second processing is started, it is necessary to lift the processing cup from the lower cup position to the upper cup position. With the above-mentioned substrate processing device, the period for the substrate lowering operation and the period for the cup lifting operation at least partially overlap with each other. The period during which these periods overlap with each other is referred to as an overlap period.

Thus, as compared to a case in which the cup lifting operation is started after the substrate is lowered to the second height position by the substrate lowering operation, the period required for processing for one substrate is shortened by the overlap period. Further, as compared to a case in which the substrate lowering operation is started after the cup lifting operation, the period required for processing for one substrate is shortened by the overlap period. Therefore, the throughput of the substrate processing is improved.

(Item 2) A substrate processing device according to item 2 includes a first substrate holder configured to hold a substrate at a first height position, a second substrate holder configured to hold the substrate at a second height position lower than the first height position, a processor configured to perform first processing on the substrate held by the first substrate holder and performing second processing on the substrate held by the second substrate holder, a substrate mover that performs a substrate lowering operation of lowering the substrate from the first height position to the second height position for transfer of the substrate from the first substrate holder to the second substrate holder, and a controller, wherein the processor includes a lower-surface brush that cleans a lower surface of the substrate by coming into contact with the lower surface, and a lower-surface brush mover configured to move the lower-surface brush between a lower-surface brush processing position at which the lower-surface brush comes into contact with the lower surface of the substrate held by the second substrate holder and a lower-surface brush waiting position spaced apart from the lower-surface brush processing position, the second processing includes cleaning processing for the lower surface of the substrate by the lower-surface brush, and the controller, by controlling the substrate mover and the lower-surface brush mover, causes the substrate lowering operation performed by the substrate mover and a lower-surface brush preparing operation of moving the lower-surface brush from the lower-surface brush waiting position to the lower-surface brush processing position to be performed such that a period for the substrate lowering operation and a period for the lower-surface brush preparing operation at least partially overlap with each other.

In the substrate processing device, the substrate is held at the first height position by the first substrate holder, and the first processing is performed. Next, the substrate is transferred from the first substrate holder to the second substrate holder. At this time, the substrate is lowered from the first height position to the second height position by the substrate lowering operation. The substrate is held at the second height position by the second substrate holder, and the second processing is performed.

The second processing includes processing for cleaning processing for the lower surface of the substrate by the lower-surface brush. In a period during which the lower surface of the substrate is not cleaned, the lower-surface brush is held at the lower-surface brush waiting position. Therefore, when the second processing is started, it is necessary to move the lower-surface brush from the lower-surface brush waiting position to the lower-surface brush processing position. With the above-mentioned substrate processing device, the period for the substrate lowering operation and the period for the lower-surface brush preparing operation at least partially overlap with each other. The period during which these periods overlap with each other is referred to as an overlap period.

Thus, as compared to a case in which the lower-surface brush preparing operation is started after the substrate is lowered to the second height position by the substrate lowering operation, the period required for processing for one substrate is shortened by the overlap period. Therefore, the throughput of the substrate processing is improved.

(Item 3) A substrate processing device according to item 2, includes a first substrate holder configured to hold a substrate at a first height position, second substrate holder configured to hold the substrate at a second height position lower than the first height position, a processor configured to perform first processing on the substrate held by the first substrate holder and performing second processing on the substrate held by the second substrate holder, a substrate mover that performs a substrate lowering operation of lowering the substrate from the first height position to the second height position for transfer of the substrate from the first substrate holder to the second substrate holder, and a controller, wherein the processor includes a fluid nozzle that discharges fluid including a processing liquid to an upper surface of the substrate, and a nozzle mover configured to move the fluid nozzle between a nozzle processing position above the substrate held by the second substrate holder and a nozzle waiting position sidewardly spaced apart from the substrate held by the second substrate holder, the second processing includes cleaning processing for the upper surface of the substrate performed by the fluid nozzle, and the controller, by controlling the substrate mover and the nozzle mover, causes the substrate lowering operation performed by the substrate mover and a nozzle preparing operation of moving the fluid nozzle from the nozzle waiting position to the nozzle processing position to be performed such that a period for the substrate lowering operation and a period for the nozzle preparing operation at least partially overlap with each other.

In the substrate processing device, the substrate is held at the first height position by the first substrate holder, and the first processing is performed. Next, the substrate is transferred from the first substrate holder to the second substrate holder. At this time, the substrate is lowered from the first height position to the second height position by the substrate lowering operation. The substrate is held at the second height position by the second substrate holder, and the second processing is performed.

The second processing includes cleaning processing for the upper surface of the substrate by the fluid nozzle. In a period during which the upper surface of the substrate is not cleaned, the fluid nozzle is held at the nozzle waiting position. Therefore, when the second processing is started, it is necessary to move the fluid nozzle from the nozzle waiting position to the nozzle processing position. With the above-mentioned substrate processing device, the period for the substrate lowering operation and the period for the nozzle preparing operation at least partially overlap with each other. The period during which these periods overlap with each other is referred to as an overlap period.

Thus, as compared to a case in which the nozzle preparing operation is started after the substrate is lowered to the second height position by the substrate lowering operation, a period required for processing for one substrate is shortened by the overlap period. Therefore, the throughput of the substrate processing is improved.

(Item 4) A substrate processing device according to item 4, includes a first substrate holder configured to hold a substrate at a first height position, a second substrate holder configured to hold the substrate at a second height position lower than the first height position, a processor configured to perform first processing on the substrate held by the first substrate holder and performing second processing on the substrate held by the second substrate holder, a substrate mover that performs a substrate lowering operation of lowering the substrate from the first height position to the second height position for transfer of the substrate from the first substrate holder to the second substrate holder, and a controller, wherein the processor includes an end-portion brush that cleans an outer peripheral end of the substrate by coming into contact with the outer peripheral end, and an end-portion brush mover configured to move the end-portion brush between an end-portion brush processing position at which the end-portion brush comes into contact with the outer peripheral end of the substrate held by the second substrate holder and an end-portion brush waiting position sidewardly spaced apart from the substrate held by the second substrate holder, the second processing includes cleaning processing for the outer peripheral end of the substrate performed by the end-portion brush, and the controller, by controlling the substrate mover and the end-portion brush mover, causes the substrate lowering operation performed by the substrate mover and an end-portion brush preparing operation of moving the end-portion brush from the end-portion brush waiting position to the end-portion brush processing position to be performed such that a period for the substrate lowering operation and a period for the brush preparing operation at least partially overlap with each other.

In the substrate processing device, the substrate is held at the first height position by the first substrate holder, and the first processing is performed. Next, the substrate is transferred from the first substrate holder to the second substrate holder. At this time, the substrate is lowered from the first height position to the second height position by the substrate lowering operation. The substrate is held at the second height position by the second substrate holder, and the second processing is performed.

The second processing includes cleaning processing for the outer peripheral end of the substrate by the end-portion brush. In a period during which the outer peripheral end of the substrate is not cleaned, the end-portion brush is held at the end-portion brush waiting position. Therefore, when the second processing is started, it is necessary to move the end-portion brush from the end-portion brush waiting position to the end-portion brush processing position. With the above-mentioned substrate processing device, the period for the substrate lowering operation and the period for the end-portion brush preparing operation at least partially overlap with each other. The period during which these periods overlap with each other is referred to as an overlap period.

Thus, as compared to a case in which the end-portion brush preparing operation is started after the substrate is lowered to the second height position by the substrate lowering operation, the period required for processing for one substrate is shortened by the overlap period. Therefore, the throughput of the substrate processing is improved.

(Item 5) The substrate processing device according to item 1, wherein the processor may include a lower-surface brush that cleans a lower surface of the substrate by coming into contact with the lower surface, and a lower-surface brush mover configured to move the lower-surface brush between a lower-surface brush processing position at which the lower-surface brush comes into contact with the lower-surface of the substrate held by the second substrate holder and a lower-surface brush waiting position spaced apart from the lower-surface brush processing position, a fluid nozzle that discharges fluid including a processing liquid to an upper surface of the substrate, a nozzle mover configured to move the fluid nozzle between a nozzle processing position above the substrate held by the second substrate holder and a nozzle waiting position spaced apart from the substrate held by the second substrate holder, an end-portion brush that cleans an outer peripheral end of the substrate by coming into contact with the outer peripheral end, and an end-portion brush mover configured to move the end-portion brush between an end-portion brush processing position at which the end-portion brush comes into contact with the outer peripheral end of the substrate held by the second substrate holder and an end-portion brush waiting position spaced apart from the substrate held by the second substrate holder, the second processing may include cleaning processing for the lower surface of the substrate performed by the lower-surface brush, cleaning processing for the upper surface of the substrate performed by the fluid nozzle and cleaning processing for the outer peripheral end of the substrate performed by the end-portion brush as processing with use of the processing liquid, and the controller, by controlling the lower-surface brush mover, the nozzle mover and the end-portion brush mover in addition to the substrate mover and the cup mover, may cause the substrate lowering operation, the cup lifting operation, a lower-surface brush preparing operation of moving the lower-surface brush from the lower-surface brush waiting position to the lower-surface brush processing position, a nozzle preparing operation of moving the fluid nozzle from the nozzle waiting position to the nozzle processing position and an end-portion brush preparing operation of moving the end-portion brush from the end-portion brush waiting position to the end-portion brush processing position to be performed such that three or more than three periods out of at least part of a period for the substrate lowering operation, at least part of a period for the cup lifting operation, at least part of a period for the lower-surface brush preparing operation, at least part of a period for the nozzle preparing operation and at least part of a period for the end-portion brush preparing operation overlap with one another.

In this case, the second processing includes the cleaning processing for the lower surface of the substrate by the lower-surface brush, the cleaning processing for the upper surface of the substrate by the fluid nozzle and the cleaning processing for the outer peripheral end of the substrate by the end-portion brush.

In a period during which the lower surface of the substrate is not cleaned, the lower-surface brush is held at the lower-surface brush waiting position. Therefore, when the second processing is started, it is necessary to move the lower-surface brush from the lower-surface brush waiting position to the lower-surface brush processing position.

In a period during which the upper surface of the substrate is not cleaned, the fluid nozzle is held at the nozzle waiting position. Therefore, when the second processing is started, it is necessary to move the fluid nozzle from the nozzle waiting position to the nozzle processing position.

In a period during which the outer peripheral end of the substrate is not cleaned, the end-portion brush is held at the end-portion brush waiting position. Therefore, when the second processing is started, it is necessary to move the end-portion brush from the end-portion brush waiting position to the end-portion brush processing position.

With the above-mentioned substrate processing device, three or more than three periods out of at least part of the period for the substrate lowering operation, at least part of the period for the cup lifting operation, at least part of the period for the lower-surface brush preparing operation, at least part of the period for the nozzle preparing operation and at least part of the end-portion brush preparing operation overlap with one another. The period during which these three periods overlap with one another is referred to as an overlap period.

Thus, as compared to a case in which the substrate lowering operation, the cup lifting operation, the lower-surface brush preparing operation, the nozzle preparing operation and the end-portion brush preparing operation are performed such that three or more than three periods out of the periods for these operations do not overlap with one another, the period required for processing for one substrate is shortened by the overlap period. Therefore, the throughput of the substrate processing is improved.

(Item 6) A substrate processing method according to item 6, includes performing first processing on a substrate held by a first substrate holder at a first height position, performing second processing with use of a processing liquid on the substrate held by a second substrate holder at a second height position lower than the first height position, performing a substrate lowering operation of lowering the substrate from the first height position to the second height position for transfer of the substrate from the first substrate holder to the second substrate holder after the first processing and before the second processing, receiving the processing liquid used in the second processing by arranging a processing cup, that is formed to surround the second substrate holder in plan view and provided to be liftable and lowerable, at an upper cup position corresponding to the second height position, and lifting and lowering the processing cup between the upper cup position and a lower cup position lower than the upper cup position, wherein before the first processing and after the second processing, the performing a substrate lowering operation and the lifting and lowering the processing cup are started such that a period for the substrate lowering operation and a period for a cup lifting operation of lifting the processing cup from the lower cup position to the upper cup position at least partially overlap with each other.

In the substrate processing method, the substrate is held at the first height position by the first substrate holder, and the first processing is performed. Next, the substrate is transferred from the first substrate holder to the second substrate holder. At this time, the substrate is lowered from the first height position to the second height position by the substrate lowering operation. The substrate is held at the second height position by the second substrate holder, and the second processing is performed.

In the second processing, the processing liquid is used. As such, the processing cup is arranged at the upper cup position. The processing liquid used in the second processing is received by the processing cup at the upper cup position. In a case in which not receiving the processing liquid, the processing cup retreats to the lower cup position so as to prevent interference with another member. Therefore, when the second processing is started, it is necessary to lift the processing cup from the lower cup position to the upper cup position. With the above-mentioned substrate processing method, the period for the substrate lowering operation and the period for the cup lifting operation at least partially overlap with each other. The period during which these periods overlap with each other is referred to as an overlap period.

Thus, as compared to a case in which the cup lifting operation is started after the substrate is lowered to the second height position by the substrate lowering operation, the period required for processing for one substrate is shortened by the overlap period. Further, as compared to a case in which the substrate lowering operation is started after the cup lifting operation, the period required for processing for one substrate is shortened by the overlap period. Therefore, the throughput of the substrate processing is improved.

(Item 7) A substrate processing method according to item 7, includes performing first processing on a substrate held by a first substrate holder at a first height position, performing second processing including bringing a lower-surface brush into contact with a lower surface of the substrate held by the second substrate holder at a second height position lower than the first height position to clean the lower surface of the substrate, performing a substrate lowering operation of lowering the substrate from the first height position to the second height position for transfer of the substrate from the first substrate holder to the second substrate holder after the first processing and before the second processing, and moving the lower-surface brush between a lower-surface brush processing position at which the lower-surface brush comes into contact with the lower surface of the substrate held by the second substrate holder and a lower-surface brush waiting position spaced apart from the lower-surface brush processing position, wherein after the first processing and before the second processing, the performing a substrate lowering operation and the moving the lower-surface brush are started such that a period for the substrate lowering operation and a period for a lower-surface brush preparing operation of moving the lower-surface brush from the lower-surface brush waiting position to the lower-surface brush processing position at least partially overlap with each other.

In the substrate processing method, the substrate is held at the first height position by the first substrate holder, and the first processing is performed. Next, the substrate is transferred from the first substrate holder to the second substrate holder. At this time, the substrate is lowered from the first height position to the second height position by the substrate lowering operation. The substrate is held at the second height position by the second substrate holder, and the second processing is performed.

The second processing includes processing for cleaning processing for the lower surface of the substrate by the lower-surface brush. In a period during which the lower surface of the substrate is not cleaned, the lower-surface brush is held at the lower-surface brush waiting position. Therefore, when the second processing is started, it is necessary to move the lower-surface brush from the lower-surface brush waiting position to the lower-surface brush processing position. With the above-mentioned substrate processing method, the period for the substrate lowering operation and the period for the lower-surface brush preparing operation at least partially overlap with each other. The period during which these periods overlap with each other is referred to as an overlap period.

Thus, as compared to a case in which the lower-surface brush preparing operation is started after the substrate is lowered to the second height position by the substrate lowering operation, the period required for processing for one substrate is shortened by the overlap period. Therefore, the throughput of the substrate processing is improved.

(Item 8) A substrate processing method according to item 8, includes performing first processing on a substrate held by a first substrate holder at a first height position, performing second processing that includes discharging fluid including a processing liquid from a fluid nozzle to an upper surface of the substrate held by a second substrate holder at a second height position lower than the first height position and cleaning the upper surface of the substrate, performing a substrate lowering operation of lowering the substrate from the first height position to the second height position for transfer of the substrate from the first substrate holder to the second substrate holder after the first processing and before the second processing, and moving the fluid nozzle between a nozzle processing position above the substrate held by the second substrate holder and a nozzle waiting position sidewardly spaced apart from the substrate held by the second substrate holder, wherein after the first processing and before the second processing, the performing a substrate lowering operation and the moving the fluid nozzle are started such that a period for the substrate lowering operation and a period for a nozzle preparing operation of moving the fluid nozzle from the nozzle waiting position to the nozzle processing position at least partially overlap with each other.

In the substrate processing method, the substrate is held at the first height position by the first substrate holder, and the first processing is performed. Next, the substrate is transferred from the first substrate holder to the second substrate holder. At this time, the substrate is lowered from the first height position to the second height position by the substrate lowering operation. The substrate is held at the second height position by the second substrate holder, and the second processing is performed.

The second processing includes cleaning processing for the upper surface of the substrate by the fluid nozzle. In a period during which the upper surface of the substrate is not cleaned, the fluid nozzle is held at the nozzle waiting position. Therefore, when the second processing is started, it is necessary to move the fluid nozzle from the nozzle waiting position to the nozzle processing position. With the above-mentioned substrate processing method, the period for the substrate lowering operation and the period for the nozzle preparing operation at least partially overlap with each other. The period during which these periods overlap with each other is referred to as an overlap period.

Thus, as compared to a case in which the nozzle preparing operation is started after the substrate is lowered to the second height position by the substrate lowering operation, the period required for processing for one substrate is shortened by the overlap period. Therefore, the throughput of the substrate processing is improved.

(Item 9) A substrate processing method according to item 9, includes performing first processing on a substrate held by a first substrate holder at a first height position, performing second processing that includes bringing an end-portion brush into contact with an outer peripheral end of the substrate held by a second substrate holder at a second height position lower than the first height position and cleaning the outer peripheral end of the substrate, performing a substrate lowering operation of lowering the substrate from the first height position to the second height position for transfer of the substrate from the first substrate holder to the second substrate holder after the first processing and before the second processing, and moving the end-portion brush between an end-portion brush processing position at which the end-portion brush comes into contact with the outer peripheral end of the substrate held by the second substrate holder and an end-portion brush waiting position sidewardly spaced apart from the substrate held by the second substrate holder, wherein after the first processing and before the second processing, the performing a substrate lowering operation and the moving an end-portion brush are started such that a period for the substrate lowering operation and a period for an end-portion brush preparing operation of moving the end-portion brush from the end-portion brush waiting position to the end-portion brush processing position at least partially overlap with each other.

In the substrate processing method, the substrate is held at the first height position by the first substrate holder, and the first processing is performed. Next, the substrate is transferred from the first substrate holder to the second substrate holder. At this time, the substrate is lowered from the first height position to the second height position by the substrate lowering operation. The substrate is held at the second height position by the second substrate holder, and the second processing is performed.

The second processing includes cleaning processing for the outer peripheral end of the substrate by the end-portion brush. In a period during which the outer peripheral end of the substrate is not cleaned, the end-portion brush is held at the end-portion brush waiting position. Therefore, when the second processing is started, it is necessary to move the end-portion brush from the end-portion brush waiting position to the end-portion brush processing position. With the above-mentioned substrate processing method, the period for the substrate lowering operation and the period for the end-portion brush preparing operation at least partially overlap with each other. The period during which these periods overlap with each other is referred to as an overlap period.

Thus, as compared to a case in which the end-portion brush preparing operation is started after the substrate is lowered to the second height position by the substrate lowering operation, the period required for processing for one substrate is shortened by the overlap period. Therefore, the throughput of the substrate processing is improved.

(Item 10) The substrate processing method according to item 6, wherein the second processing with use of a processing liquid may include bringing a lower-surface brush into contact with a lower surface of the substrate held by the second substrate holder at the second height position lower than the first height position and cleaning the lower surface of the substrate, discharging fluid including the processing liquid from a fluid nozzle to an upper surface of the substrate held by the second substrate holder at the second height position lower than the first height position and cleaning the upper surface of the substrate, and bringing an end-portion brush into contact with an outer peripheral end of the substrate held by the second substrate holder at the second height position lower than the first height position and cleaning the outer peripheral end of the substrate, the substrate processing method may further include moving the lower-surface brush between a lower-surface brush processing position at which the lower-surface brush comes into contact with the lower surface of the substrate held by the second substrate holder and a lower-surface brush waiting position spaced apart from the lower-surface brush processing position, moving the fluid nozzle between a nozzle processing position above the substrate held by the second substrate holder and a nozzle waiting position sidewardly spaced apart from the substrate held by the second substrate holder, and moving the end-portion brush between an end-portion brush processing position at which the end-portion brush comes into contact with the outer peripheral end of the substrate held by the second substrate holder and an end-portion brush waiting position sidewardly spaced apart from the substrate held by the second substrate holder, and after the first processing and before the second processing, the performing a substrate lowering operation, the receiving the processing liquid, the moving the lower-surface brush, the moving the fluid nozzle and the moving the end-portion brush may be started such that three or more than three periods out of at least part of a period for the substrate lowering operation, at least part of a period for the cup lifting operation, at least part of a period for a lower-surface brush preparing operation of moving the lower-surface brush from the lower-surface brush waiting position to the lower-surface brush processing position, at least part of a period for a nozzle preparing operation of moving the fluid nozzle from the nozzle waiting position to the nozzle processing position and at least part of a period for an end-portion brush preparing operation of moving the end-portion brush from the end-portion brush waiting position to the end-portion brush processing position overlap with one another.

In this case, the second processing includes the cleaning processing for the lower surface of the substrate by the lower-surface brush, the cleaning processing for the upper surface of the substrate by the fluid nozzle and the cleaning processing for the outer peripheral end of the substrate by the end-portion brush.

In a period during which the lower surface of the substrate is not cleaned, the lower-surface brush is held at the lower-surface brush waiting position. Therefore, when the second processing is started, it is necessary to move the lower-surface brush from the lower-surface brush waiting position to the lower-surface brush processing position.

In a period during which the upper surface of the substrate is not cleaned, the fluid nozzle is held at the nozzle waiting position. Therefore, when the second processing is started, it is necessary to move the fluid nozzle from the nozzle waiting position to the nozzle processing position.

In a period during which the outer peripheral end of the substrate is not cleaned, the end-portion brush is held at the end-portion brush waiting position. Therefore, when the second processing is started, it is necessary to move the end-portion brush from the end-portion brush waiting position to the end-portion brush processing position.

With the above-mentioned substrate processing method, three or more than three periods out of at least part of the period for the substrate lowering operation, at least part of the period for the cup lifting operation, at least part of the period for the lower-surface brush preparing operation, at least part of the period for the nozzle preparing operation and at least part of the period for the end-portion brush preparing operation overlap with one another. The period during which these three periods overlap with one another is referred to as an overlap period.

Thus, as compared to a case in which the substrate lowering operation, the cup lifting operation, the lower-surface brush preparing operation, the nozzle preparing operation and the end-portion brush preparing operation are performed such that three or more than three periods out of the periods for these operations do not overlap with one another, the period required for processing for one substrate is shortened by the overlap period. Therefore, the throughput of the substrate processing is improved.

With the substrate processing device and the substrate processing method according to the above-mentioned embodiment, the throughput of the substrate processing is improved, and the efficiency of the substrate processing is improved, so that the energy is saved for the substrate processing. Further, in a case in which a chemical liquid is used for the substrate processing, it is possible to reduce wasteful use of the chemical liquid due to the improvement of the throughput yield, thereby contributing to the reduction of contamination of the global environment.

While preferred embodiments of the present disclosure have been described above, it is to be understood that variations and modifications will be apparent to those skilled in the art without departing the scope and spirit of the present disclosure. The scope of the present disclosure, therefore, is to be determined solely by the following claims.

We claim:

1. A substrate processing device comprising:

a first substrate holder configured to hold a substrate at a first height position;

a second substrate holder configured to hold the substrate at a second height position lower than the first height position;

a processor configured to perform first processing on the substrate held by the first substrate holder and performing second processing on the substrate held by the second substrate holder;

a substrate mover that performs a substrate lowering operation of lowering the substrate from the first height position to the second height position for transfer of the substrate from the first substrate holder to the second substrate holder; and a controller, wherein the second processing includes processing with use of a processing liquid, the processor includes a processing cup formed to surround the second substrate holder in plan view and provided to be liftable and lowerable between an upper cup position corresponding to the second height position and a lower cup position lower than the upper cup position, and a cup driver that lifts and lowers the processing cup, and the controller, by controlling the substrate mover and the cup driver, causes the substrate lowering operation performed by the substrate mover and a cup lifting operation of lifting the processing cup from the lower cup position toward the upper cup position to be performed such that a period for the substrate lowering operation and a period for the cup lifting operation at least partially overlap with each other, the processor includes:

a lower-surface brush that cleans a lower surface of the substrate by coming into contact with the lower surface;

a lower-surface brush mover configured to move the lower-surface brush between a lower-surface brush processing position at which the lower-surface brush comes into contact with the lower-surface of the substrate held by the second substrate holder and a lower-surface brush waiting position spaced apart from the lower-surface brush processing position;

a fluid nozzle that discharges fluid including the processing liquid to an upper surface of the substrate;

a nozzle mover configured to move the fluid nozzle between a nozzle processing position above the substrate held by the second substrate holder and a nozzle waiting position spaced apart from the substrate held by the second substrate holder;

an end-portion brush that cleans an outer peripheral end of the substrate by coming into contact with the outer peripheral end; and an end-portion brush mover configured to move the end-portion brush between an end-portion brush processing position at which the end-portion brush comes into contact with the outer peripheral end of the substrate held by the second substrate holder and an end-portion brush waiting position spaced apart from the substrate held by the second substrate holder, the second processing includes cleaning processing for the lower surface of the substrate performed by the lower-surface brush, cleaning processing for the upper surface of the substrate performed by the fluid nozzle and cleaning processing for the outer peripheral end of the substrate performed by the end-portion brush as processing with use of the processing liquid, and the controller, by controlling the lower-surface brush mover, the nozzle mover and the end-portion brush mover in addition to the substrate mover and the cup mover, causes the substrate lowering operation, the cup lifting operation, a lower-surface brush preparing operation of moving the lower-surface brush from the lower-surface brush waiting position to the lower-surface brush processing position, a nozzle preparing operation of moving the fluid nozzle from the nozzle waiting position to the nozzle processing position and an end-portion brush preparing operation of moving the end-portion brush from the end-portion brush waiting position to the end-portion brush processing position to be performed such that three or more than three periods out of at least part of a period for the substrate lowering operation, at least part of a period for the cup lifting operation, at least part of a period for the lower-surface brush preparing operation, at least part of a period for the nozzle preparing operation and at least part of a period for the end-portion brush preparing operation overlap with one another.

* * * * *